United States Patent
Olgiati et al.

(10) Patent No.: US 9,154,137 B2
(45) Date of Patent: Oct. 6, 2015

(54) NON-INTRUSIVE MONITORING AND CONTROL OF INTEGRATED CIRCUITS

(71) Applicant: Altera Corporation, San Jose, CA (US)

(72) Inventors: Andrea Olgiati, Gilroy, CA (US); Matthew Pond Baker, San Francisco, CA (US); Steven Teig, Menlo Park, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/281,262

(22) Filed: May 19, 2014

(65) Prior Publication Data

US 2015/0008957 A1      Jan. 8, 2015

Related U.S. Application Data

(60) Provisional application No. 61/842,966, filed on Jul. 4, 2013, provisional application No. 61/843,921, filed on Jul. 9, 2013, provisional application No. 61/879,578, filed on Sep. 18, 2013.

(51) Int. Cl.

| | |
|---|---|
| *G06F 7/38* | (2006.01) |
| *H03K 19/173* | (2006.01) |
| *H03K 19/177* | (2006.01) |
| *G06F 11/34* | (2006.01) |
| *G06F 17/50* | (2006.01) |
| *G01R 31/3185* | (2006.01) |

(52) U.S. Cl.
CPC ...... *H03K 19/17756* (2013.01); *G01R 31/3185* (2013.01); *G06F 11/3409* (2013.01); *G06F 17/5027* (2013.01); *G06F 17/5081* (2013.01)

(58) Field of Classification Search
None
See application file for complete search history.

(56) References Cited

U.S. PATENT DOCUMENTS

| | | |
|---|---|---|
| 5,291,489 A | 3/1994 | Morgan et al. |
| 5,425,036 A | 6/1995 | Liu et al. |
| 5,578,946 A | 11/1996 | Carberry et al. |
| 5,650,734 A | 7/1997 | Chu et al. |
| 5,654,650 A | 8/1997 | Gissel |
| 5,751,735 A | 5/1998 | Tobin et al. |

(Continued)

FOREIGN PATENT DOCUMENTS

| | | |
|---|---|---|
| EP | 2174215 | 4/2010 |
| WO | WO 2009/002600 | 12/2008 |

(Continued)

OTHER PUBLICATIONS

U.S. Appl. No. 14/261,886, filed Apr. 25, 2014, Tabula, Inc.

(Continued)

*Primary Examiner* — Anh Tran

(57) ABSTRACT

A method of monitoring operations of a set of ICs. The method loads a first set of configuration data into a first IC for configuring a group of configurable circuits of the first IC to perform operations of a user design. The method receives a definition of an event based on values of a set of signals in the user design and a set of corresponding actions to take when the event occurs. The set of signals includes at least one signal received from a second IC. The method generates an incremental second set of configuration data based on the definition of the event and the set of corresponding actions. While the first IC is performing the operations of the user design, the method loads the incremental second set of configuration data into the first IC and monitors the signals received from the second IC at the first IC.

21 Claims, 38 Drawing Sheets

(56) References Cited

U.S. PATENT DOCUMENTS

| | | |
|---|---|---|
| 5,811,985 A | 9/1998 | Trimberger et al. |
| 5,822,217 A | 10/1998 | Shenoy et al. |
| 5,883,525 A | 3/1999 | Tavana et al. |
| 5,889,677 A | 3/1999 | Yasuda et al. |
| 5,920,712 A | 7/1999 | Kuijsten |
| 5,970,240 A | 10/1999 | Chen et al. |
| 6,002,861 A | 12/1999 | Butts et al. |
| 6,003,150 A | 12/1999 | Stroud et al. |
| 6,020,758 A | 2/2000 | Patel et al. |
| 6,038,392 A | 3/2000 | Ashar et al. |
| 6,107,821 A | 8/2000 | Kelem et al. |
| 6,152,612 A | 11/2000 | Liao et al. |
| 6,175,247 B1 | 1/2001 | Scalera et al. |
| 6,389,558 B1 | 5/2002 | Herrmann et al. |
| 6,421,784 B1 | 7/2002 | Chu et al. |
| 6,446,249 B1 | 9/2002 | Wang et al. |
| 6,460,148 B2 | 10/2002 | Veenstra et al. |
| 6,539,535 B2 | 3/2003 | Butts et al. |
| 6,546,464 B2 | 4/2003 | Fortuna et al. |
| 6,611,153 B1 | 8/2003 | Lien et al. |
| 6,629,308 B1 | 9/2003 | Baxter |
| 6,668,237 B1 | 12/2003 | Guccione et al. |
| 6,681,353 B1 | 1/2004 | Barrow |
| 6,684,348 B1 | 1/2004 | Edwards et al. |
| 6,691,266 B1 | 2/2004 | Winegarden et al. |
| 6,691,301 B2 | 2/2004 | Bowen |
| 6,701,494 B2 | 3/2004 | Giddens et al. |
| 6,704,889 B2 | 3/2004 | Veenstra et al. |
| 6,711,729 B1 | 3/2004 | McElvain et al. |
| 6,725,442 B1 | 4/2004 | Cote et al. |
| 6,731,133 B1 | 5/2004 | Feng et al. |
| 6,748,456 B1 | 6/2004 | Stanton et al. |
| 6,750,675 B2 | 6/2004 | Venkata et al. |
| 6,791,352 B2 | 9/2004 | Verdoorn et al. |
| 6,802,026 B1 | 10/2004 | Patterson et al. |
| 6,810,513 B1 | 10/2004 | Vest |
| 6,823,224 B2 | 11/2004 | Wood et al. |
| 6,829,751 B1 | 12/2004 | Shen et al. |
| 6,870,397 B1 | 3/2005 | Fox et al. |
| 6,889,368 B1 | 5/2005 | Mark et al. |
| 6,897,678 B2 | 5/2005 | Zaveri et al. |
| 6,937,681 B2 | 8/2005 | Watanabe |
| 6,954,916 B2 | 10/2005 | Bernstein et al. |
| 6,996,738 B2 | 2/2006 | Chiang |
| 7,010,667 B2 | 3/2006 | Vorbach et al. |
| 7,073,158 B2 | 7/2006 | McCubbrey |
| 7,085,858 B1 | 8/2006 | Fox et al. |
| 7,095,247 B1 | 8/2006 | Tang et al. |
| 7,120,883 B1 | 10/2006 | van Antwerpen et al. |
| 7,126,373 B1 | 10/2006 | Schmit et al. |
| 7,126,856 B2 | 10/2006 | Sun et al. |
| 7,143,329 B1 | 11/2006 | Trimberger et al. |
| 7,157,933 B1 | 1/2007 | Schmit et al. |
| 7,193,440 B1 | 3/2007 | Schmit et al. |
| 7,200,776 B2 | 4/2007 | Harris |
| 7,219,265 B2 | 5/2007 | Yee |
| 7,224,182 B1 | 5/2007 | Hutchings et al. |
| 7,230,869 B1 | 6/2007 | Redgrave et al. |
| 7,231,339 B1 | 6/2007 | Nemecek et al. |
| 7,233,169 B1 | 6/2007 | Vadi |
| 7,274,213 B1 | 9/2007 | Meyer et al. |
| 7,298,169 B2 | 11/2007 | Hutchings et al. |
| 7,308,564 B1 | 12/2007 | Jenkins, IV |
| 7,330,912 B1 | 2/2008 | Fox et al. |
| 7,353,489 B2 | 4/2008 | Dowling |
| 7,375,550 B1 | 5/2008 | Redgrave et al. |
| 7,409,652 B1 | 8/2008 | Fox et al. |
| 7,412,343 B2 | 8/2008 | Stroud et al. |
| 7,424,655 B1 | 9/2008 | Trimberger |
| 7,443,196 B2 | 10/2008 | Redgrave et al. |
| 7,454,658 B1 | 11/2008 | Baxter |
| 7,467,335 B2 | 12/2008 | Otto et al. |
| 7,501,855 B2 | 3/2009 | Hutchings et al. |
| 7,512,850 B2 | 3/2009 | Redgrave et al. |
| 7,548,085 B2 | 6/2009 | Hutchings et al. |
| 7,550,991 B2 | 6/2009 | Redgrave et al. |
| 7,576,557 B1 | 8/2009 | Tseng et al. |
| 7,576,558 B1 | 8/2009 | Lysaght et al. |
| 7,579,867 B2 | 8/2009 | Hutchings et al. |
| 7,589,557 B1 | 9/2009 | Bergendahl et al. |
| 7,595,655 B2 | 9/2009 | Hutchings et al. |
| 7,620,883 B1 | 11/2009 | Carmichael et al. |
| 7,650,248 B1 | 1/2010 | Baxter |
| 7,652,498 B2 | 1/2010 | Hutchings et al. |
| 7,702,978 B2 | 4/2010 | Lewis et al. |
| 7,728,617 B2 | 6/2010 | Redgrave et al. |
| 7,737,740 B2 | 6/2010 | Millar et al. |
| 7,743,296 B1 | 6/2010 | Pierce et al. |
| 7,786,749 B1 | 8/2010 | Syu et al. |
| 7,788,478 B2 | 8/2010 | Redgrave et al. |
| 7,805,593 B1 | 9/2010 | Donlin |
| 7,839,162 B2 | 11/2010 | Hutchings |
| 7,886,247 B2 | 2/2011 | Fatemi et al. |
| 7,973,558 B2 | 7/2011 | Hutchings et al. |
| 8,037,340 B2 | 10/2011 | Kim et al. |
| 8,069,425 B2 | 11/2011 | Hutchings et al. |
| 8,072,234 B2 | 12/2011 | Fox |
| 8,115,510 B2 | 2/2012 | Redgrave et al. |
| 8,143,915 B2 | 3/2012 | Hutchings |
| 8,295,428 B2 | 10/2012 | Hutchings et al. |
| 8,412,990 B2 | 4/2013 | Hutchings et al. |
| 8,429,579 B2 | 4/2013 | Hutchings et al. |
| 8,433,891 B2 | 4/2013 | Redgrave et al. |
| 8,479,069 B2 | 7/2013 | Miller et al. |
| 8,525,548 B2 | 9/2013 | Hutchings et al. |
| 8,595,555 B1 * | 11/2013 | Taylor ............................ 714/30 |
| 8,598,909 B2 | 12/2013 | Hutchings |
| 8,755,484 B2 | 6/2014 | Hutchings et al. |
| 8,847,622 B2 | 9/2014 | Fox |
| 2001/0033188 A1 | 10/2001 | Aung et al. |
| 2001/0037477 A1 | 11/2001 | Veenstra et al. |
| 2002/0089349 A1 | 7/2002 | Barbier et al. |
| 2002/0093371 A1 | 7/2002 | Atkinson |
| 2002/0194543 A1 | 12/2002 | Veenstra et al. |
| 2003/0033584 A1 | 2/2003 | Zaveri et al. |
| 2003/0110430 A1 | 6/2003 | Bailis et al. |
| 2003/0217345 A1 | 11/2003 | Rajsuman et al. |
| 2004/0041610 A1 | 3/2004 | Kundu |
| 2004/0225970 A1 | 11/2004 | Oktem |
| 2004/0236534 A1 | 11/2004 | Wheless, Jr. et al. |
| 2005/0046458 A1 | 3/2005 | Schroeder et al. |
| 2005/0132316 A1 | 6/2005 | Suaris et al. |
| 2005/0216671 A1 | 9/2005 | Rothman et al. |
| 2005/0246520 A1 | 11/2005 | Vadi et al. |
| 2006/0125517 A1 | 6/2006 | van Wageningen et al. |
| 2006/0176075 A1 | 8/2006 | Or-Bach |
| 2006/0220716 A1 | 10/2006 | Nicolaidis |
| 2006/0251416 A1 | 11/2006 | Letner et al. |
| 2007/0006053 A1 | 1/2007 | Otto et al. |
| 2007/0007999 A1 | 1/2007 | Graham et al. |
| 2007/0226541 A1 | 9/2007 | Brunot et al. |
| 2008/0028347 A1 | 1/2008 | Hiraoglu et al. |
| 2008/0046851 A1 | 2/2008 | Miczo |
| 2008/0122484 A1 | 5/2008 | Zhu et al. |
| 2008/0133866 A1 | 6/2008 | Dickenson |
| 2008/0276208 A1 | 11/2008 | Albrecht et al. |
| 2008/0304425 A1 | 12/2008 | Karaoguz |
| 2009/0172351 A1 | 7/2009 | Vorbach et al. |
| 2009/0213946 A1 | 8/2009 | Dick et al. |
| 2009/0237110 A1 | 9/2009 | Lunzer et al. |
| 2011/0029830 A1 | 2/2011 | Miller et al. |
| 2011/0060546 A1 * | 3/2011 | Miller et al. .................. 702/120 |
| 2014/0109028 A1 | 4/2014 | Hutchings et al. |

FOREIGN PATENT DOCUMENTS

| | | |
|---|---|---|
| WO | WO 2009/039462 | 3/2009 |
| WO | WO 2010/016857 | 2/2010 |
| WO | WO 2011/035076 | 3/2011 |

OTHER PUBLICATIONS

Portions of prosecution history of U.S. Appl. No. 11/375,562, Jun. 24, 2010, Redgrave, Jason, et al.

(56) References Cited

OTHER PUBLICATIONS

Portions of prosecution history of U.S. Appl. No. 12/870,779, Apr. 4, 2013, Redgrave, Jason, et al.
Portions of prosecution history of U.S. Appl. No. 11/375,363, Sep. 26, 2008, Redgrave, Jason, et al.
Portions of prosecution history of U.S. Appl. No. 12/235,581, Apr. 2, 2010, Redgrave, Jason, et al.
Portions of prosecution history of U.S. Appl. No. 12/754,603, Nov. 9, 2011, Redgrave, Jason, et al.
Portions of prosecution history of U.S. Appl. No. 11/375,370, Feb. 13, 2009, Redgrave, Jason, et al.
Portions of prosecution history of U.S. Appl. No. 11/375,369, Jan. 27, 2009, Redgrave, Jason, et al.
Portions of prosecution history of U.S. Appl. No. 14/261,886, Sep. 10, 2014, Tabula, Inc.
Portions of prosecution history of U.S. Appl. No. 11/375,561, Jan. 30, 2009, Hutchings, Brad, et al.
Portions of prosecution history of U.S. Appl. No. 11/769,680, Nov. 4, 2011, Hutchings, Brad, et al.
Portions of prosecution history of U.S. Appl. No. 13/291,087, Mar. 22, 2013, Hutchings, Brad, et al.
Portions of prosecution history of U.S. Appl. No. 13/864,507, Aug. 28, 2014, Tabula, Inc.
Portions of prosecution history of U.S. Appl. No. 11/769,683, Nov. 30, 2012, Hutchings, Brad, et al.
Portions of prosecution history of U.S. Appl. No. 11/769,686, May 15, 2009, Hutchings, Brad, et al.
Portions of prosecution history of U.S. Appl. No. 11/769,706, May 21, 2009, Hutchings, Brad, et al.
Portions of prosecution history of U.S. Appl. No. 11/769,703, Dec. 17, 2008, Hutchings, Brad, et al.
Portions of prosecution history of U.S. Appl. No. 11/769,702, Oct. 8, 2010, Hutchings, Brad.
Portions of prosecution history of U.S. Appl. No. 12/952,177, Mar. 5, 2012, Hutchings, Brad, et al.
Portions of prosecution history of U.S. Appl. No. 13/367,351, Nov. 7, 2013, Hutchings, Brad.
Portions of prosecution history of U.S. Appl. No. 11/769,701, Sep. 4, 2009, Hutchings, Brad, et al.
Portions of prosecution history of U.S. Appl. No. 12/637,745, Jun. 1, 2011, Hutchings, Brad, et al.
Portions of prosecution history of U.S. Appl. No. 12/679,305, Jul. 28, 2014, Miller, Marc, et al.
Portions of prosecution history of U.S. Appl. No. 12/728,194, Feb. 26, 2013, Miller, Marc, et al.
Portions of prosecution history of U.S. Appl. No. 12/785,484, Oct. 28, 2011, Fox, Brian.
Portions of prosecution history of U.S. Appl. No. 13/291,095, Sep. 4, 2014, Fox, Brian.
Portions of prosecution history of U.S. Appl. No. 13/057,477, Aug. 2, 2013, Hutchings, Brad, et al.
Portions of prosecution history of U.S. Appl. No. 13/021,702, Jun. 12, 2012, Hutchings, Brad, et al.
Portions of prosecution history of commonly owned U.S. Appl. No. 13/645,314, Feb. 14, 2014, Tabula, Inc.
International Search Report and Written Opinion for PCT/US2008/061072, Sep. 15, 2008 (mailing date), Tabula, Inc.
International Preliminary Report on Patentability for PCT/US2008/061072, Jan. 14, 2010 (mailing date), Tabula, Inc.
Portions of prosecution history of EP 08746482.2, Nov. 27, 2013 (mailing date), Tabula, Inc.
International Search Report and Written Opinion for PCT/US2008/077141, Dec. 18, 2008 (mailing date), Tabula, Inc.
International Preliminary Report on Patentability for PCT/US2008/077141, Mar. 24, 2010 (issuance date), Tabula, Inc.
International Search Report and Written Opinion for PCT/US2008/088492, Mar. 20, 2009 (mailing date), Tabula, Inc.
International Preliminary Report on Patentability for PCT/US2008/088492, Feb. 8, 2011 (issuance date), Tabula, Inc.
International Search Report and Written Opinion for PCT/US2010/049198, Nov. 15, 2010 (mailing date), Tabula, Inc.
International Preliminary Report on Patentability for PCT/US2010/049198, Mar. 27, 2012 (issuance date), Tabula, Inc.
Altera Corp., "Section V. In-System Design Debugging," Quartus II Handbook, May 2007, pp. 1-150.
Barker, Robert, "QuickSilver ACM SilverStream Design Methodology with the Inspire SDK Tool Set," A Technology Application Whitepaper, Jan. 26, 2004, pp. 1-8, QuickSilver Technology, Inc., San Jose, California.
Butts, M., "Future Directions of Dynamically Reprogrammable Systems," IEEE 1995 Custom Integrated Circuits Conference, May 1995, pp. 487-494.
Deokar, R.B., et al., "A Graph-theoretic Approach to Clock Skew Optimization," Month Unknown, 2004, 4 pages.
Graham, P., "Instrumenting Bitstreams for Debugging FPGA Circuits", Proceedings of the 9th Annual IEEE Symposium on Field-Programmable Custom Computing Machines, Apr. 29-May 2, 2001, pp. 41-50, Washington DC.
Graham, P., "Logical Hardware Debuggers for FPGA-Based Systems," A Dissertation Submitted to the Faculty of Brigham Young University in Partial Fulfillment of the Requirements for the Degree of Doctor of Philosophy in Brigham Young University, Dec. 2001, pp. i-246.
Hanono, S., "InnerView Hardware Debugger: A Logic Analysis Tool for the Virtual Wires Emulation System," Submitted to the Department of Electrical Engineering and Computer science in Partial Fulfillment of the Requirements for the Degree of Master of Science at the Massachusetts Institute of Technology, Feb. 1995, pp. 1-59.
Huang, A.S., "Tao: An Architecturally Balanced Reconfigurable Hardware Processor," Submitted to the Dept. of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology, May 23, 1997, pp. 1-86, 107-109.
Hutchings, B., et al., "A CAD Suite for High-Performance FPGA Design," Proceedings of the Seventh Annual IEEE Symposium on Field-Programmable Custom Computing Machines, Apr. 1999, pp. 1-13.
Hutchings, B., et al., "Designing and Debugging Custom Computing Applications," IEEE Design & Test of Computers, Jan. 2000, pp. 20-28.
Hutchings, B., et al., "Unifying Simulation and Execution in a Design Environment for FPGA Systems," IEEE Transactions on Very Large Scale Integration (VLSI) Systems, Feb. 2001, pp. 201-205, vol. 9, No. 1.
Quicksilver Technology, Inc., "Adapt2000 ACM System Platform," Apr. 2004, pp. 1-39, QuickSilver Technology, Inc., San Jose, California, USA.
Quicksilver Technology, Inc., "InSpire SDK Tool Set," Product Brief, 2004 Month N/A, 4 pages, QuickSilver Technology, Inc., San Jose, California, USA.
Slade, A.L., et al., "Reconfigurable Computing Application Frameworks," 11th Annual IEEE Symposium on Field-Programmable Custom Computer Machines, Apr. 9-11, 2003, 10 pages.
Vuillemin, J., et al., "Programmable Active Memories: Reconfigurable Systems Come of Age," Very Large Scale Integration (VLSI) Systems, IEEE Transactions on vol. 4, Issue 1, Mar. 1996, pp. 56-69.
Xilinx, Inc., "ChipScope ProSoftware and Cores User Guide," Jan. 10, 2007, pp. 1-206, Xilinx Inc.

\* cited by examiner

US 9,154,137 B2

NON-INTRUSIVE MONITORING AND CONTROL OF INTEGRATED CIRCUITS

CLAIM OF BENEFIT TO PRIOR APPLICATIONS

The present application claims the benefit of U.S. Provisional Patent Application 61/842,966, entitled, "Non-Intrusive Monitoring and Control of Integrated Circuits," filed Jul. 4, 2013; U.S. Provisional Patent Application 61/843,921, entitled, "Non-Intrusive Monitoring and Control of Integrated Circuits," filed Jul. 9, 2013; and U.S. Provisional Patent Application 61/879,578, entitled, "Non-Intrusive Monitoring and Control of Integrated Circuits," filed Sep. 18, 2013. The contents of U.S. Provisional applications 61/842, 966, 61/843,921, and 61/879,578 are hereby incorporated by reference.

BACKGROUND

Programmable Logic Devices ("PLDs") are configurable integrated circuits ("ICs") which can be used to implement multiple circuit designs created by users ("user designs") without having to fabricate a new IC for each design. However, due to the complexity of the systems being implemented, such user designs usually include various design bugs, design defects, or unexpected runtime behavior that pass unseen through design and testing. Therefore, it is common for user designs to include debug functionality to aid designers and other users in identifying and correcting such bugs, defects, and behavior. Debug functionality typically includes software and hardware components that collectively or separately are referred to as the debug network of the user design, with the purpose of collecting run-time data to evaluate, detect and correct possible bugs, defects or runtime behavior.

In some cases, the debug network is implemented by using the configurable circuits of the PLD. The primary circuit structure uses the same circuits to implement the logic functionality specified within a user design. In such cases, the more complicated the debug network, the larger the amount of PLD resources consumed, leaving fewer resources for implementing the user design. As a result, user designs become less sophisticated. Additionally, a change to the functionality of the debug network will cause the entire IC design to have to be recompiled, downloaded, and loaded onto the IC. This is due to the fact that changes to a design, even when made on a small scale to localized circuits, will have a design-wide impact affecting the overall circuit routing or timing of the design. These changes also create the risk that the circuit logic, including seemingly unrelated logic, may be "broken" due to errors in implementing the new functional change. Because of this risk, extensive regression testing and verification of the logic of the primary circuit structure and debug network is required.

In other cases, the debug network is fixed-function circuitry that exists exclusively for debugging purposes. However, implementing the debugging circuitry as fixed-function circuitry also has several drawbacks. For instance, resources are dedicated to performing debug functionality whether or not the user has a need for such debug functionality. A user design that has undergone extensive regression testing and verification before implementation may require only a minimal set of debug functionality. Similarly, a user design that is only an incremental upgrade to an already existing and verified design would have little use for the debug network. Therefore, the dedicated resources of the debug network go unused and are effectively wasted as these resources cannot be modified to complement the functionality of the primary circuit structure that implements the user design.

The fixed-function implementation of the debug network required system designers to predict what functionality had to be included within the debug network. System designers had to anticipate what statistical monitoring or debug functionality was needed in advance of designing the debug network and deploying the PLD. Unanticipated usage, behavior, or operating conditions in the field could pose issues beyond the debugging scope of the programmed debug network, forcing users to have to employ third party tools or other means to perform the additional debug functionality needed to handle the unanticipated usage, behavior, or operating conditions.

A further issue prevalent in traditional debug networks is the inability of the networks to provide meaningful debug data to the users. Debug networks often blindly report data at a debug point within the user design. In many instances, the reported data has to be manually parsed or stepped through to find relevant data points at which an error occurs. As a result, users waste time in deciphering the debug data.

BRIEF SUMMARY

Some embodiments provide a system and method for obtaining visibility into an in-the-field device. These embodiments provide a monitoring tool that allows unobtrusive full read access to a running user design to enable rapid-response monitoring, debugging, and response to exceptions and other events. In contrast to the existing monitoring solutions, the system of these embodiments does not require downtime (or stopping) of the device or recompilation of code to be run on the device, does not disturb the functionality timing of a running design, and can be applied as a hot-fix in the lab or in the field.

The device in some embodiments has a primary circuit structure that includes a group of reconfigurable circuits and a configuration and monitoring network that operates in non-intrusive manner to the operations of the primary circuit structure. Specifically, a non-intrusive configuration and monitoring network operation is one which does not need to use circuits that would otherwise be used to implement the user's design. In some embodiments, the configuration and monitoring network does not change any values of resources of the primary circuit structure while the configuration and monitoring network monitors the primary circuit structure. Some advantages of a non-intrusive configuration and monitoring network of some embodiments are that the non-intrusive configuration and monitoring network does not interfere with the implementation of the user design in the primary circuit structure and does not require restructuring the physical implementation of the user design in the primary circuit structure in order to retrieve data from different parts of the circuit.

Some embodiments utilize the user signals that were expressed in the user RTL in order to build conditions that fire the trigger signal. However, user signals as originally expressed in the RTL source code may not be available on-chip due to synthesis optimization or rescaling. During synthesis optimization, user signals may have been eliminated during synthesis, or they may be contained within a component such as a LUT. Also, multiple fabric-cycle rate signals may need to be recombined to create a single user-cycle rate user signal as a result of rescaling.

Some embodiments employ two different strategies to create signals that can be used for triggering: (1) user signals that were eliminated during synthesis are reconstructed by logically combining other existent fabric signals with one or more LUTs and (2) multiple versions of a user signal that are created by rescaling are recombined into a single fabric signal with a rescaling mux.

Some embodiments provide a method of creating views for monitoring and controlling the operations of an IC. A view is a tool for specifying events and response to the events. Each view is a statement that identifies what to do (e.g., what data items to collect or what controls to activate) when a condition becomes true. For instance, a user can create a view to start collecting data when a set of user design signals satisfies a particular condition.

Views enable inspection of production designs in the field or in the lab while the IC is performing operations of the user design. The use of views in some embodiments allows all application-visible states to be unobtrusively monitored and inspected. No recompilation or replacement of the code running on the IC and no pre-declaration of viewable signals are required. Some embodiments utilize an interactive process for describing the views. The result of the process is a text file that describes a view specification. Some embodiments use a proprietary format while other embodiments use a subset of SystemVerilog to define view specifications.

Some embodiments provide an application-specific integrated circuit (ASIC) that includes a group of non-configurable circuits customized for performing operations for a particular use. The ASIC also includes a set of reconfigurable circuits that configurably perform operations of a user design based on configuration data. The ASIC also includes a configuration and monitoring network to receive incremental sets of configuration data while the set of reconfigurable circuits is performing operations of the user design. Each incremental set of data is for configuring the configuration and monitoring network to monitor a set of signals received at the set of reconfigurable circuits from one or more non-configurable circuits of the ASIC and to take a set of actions when values of the monitored signals satisfy a predefined condition.

Some embodiments provide a method of monitoring operations of an integrated IC that includes a set of configurable circuits for configurably performing a set of operations based on configuration data. The method loads a first set of configuration data into the IC to configure a group of configurable circuits to perform operations of a user design. The method receives a definition of an event based on values of a set of signals in the user design and a set of corresponding actions to take when the event occurs. The method generates an incremental second set of configuration data based on the definition of the event and the set of corresponding actions. The method, while the IC is performing the operations of the user design, loads the incremental second set of configuration data into the IC to monitor for the event and to take the set of actions when the event occurs.

Some embodiments provide a method of monitoring operations of a system comprising a set of ICs mounted on a circuit board. The set of ICs includes a first IC that has a set of configurable circuits for configurably performing a set of operations based on configuration data. The method loads a first set of configuration data into the first IC for configuring a group of configurable circuits in the set of configurable circuits to perform operations of a user design. The method receives a definition of an event based on values of a set of signals in the user design and a definition of a set of corresponding actions to take when the event occurs. The set of signals includes at least one signal from a second IC in the set of ICs received at an input port of the first IC. The method generates an incremental second set of configuration data based on the definition of the event and the set of corresponding actions. The method, while the first IC is performing the operations of the user design, loads the incremental second set of configuration data into the first IC. The method, while the first IC is performing the operations of the user design, monitors the signal received from the second IC at the input port of the first IC.

Some embodiments provide a method of monitoring operations of an IC that includes a set of configurable circuits for configurably performing a set of operations based on configuration data. The method loads a first set of configuration data into the IC for configuring a group of configurable circuits in the set of configurable circuits for performing operations of a user design. The method receives a definition of a first event based on values of a first set of signals in the user design and a first set of actions to take when the first event occurs. The method generates an incremental second set of configuration data based on the definition of the first event and the first set of actions. The method, while the IC is performing the operations of the user design, loads the incremental second set of configuration data into the IC to monitor for the first event and to take the first set of actions when the first event occurs. The method receives a definition of a second event based on values of a second set of signals in the user design and a second set of actions to take when the second event occurs. The method generates an incremental third set of configuration data based on the definition of the second event and the second set of actions. The method, while the IC is performing the operations of the user design, loads the incremental third set of configuration data into the IC to monitor for the second event and to take the second set of actions when the second event occurs.

Some embodiments provide a non-transitory machine-readable medium that stores a program for generating configuration data sets for monitoring operations of a system comprising a set of ICs mounted on a circuit board. The set of ICs includes a first IC that has a set of configurable circuits for configurably performing a set of operations based on configuration data. The program is executable by at least one processing unit. The program includes a set of instructions for loading a first set of configuration data into the first IC to configure a group of configurable circuits in the set of configurable circuits to perform operations of a user design. The program also includes a set of instructions for receiving a definition of an event based on values of a set of signals in the user design and a set of corresponding actions to take when the event occurs. The set of signals includes at least one signal from a second IC in the set of ICs received to an input port of the first IC. The program also includes a set of instructions for generating an incremental second set of configuration data based on the definition of the event and the set of corresponding actions. The program also includes a set of instructions for loading, while the first IC is performing the operations of the user design, the incremental second set of configuration data into the first IC. The program also includes a set of instructions for monitoring, while the first IC is performing the operations of the user design, the signal received from the second IC at the input port of the first IC.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawing, but rather are to be defined by the appended claims, because the claimed subject matters can be embodied in other specific forms without departing from the spirit of the subject matters.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

Figure 1:
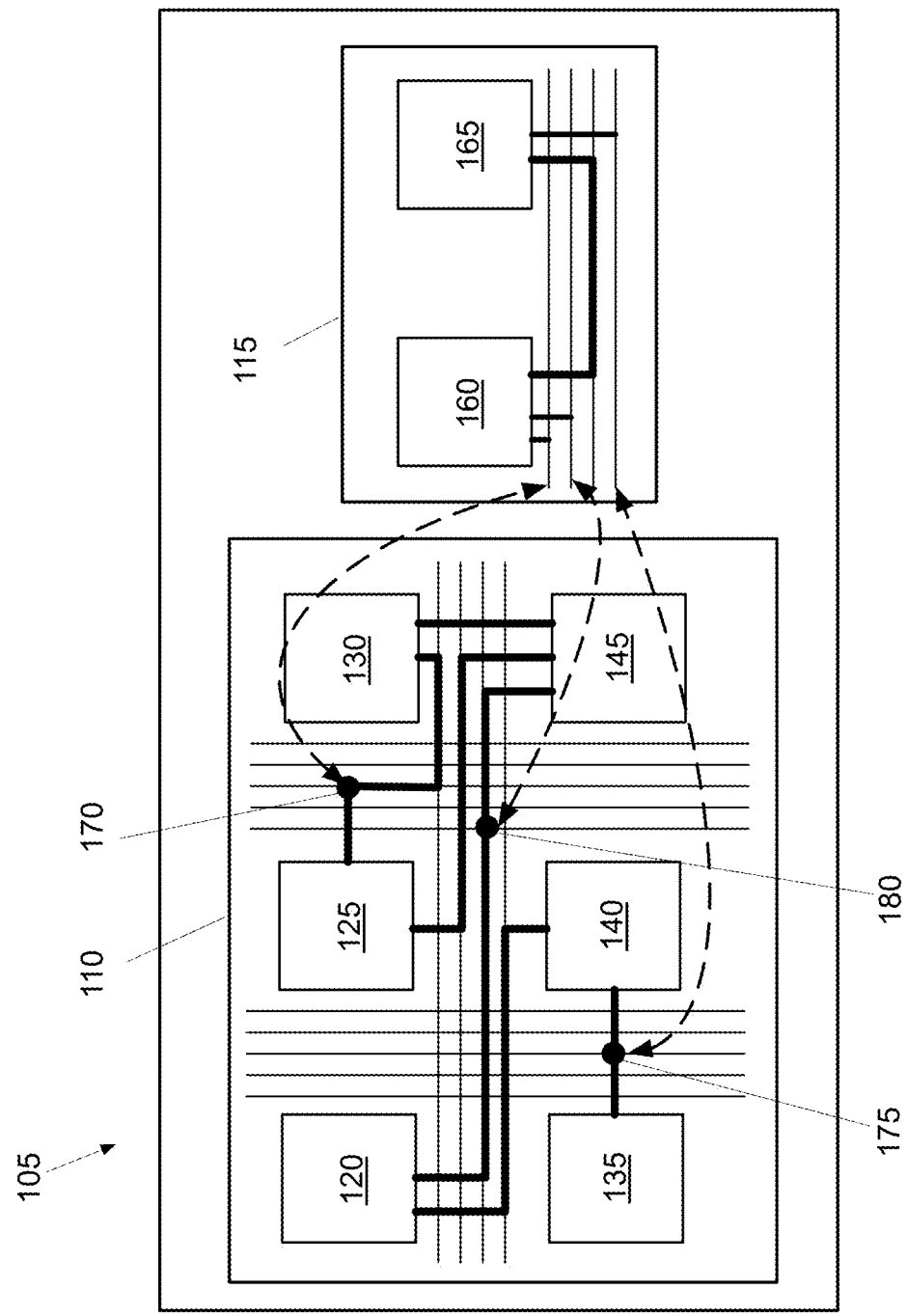
FIG. 1 conceptually illustrates the dynamic routing of user signals from the primary circuit structure to the configuration and monitoring network in some embodiments.

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

I. TERMS AND DEFINITIONS

A. Integrated Circuits (ICs)

Some embodiments of the invention monitor and control the operations of an IC. An IC is a device that includes numerous electronic components (e.g., transistors, resistors, capacitors, diodes, etc.) that are typically embedded on the same substrate, such as a single piece of semiconductor wafer. These components are connected with one or more layers of wiring to form multiple circuits, such as Boolean gates, memory cells, arithmetic units, controllers, decoders, etc. An IC is often packaged as one chip in a single IC package, although some IC packages include multiple pieces of substrate or wafer.

A design layout is a geometric description of the circuit components included in an IC's design. An IC's design layout is often obtained by using a set of computer-based electronic design automation tools (EDAs) to transform a code representation (e.g., a register transfer level (RTL) representation) or circuit representation of the design into a geometric description. The design process entails various operations. Some conceptual representations for some of the various physical-design operations that EDA applications perform to obtain the IC layouts include: (1) circuit partitioning, which partitions a circuit if the circuit is too large for a single chip; (2) floor planning, which finds the alignment and relative orientation of the circuit modules; (3) synthesis, which transforms an RTL or circuit representation to another circuit representation that is mapped to a particular technology of a particular IC; (4) layout, which generates the physical design (or layout) of the IC which includes placement and routing for defining the positions of the circuit modules and the interconnects between the circuit modules; (5) power optimization, which is done to reduce the power consumption of the design; and (6) verification, which checks the layout to ensure that it meets design and functional requirements. It should be apparent to one of ordinary skill in the art that in some embodiments the order in which the various EDA operations are performed need not adhere to the presentation order of the conceptual representations above.

B. Configurable IC Architecture

Some embodiments of the invention monitor and control the operations of an IC with configurable circuits. A configurable circuit is a circuit that can "configurably" perform a set of operations. Specifically, a configurable circuit receives a configuration data set that specifies the operation that the configurable circuit must perform from the set of operations that it can perform. In some embodiments, configuration data is generated outside of the IC. In these embodiments, a set of software tools typically converts a high-level IC design (e.g., a circuit representation or a hardware description language design) into a set of configuration data bits that can configure the configurable circuits of the IC to implement the IC design.

Examples of configurable circuits include configurable logic circuits and configurable interconnect circuits. A logic circuit is a circuit that can perform a function on a set of input data that it receives. A configurable logic circuit is a logic circuit that can be configured to perform different functions on its input data set.

A configurable interconnect circuit is a circuit that can configurably connect an input set to an output set in a variety of ways. An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). In other words, the interconnect circuit of some embodiments implements a logic inversion operation in conjunction to its connection operation. Other embodiments, however, do not build such an inversion operation in any or all of their interconnect circuits.

The configurable interconnect circuit passes signals through a routing fabric of the configurable IC. The routing fabric provides a communication pathway for routing signals to and from source and destination circuits or components. In some embodiments, the routing fabric includes storage elements in addition to the various routing circuits, the wire segments (e.g., the metal or polysilicon segments) that connect to the routing circuits, and vias that connect to these wire segments and to the terminals of the routing circuits. These storage elements include latches and registers distributed across the routing fabric that provide one or more different means for storing signals in the routing fabric.

In some of these embodiments, the routing fabric also includes buffers for achieving one or more objectives (e.g., maintaining the signal strength, reducing noise, altering signal delay, etc.) vis-a-vis the signals passing along the wire segments. In conjunction with, or instead of, these buffer circuits, the routing fabric of some embodiments might also include one or more non-configurable circuits (e.g., non-configurable interconnect circuits).

The IC of some embodiments includes configurable logic circuits and configurable interconnect circuits for routing the signals to and from the configurable logic circuits. An IC with configurable circuits is sometimes referred to a configurable IC. However, in addition to configurable circuits, the IC also typically includes non-configurable circuits (e.g., non-configurable logic circuits, interconnect circuits, memories, etc.).

In some embodiments, the configurable resources (e.g., configurable logic resources, routing resources, memory resources, etc.) that are grouped in conceptual configurable tiles are arranged in several rows and columns. Together, this arrangement forms a primary circuit structure of the IC that implements the user design logic.

In addition to this primary circuit structure of the IC, some embodiments further provide a secondary IC network (also referred to herein as configuration and monitoring network) that is "on-chip." In some embodiments, the on-chip configuration and monitoring network is a network of resources that is located on the same physical wafer as the resources of the primary circuit structure. In some embodiments, the on-chip configuration and monitoring network is a network of resources that is located on a different physical wafer or layer than the primary circuit structure, but the wafers or layers for both the primary circuit structure and configuration and monitoring network are included within the same physical package enclosing the IC as a single chip. Accordingly, the below described functionality of the configuration and monitoring network is implemented and performed on the same physical chip as the primary circuit structure. In some embodiments, the configuration and monitoring network is an optical network, while the primary circuit structure is an electrical network.

In some embodiments, the configuration and monitoring network is a different network than the primary circuit structure implementing the user design. Specifically, in some embodiments, the user design is not mapped to the configuration and monitoring network. Rather, the configuration and monitoring network of some embodiments is a configuration network, debug, and monitoring network that provides functionality extended beyond traditional debug functionality.

When providing configuration functionality, the configuration and monitoring network is the means through which configuration data that is streamed into the IC is routed to the appropriate tiles and ultimately to the appropriate configurable circuits of the primary circuit structure that configure to perform operations in accordance with the user design. When providing debug functionality, the configuration and monitoring network can be used to diagnose and isolate issues within the primary circuit structure. Such functionality may operate independent of, and/or complement the functionality of, the user design implemented by the primary circuit structure. In each instance, the configuration and monitoring network operates in a non-interfering manner with the operations of the primary circuit structure.

The configuration and monitoring network interfaces with the primary circuit structure through a set of bitlines that pass through and are shared amongst various tiles of configurable circuits of the primary circuit structure. In some embodiments, relevant user signals are dynamically routed over the bitlines from the primary circuit structure to the configuration and monitoring network and from the configuration and monitoring network to the primary circuit structure such that there is no impact to the user circuits (e.g., the configurable circuits implementing the user design) configured in the primary circuit structure. Accordingly, there is no impact to the functionality configured within the primary circuit structure (i.e., the user design).

In some embodiments, the configuration and monitoring network is initially configured via an external interface into the IC. In some embodiments, the external interface includes Joint Test Action Group ("JTAG") interface, flash, slave peripheral port, or through other means of communications with the IC, such as the I/O buffers of the IC. Also, in some embodiments, these various external interfaces may be used to perform read-back from the configuration and monitoring network to the external interfaces. In addition to providing access to the configuration and monitoring network from outside of the IC, some embodiments of the IC include a "fabric port," through which a user circuit, or user logic, of the primary circuit structure accesses the configuration and monitoring network. In some embodiments, the user circuit includes logic that is not implemented on either the primary circuit structure or the configuration and monitoring network, but may include logic in the same package or IC of a System-On-Chip ("SoC").

FIG. 1 conceptually illustrates the dynamic routing of user signals from the primary circuit structure to the configuration and monitoring network in some embodiments. As shown, an integrated circuit ("IC") 105 includes the primary circuit structure 110 and the configuration and monitoring network 115 with various interconnects 170-180 that allow for intercommunications between the two networks.

The primary circuit structure 110 includes blocks of configurable circuits 120-145 that represents tiles of the IC. The various interconnects within the primary circuit structure 110 connect the block 120-145 to one another. Additionally, these interconnects also include bitlines for passing signals to the configuration and monitoring network. For instance, a communication pathway between the primary circuit structure 110 and configuration and monitoring network 115 exists at locations 170-180. These locations may include unused storage elements within the routing fabric or routing circuits from which signals passing through the primary circuit structure 110 reach the circuits of the configuration and monitoring network 115.

As such, signals may pass from the primary circuit structure to the configuration and monitoring network in a manner that does not interfere with the operation of the primary circuit structure. As shown, the configuration and monitoring network 115 includes circuits 160-165 with a separate set of interconnects over which signals from the communication bitlines with the primary circuit structure pass into the circuits 160-165 of the configuration and monitoring network.

In order to illustrate the conceptual difference between the primary structure and the configuration and monitoring network, the primary circuit structure 110 and the configuration and monitoring network 115 are shown as being separate in this figure. However, in some embodiments, the circuits and bitlines of the configuration and monitoring network are physically interspersed with the circuits and bitlines of the primary circuit structure. In other words, the configuration and monitoring network may be thought of as an "overlay" network with regard to the primary circuit structure.

Figure 2:
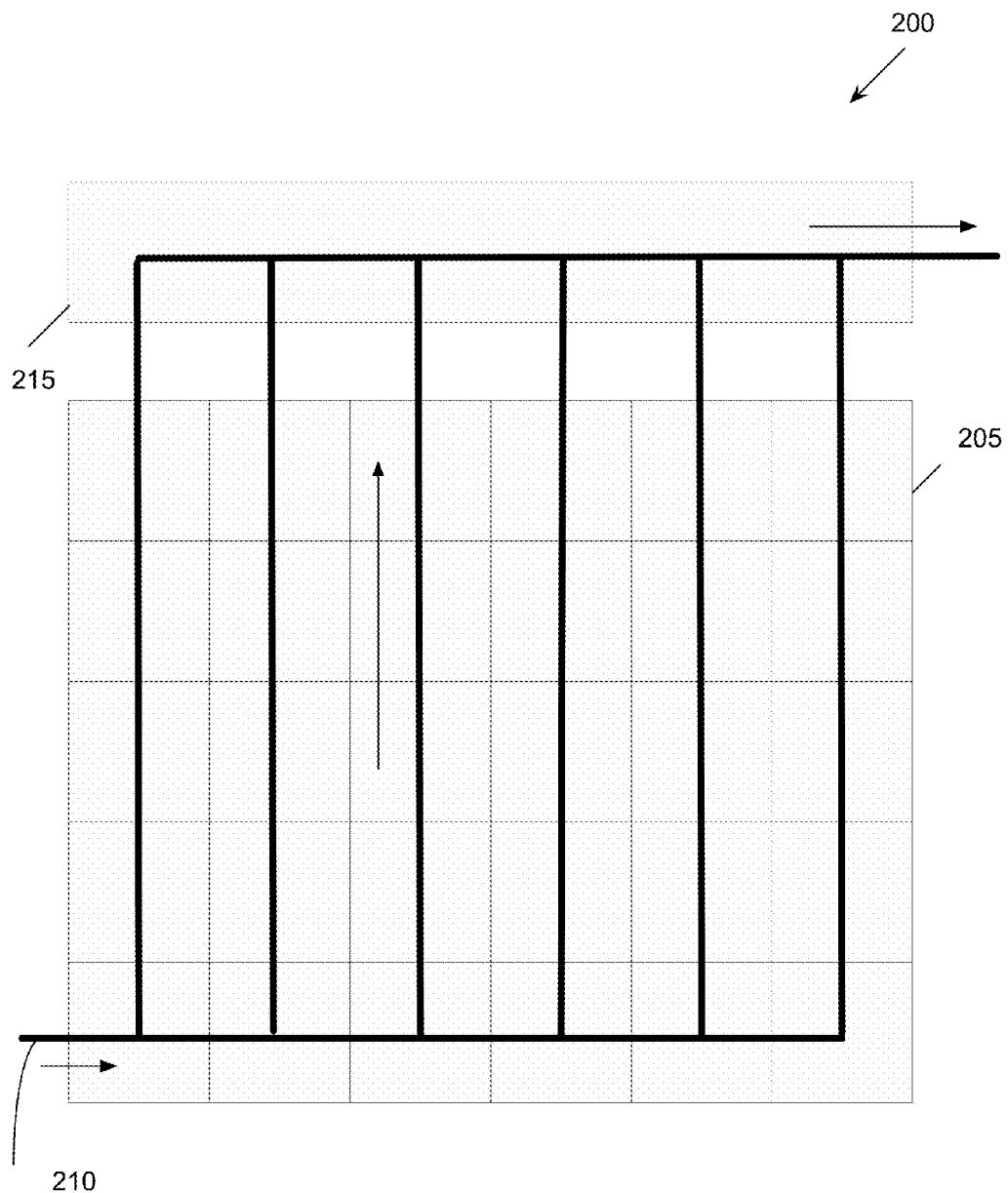
FIG. 2 conceptually illustrates an example of a configurable IC that includes numerous configurable tiles.

FIG. 2 conceptually illustrates an example of a configurable IC 200 that includes numerous configurable tiles 205. The configurable tiles 205 communicate with each other through the routing fabric of the IC. As mentioned above, these configurable tiles 205 form a primary circuit structure of the IC. Each configurable tile 205 receives a set of lines 210 that are part of the configuration and monitoring network. The lines 210 pass debug data, configuration data, or other data (e.g., resource state data, assertions, logic computations, etc.) on to transport network 215 of the configuration and monitoring network, which in turn passes the data on to other components of the configuration and monitoring network (not shown). In some embodiments, the lines 210 also pass data from the configuration and monitoring network to the primary circuit structure.

In some embodiments, the set of lines 210 are a uniform set of lines distributed throughout the primary circuit structure, through every set of tiles. The set of lines 210 may include 18 lines, six of which are used to provide control signals and twelve of which are used to provide data signals. The six control signals serve as an opcode (operation code), while the twelve signals serve as the operand (i.e., data argument) associated with the opcode. Some examples of opcodes and operands are further discussed below. While this specification discusses specific examples with respect to the width of bitlines and data packets (e.g., 18-bit bitlines, 18-bit data frames, six-bit opcodes, twelve-bit operands, etc.), a person of ordinary skill in the art would recognize that these are merely illustrative examples, and that any other number of bits can be used without departing from the spirit of the invention.

In some embodiments, there is an unused area of the IC between the configurable tiles 205 and the transport network 215. Having the transport network 215 be separate from the main set of configurable circuits allows multiple generations of the configurable IC to use different designs for the transport network 215 without disrupting the design of the fabric of the primary circuit structure. Some embodiments use a packet switching technology to route data to and from the resources in the configurable tiles. Hence, over the lines 210, these embodiments can route variable length data packets to each configurable tile in a sequential or random access manner. Additionally, the packet switching allows the lines 210 to be shared by all tiles and circuits of the primary circuit structure in communications with the configuration and monitoring network.

Data packets routed according to the packet switching functionality of some embodiments include one or more data frames. In some embodiments, an initial set of frames (e.g., first one or two frames) of the packet identifies configurable tiles for routing the remaining frames of the data packet. In other words, the initial set of frames specifies one or more destinations for receiving the data packet. Some embodiments allow tiles to be individually addressed, globally addressed, or addressed based on their tile types. The remaining frames can then contain configuration, debug, or other data for performing one or more overlay applications of the configuration and monitoring network.

Figure 3:
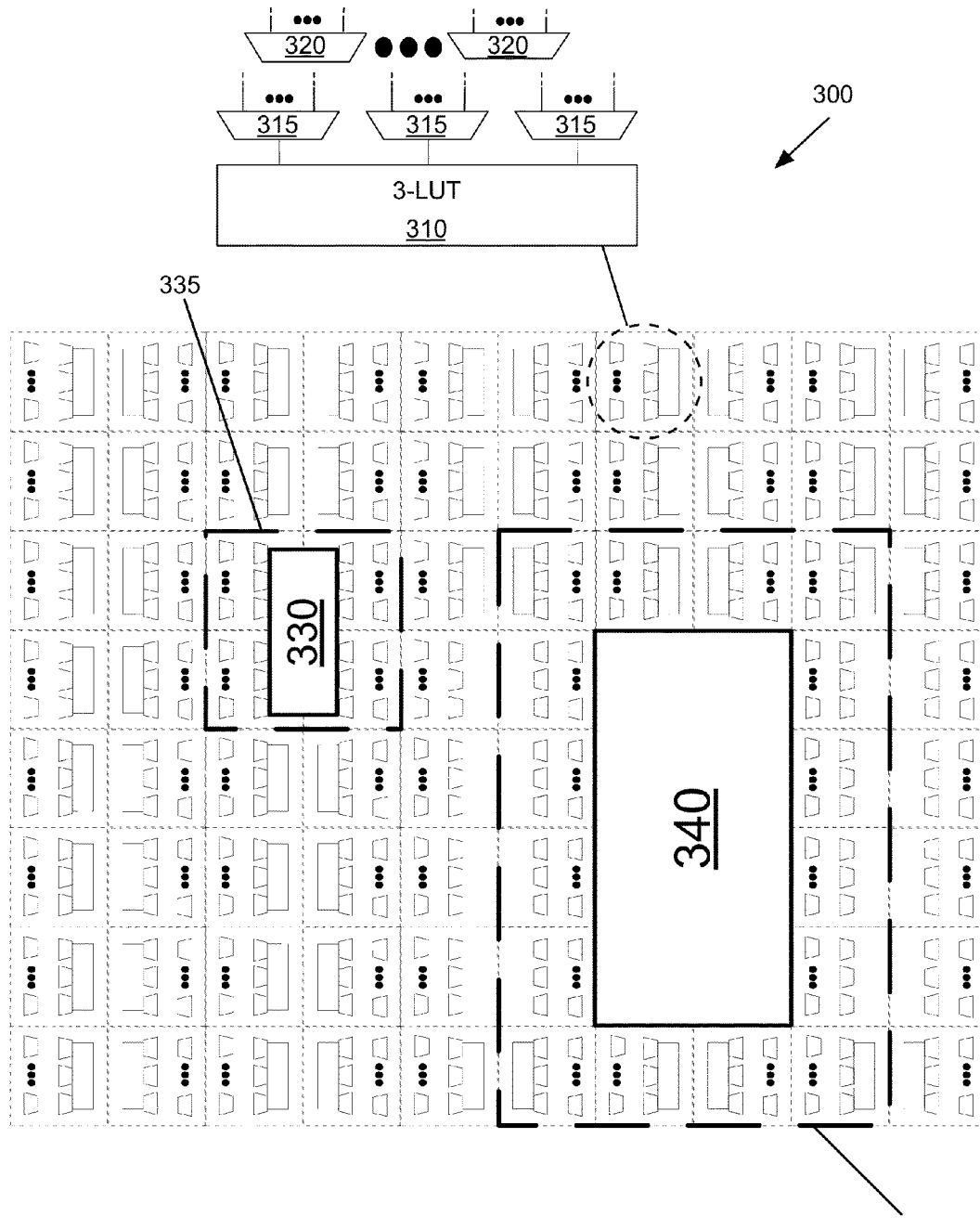
FIG. 3 conceptually illustrates the configurable circuit architecture of some embodiments of the invention.
Figure 4:
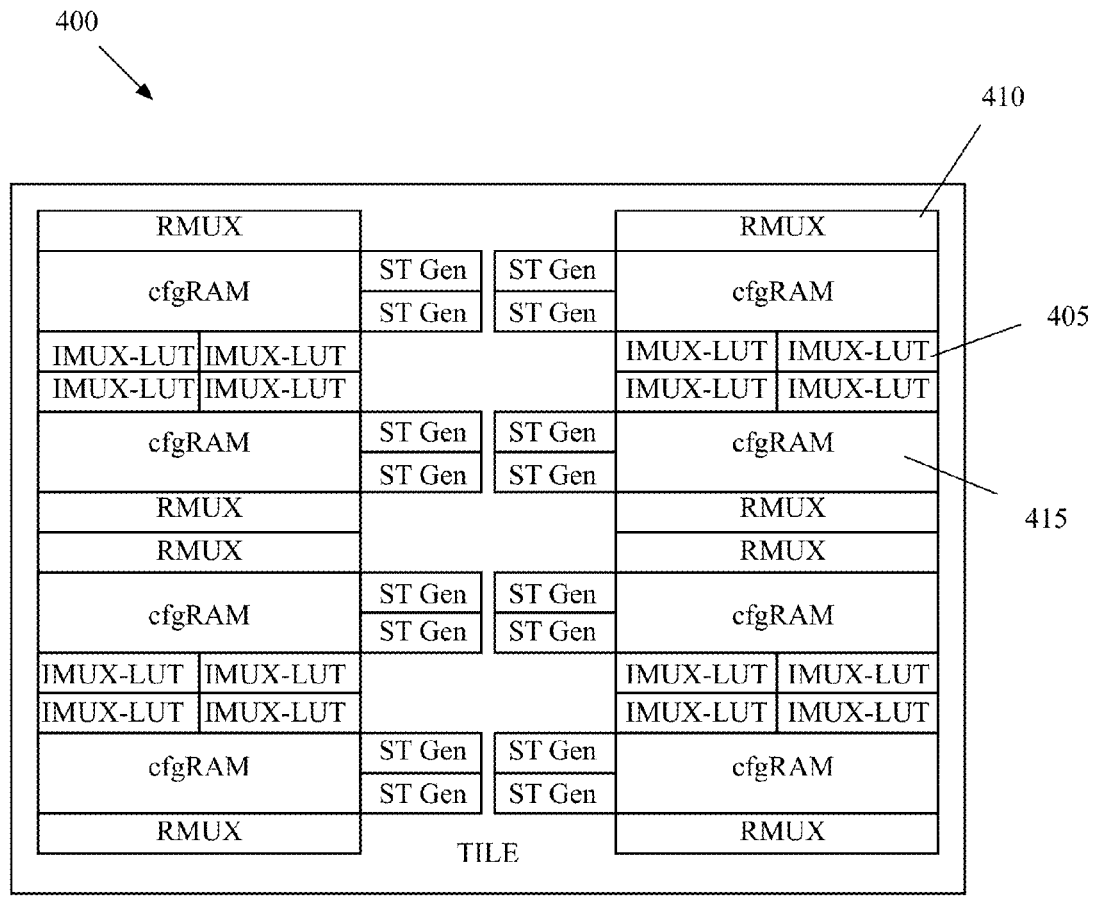
FIG. 4 illustrates an alternative tile structure that is used in some embodiments.

In some embodiments, the configurable circuits might be organized in an arrangement that has all the circuits organized in an array with several aligned rows and columns. In addition, within such a circuit array, some embodiments disperse other circuits (e.g., memory blocks, processors, macro blocks, IP blocks, controllers, clock management units, etc.). FIGS. 3-4 illustrate several configurable circuit arrangements/architectures in some embodiments of the invention. One such architecture is illustrated in FIG. 3.

FIG. 3 conceptually illustrates the configurable circuit architecture of some embodiments of the invention. As shown in FIG. 3, this architecture is formed by numerous configurable conceptual tiles that are arranged in an array with multiple rows and columns. It should be noted that in some embodiments a "conceptual tile" (or "tile" for short) does not denote any physically distinct object, but is rather a way of referring to groups of circuitry in a repeated or nearly repeated pattern. In such embodiments, the lines around individual tiles represent conceptual boundaries, not physical ones.

In FIG. 3, each configurable tile is a configurable logic tile, which, in this example, includes one configurable three-input logic circuit 310, three configurable input-select interconnect circuits 315, and eight configurable routing interconnect circuits 320. For each configurable circuit, the configurable IC 300 includes a set of storage elements for storing a set of configuration data. In some embodiments, the logic circuits are look-up tables (LUTs) while the interconnect circuits are multiplexers. In this specification, many embodiments are described as using multiplexers. It will be clear to one of ordinary skill in the art that other embodiments can be implemented with input selection circuits other than multiplexers. Therefore, any use of "multiplexer" in this specification should be taken to also disclose the use of any other type of input selection circuits.

In FIG. 3, an input-select multiplexer ("IMUX") 315 is an interconnect circuit associated with the LUT 310 that is in the same tile as the input select multiplexer. One such input select multiplexer (1) receives several input signals for its associated LUT, and (2) based on its configuration, passes one of these input signals to its associated LUT.

In FIG. 3, a routing multiplexer ("RMUX") 320 is an interconnect circuit that connects other logic and/or interconnect circuits. The interconnect circuits of some embodiments route signals between logic circuits, to and from I/O circuits, and between other interconnect circuits. Unlike an input select multiplexer of some embodiments (which provides its output to only a single logic circuit, i.e., which has a fan-out of only 1), a routing multiplexer of some embodiments is a multiplexer that (1) can provide its output to several logic and/or interconnect circuits (i.e., has a fan-out greater than 1), or (2) can provide its output to other interconnect circuits. The RMUX receives several inputs and based on its configuration, selects the input to pass along the output.

In the architecture illustrated in FIG. 3, each configurable logic tile includes one three-input LUT, three input-select multiplexers, and eight routing multiplexers. Other embodiments, however, might have a different number of LUTs in each tile, different number of inputs for each LUT, different number of input-select multiplexers, and/or different number of routing multiplexers. Other embodiments might also use different types of logic circuits and/or interconnect circuits. Several such architectures are further described in the U.S. Pat. No. 7,295,037, issued on Nov. 13, 2007.

Some of the configurable logic tiles of FIG. 3 together conceptually form configurable memory tiles, which are (1) tiles with blocks of memory, or (2) tiles that are adjacent to blocks of memory. FIG. 3 illustrates two examples of configurable memory tiles. The first example is a memory tile 335 that is formed by a set of four aligned tiles that have a memory block 330 in place of their four LUTs. In the second example, a memory tile 345 is formed by 16 tiles that neighbor a memory block 340. In the configurable logic tiles of the memory tiles 335 and 345, the input select and routing interconnects serve as configurable ports of the memory blocks.

In some embodiments, the examples illustrated in FIG. 3 represent the actual physical architecture of a configurable IC. However, in other embodiments, the examples presented in FIG. 3 topologically illustrate the architecture of a configurable IC (i.e., they show arrangement of tiles, without specifying a particular physical position of the circuits). In some embodiments, the position and orientation of the circuits in the actual physical architecture of a configurable IC is different from the position and orientation of the circuits in the topological architecture of the configurable IC. Accordingly, in these embodiments, the IC's physical architecture appears quite different from its topological architecture.

In some embodiments, the configuration and monitoring network shares one or more resources with the primary circuit structure to facilitate one or more of the interfaces with the primary circuit structure. These resources include user design state ("UDS") elements. UDS elements are elements that store values. At any particular time, the values stored by the UDS elements define the overall user-design state of the primary circuit structure at that particular time. In some embodiments, a UDS element is capable of continuously outputting the value it stores. Examples of such elements include traditional latches, registers, user flip-flops, and memory structures. U.S. Pat. No. 7,224,181, issued on May 29, 2007; U.S. Pat. No. 7,521,959, Issued on Apr. 21, 2009, and U.S. Pat. No. 8,456,190, issued on Jun. 4, 2013, describe other user-design state elements that include routing multiplexers ("RMUXs") that can serve as storage elements, RMUXs that have storage elements in feedback paths between their outputs and inputs, and storage elements at other locations in the routing fabric (e.g., between RMUXs).

More specifically, some embodiments have RMUXs where at least some of the RMUXs have state elements integrated at the output stage of the RMUX itself. Such RMUXs are referred to as routing circuit latches or RCLs. For instance, some RMUXs use complementary pass-gate logic ("CPL") to implement a routing multiplexer. Some of these embodiments then implement a routing multiplexer that can act as a latch by placing cross-coupled transistors at the output stage of the routing multiplexer. Such an approach is further described in U.S. Pat. No. 7,342,415, issued on Mar. 11, 2008. In the discussion below, routing multiplexers that can serve as latches are referred to as routing-circuit latches ("RCLs").

In conjunction or instead of such RCLs, other embodiments utilize other storage elements for storing UDS data at other locations in the configurable routing fabric of a configurable IC. For instance, in addition to or instead of having a storage element in the input and/or output stage of an RMUX, some embodiments place a storage element (e.g., latch or register) in a feedback path between the output and input of the RMUX.

Some such UDS elements operate as transparent latches referred to as "time vias" ("TVs") or clock driven latches referred to as "conduits." When a TV is "open," the TV's output value immediately assumes the TV's current input value. In other words, the TV acts as a wire (with some additional delay). When the TV closes, it captures and holds the current output value (i.e., the output no longer follows the input).

Some or all of these TVs can be accessed via the configuration and monitoring network in one of two modes: active mode and passive (or trace) mode. Active mode allows users to read and write stored values in any circuit of the IC, including closed TVs (open TVs do not store values) while the circuit is stopped. Passive mode continuously transmits TV values to the configuration and monitoring network in real time. These modes are further described below. In some embodiments, this transmission of TV values occurs at the maximum user clock rate. Once received by the configuration and monitoring network, these signal values can be stored in a trace buffer for later display and analysis.

Conduits, unlike TVs, introduce delay when performing a storage operation. In some embodiments, conduits are implemented as single edge-triggered flip-flops. In some embodiments, multiple conduits are chained together to provide longer delays, as necessary. In some embodiments, conduits are accessed in the same manner as TVs. In some embodiments, conduits are readable, writeable, and/or stream-able from the configuration and monitoring network.

In some embodiments, some or all of the latches, registers, TVs, or conduits are separate from the RMUXs of the routing fabric and are instead at other locations in the routing fabric (e.g., between the wire segments connecting to the outputs and/or inputs of the RMUXs). For instance, in some embodiments, the routing fabric includes a parallel distributed path for an output of a source routing circuit to a destination circuit. A first path of the parallel distributed path, directly routes the output of the source routing circuit to a first input of the destination circuit. A second path running in parallel with the first path passes the output of the source routing circuit through a UDS element before reaching a second input of the destination circuit. The storage element stores the output value of the routing circuit when enabled. In some embodiments, the second path connects to a different destination component than the first path. When the routing fabric includes buffers, some of these embodiments utilize these buffers as well to build such latches, registers, TVs, or conduits.

In some embodiments, the configuration and monitoring network connects to some or all of the UDS elements (e.g., latches, registers, memories, etc.) of the primary circuit structure to establish the communication pathway between the two networks. In some embodiments, the configuration and monitoring network has a streaming mode that can direct various circuits in one or more configurable tiles of the primary circuit structure to stream out their data during the operation of the configurable IC. In some embodiments, the determination of which circuits are to stream out their data is made before runtime of the IC. As discussed below, in some such embodiments, configuration data is loaded into the IC that identifies these circuits that are identified for streaming. Accordingly, in some embodiments where the configuration and monitoring network connects to some or all of the UDS elements, the configuration and monitoring network can be used in a streaming mode to stream out data from the UDS elements of the tiles, in order to identify any errors in the operation of the IC. In other words, the streaming of the data from the UDS elements can be used to debug the operation of the configurable IC.

In various places in this specification, signals or data are described as going to the configuration and monitoring network from logic circuits, RMUXs, and/or IMUXs of the primary circuit structure. In some embodiments, such data goes directly from the indicated circuits of the primary circuit structure to the configuration and monitoring network without any further intervening circuits. In other embodiments, data can be sent from logic circuits, RMUXs or IMUXs of the primary circuit structure through some type of intervening circuit (e.g., a state element). It will be clear to one of ordinary skill in the art that references to data going to the configuration and monitoring network from a circuit encompass both data going directly to a configuration and monitoring network and data going to a configuration and monitoring network through intervening circuits.

In some embodiments, the signals from circuits or tiles of the primary circuit structure are conveyed in real time to various circuit elements or circuit blocks of the configuration and monitoring network such that the configuration and monitoring network is able to always observe the primary circuit structure during operation of the primary circuit structure. For instance, a configuration and monitoring network that collects statistics regarding the performance of the primary circuit structure will receive the signals at one or more counters of the configuration and monitoring network that measure the activity of the routed signals in the primary circuit structure.

Some embodiments might organize the configurable circuits in an arrangement that does not have all the circuits organized in an array with several aligned rows and columns. Therefore, some arrangements may have configurable circuits arranged in one or more arrays, while other arrangements may not have the configurable circuits arranged in an array.

Some embodiments might utilize alternative tile structures. For instance, FIG. 4 illustrates an alternative tile structure that is used in some embodiments. This tile 400 has four sets 405 of 4-aligned LUTs along with their associated IMUXs. It also includes eight sets 410 of RMUXs and eight banks 415 of configuration RAM storage. Each 4-aligned LUT tile shares one carry chain. One example of which is described in U.S. Pat. No. 7,295,037, entitled "Configurable IC with Routing Circuits with Offset Connections", issued on Nov. 13, 2007. One of ordinary skill in the art would appreciate that other organizations of LUT tiles may also be used in conjunction with the invention and that these organizations might have fewer or additional tiles.

C. Reconfigurable IC Architecture

Some embodiments of the invention perform placement for an IC that has reconfigurable circuits that reconfigure (i.e., base their operation on different sets of configuration data) one or more times during the operation of the IC. Specifically, these ICs are configurable ICs that can reconfigure one or more circuits during runtime. These IC typically includes reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it bases its operation on a different set of configuration data. An IC with reconfigurable circuits is sometimes referred to as a reconfigurable IC. However, in addition to reconfigurable circuits, the IC also typically includes non-configurable circuits (e.g., non-configurable logic circuits, interconnect circuits, memories, configurable circuits that are not sub-cycle reconfigurable, etc.).

In some embodiments, the logic circuits are look-up tables while the interconnect circuits are multiplexers. Also, in some embodiments, the LUTs and the multiplexers are sub-cycle reconfigurable circuits (sub-cycles of reconfigurable circuits may be alternatively referred to as "reconfiguration cycles"). In some of these embodiments, the IC with configurable circuits stores multiple sets of configuration data for a sub-cycle reconfigurable circuit, so that the reconfigurable circuit can use a different set of configuration data in different sub-cycles. A reconfigurable circuit of some embodiments that operates on four sets of configuration data receives its four configuration data sets sequentially in an order that loops from the first configuration data set to the last configuration data set. Such a sequential reconfiguration scheme is referred to as a 4 "loopered" scheme. Other embodiments, however, might be implemented as six or eight loopered sub-cycle reconfigurable circuits. In a six or eight loopered reconfigurable circuit, a reconfigurable circuit receives six or eight configuration data sets in an order that loops from the last configuration data set to the first configuration data set. Sub-cycle reconfigurable circuits are also referred to as spacetime reconfigurable while reconfigurable circuits that are not sub-cycle reconfigurable are referred to as spatial reconfigurable circuits.

Figure 5:
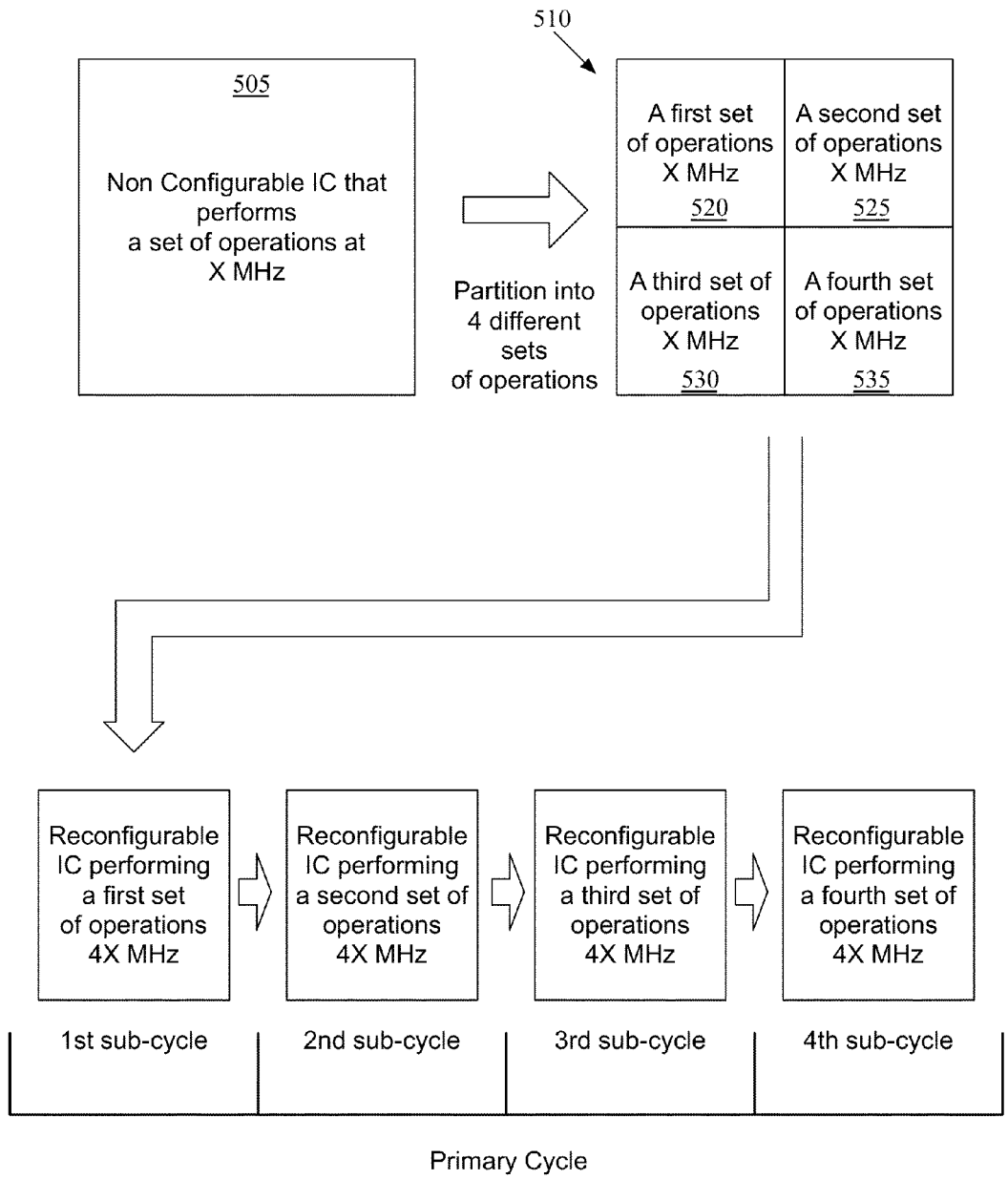
FIG. 5 conceptually illustrates an example of an IC with sub-cycle reconfigurable circuits (i.e., circuits that are reconfigurable on a sub-cycle basis).

FIG. 5 conceptually illustrates an example of an IC with sub-cycle reconfigurable circuits (i.e., circuits that are reconfigurable on a sub-cycle basis). In this example, the IC implements an IC design 505 that operates at a clock speed of X MHz. The operations performed by the components in the IC design 505 can be partitioned into four sets of operations 520-535, with each set of operations being performed at a clock speed of X MHz.

FIG. 5 then illustrates that these four sets of operations 520-535 can be performed by one IC 510 with sub-cycle reconfigurable circuits. The IC operates at 4X MHz. In some embodiments, four cycles of the 4X MHz clock correspond to four sub-cycles within a cycle of the X MHz clock. Accordingly, this figure illustrates the IC 510 (i.e., at least one or the reconfigurable circuits of the IC) reconfiguring four times during four cycles of the 4X MHz clock (i.e., during four sub-cycles of the X MHz clock). During each of these reconfigurations (i.e., during each sub-cycle), the IC 510 performs one of the identified four sets of operations 520-535. In other words, the faster operational speed of the IC 510 allows the circuits of this IC to reconfigure four times during each cycle of the X MHz clock, in order to perform the four sets of operations 520-535 sequentially at a 4X MHz rate instead of performing the four sets of operations in parallel at an X MHz rate.

Several embodiments were described above by reference to examples of sub-cycle reconfigurable circuits that operate based on four different sets of configuration data. In some of these examples, a reconfigurable circuit receives its four different configuration data sets sequentially in an order that loops from the last configuration data set to the first configuration data set. Such a sequential reconfiguration scheme is referred to as a 4-loopered scheme. Higher order loopered schemes (e.g., 8, 16, 32, etc.,) are likewise implemented in some embodiments.

While the reconfigurable circuits described above reconfigure in sub-cycles of a user design clock cycle, one of ordinary skill in the art will understand that in some embodiments, the reconfiguration cycles are not part of a larger user design clock cycle. Accordingly, any features described herein as using sub-cycles can also be implemented in some embodiments with reconfiguration cycles that are not sub-cycles of a longer user design clock cycle. In some such embodiments, multiple reconfigurations of the reconfigurable circuits are performed cyclically based on a reconfiguration clock cycle. In some such embodiments, some reconfigurable circuits reconfigure sequentially through a sequence of configurations over the course of multiple reconfiguration cycles, and then repeat the sequence of configurations multiple times.

D. Rescaling

For a design of an integrated circuit (IC) that includes an original set of circuits designed to operate at a frequency $F_0$, rescaling is an operation that transforms the original set of circuits into a rescaled set of circuits that can operate at a fractional frequency $F_0/k$ and still retain the functionality, latency, bandwidth and interface of the original set of circuits. Rescaling transforms the original set of circuits into the rescaled set of circuits by making multiple copies of the original set of circuits. A rescaling operation with a rescaling factor of k makes k replicas or copies of the original set of circuits. Each replica set of circuits (or replicas) includes counterpart components and connections that are identical to components and connections in the original set of circuits. Thus for an original set of circuits that includes sequential elements (e.g., flip-flops) and combinational elements (e.g., logic gates and multiplexers), rescaling creates replicas that include counterpart sequential and combinational elements of the sequential and combinational elements of the original.

In some embodiments, the rescaling operation also establishes connections between the replica sets of circuits according to logical equivalency and phase relationships. For an original set of circuits that includes sequential elements operating at certain clock phases, rescaling transforms those clock phases into fractional phases at the counterpart sequential elements in the replicas. The fractional phase $\phi'$ at each sequential element in a replica is thus calculated according to the equation $$\phi' = (\phi + 360° \times i)/k \tag{1}$$

where i is the index of a particular replica (the replicas are indexed as 0 . . . k−1), and $\phi'$ is the fractional phase for a counterpart sequential element in the particular replica set within the rescaled set of circuits.

Based on the calculated fractional phase $\phi'$, some embodiments rewire connections in the rescaled set of circuits such that each sequential element in each replica receives a functional equivalent input at a phase $$\phi'_{input} = \phi' - \Delta(\phi, \phi_{input})/k \tag{2}$$

where $\phi_{input}$ is the phase of the input to the sequential element before rescaling, and $\Delta(\phi, \phi_{input})$ is the phase difference between the sequential element and its input before rescaling. For a sequential element whose phase difference with its input in the original set of circuits is one entire cycle (i.e., $\Delta(\phi, \phi_{input}) = 360°$), equation (2) becomes:

$$\phi'_{input} = (\phi + 360° \times (i-1))/k \tag{3}$$

Since a functional equivalent input at a phase that satisfies equation (3) is often found in another replica set of circuits in the rescaled set of circuits, some embodiments of the rescaling operation rewire some or all sequential elements in a replica to receive inputs from other replicas. Some embodiments also add additional sequential elements into the rescaled netlist in order to provide logically equivalent inputs to sequential elements at correct phase relationships.

The rewiring of the k replicas results in a rescaled set of circuits that has k parallel paths that each has a latency of 1/k cycles of the original set of circuits. In some embodiments, each path runs at a fractional frequency of $F_0/k$ so the effective latency of the k paths is equivalent to the original set. Since there are k parallel paths running at the fractional frequency of $F_0/k$, the effective bandwidth is maintained.

To complete rescaling, some embodiments replace the original set of circuits with the rescaled set of circuits. Replacing the original set with the rescaled set involves disconnecting the original set from certain peripheral nodes and connecting those peripheral nodes to the rescaled set. Rescaling is further described in U.S. Patent Publication 2012/0176155, entitled "Rescaling," filed on Mar. 21, 2012.

II. CONFIGURATION AND MONITORING NETWORK CIRCUITS

Some embodiments provide a system and method for obtaining visibility into an in-the-field device. These embodiments provide a monitoring tool that allows unobtrusive full read access to a running user design to enable rapid-response monitoring, debugging, and response to exceptions and other events. In contrast to the existing monitoring solutions, the system of these embodiments does not require downtime (or stopping) of the device or recompilation of code to be run on the device, does not disturb the functionality timing of a running design, and can be applied as a hot-fix in the lab or in the field.

The device in some embodiments has a primary circuit structure that includes a group of reconfigurable circuits and a configuration and monitoring network that operates in non-intrusive manner to the operations of the primary circuit structure. Specifically, a non-intrusive configuration and monitoring network operation is one which does not need to use circuits that would otherwise be used to implement the user's design. In some embodiments, the configuration and monitoring network does not change any values of resources of the primary circuit structure while the configuration and monitoring network monitors the primary circuit structure. Some advantages of a non-intrusive configuration and monitoring network of some embodiments are that the non-intrusive configuration and monitoring network: 1) does not interfere with the implementation of the user design in the primary circuit structure and 2) does not require restructuring the physical implementation of the user design in the primary circuit structure in order to retrieve data from different parts of the circuit.

In some embodiments, non-intrusive configuration and monitoring network does not use circuits that are assigned to implement the user design in the primary circuit structure, but the non-intrusive configuration and monitoring network of some embodiments is uses "dedicated" circuits, for example, configurable interconnect circuits. Therefore, once a user design circuit has been implemented on the primary circuit structure, such configurable circuit elements of the primary circuit structure that are not used to implement the user design circuit may be put to use to support the configuration and monitoring network and transport network.

Figure 6:
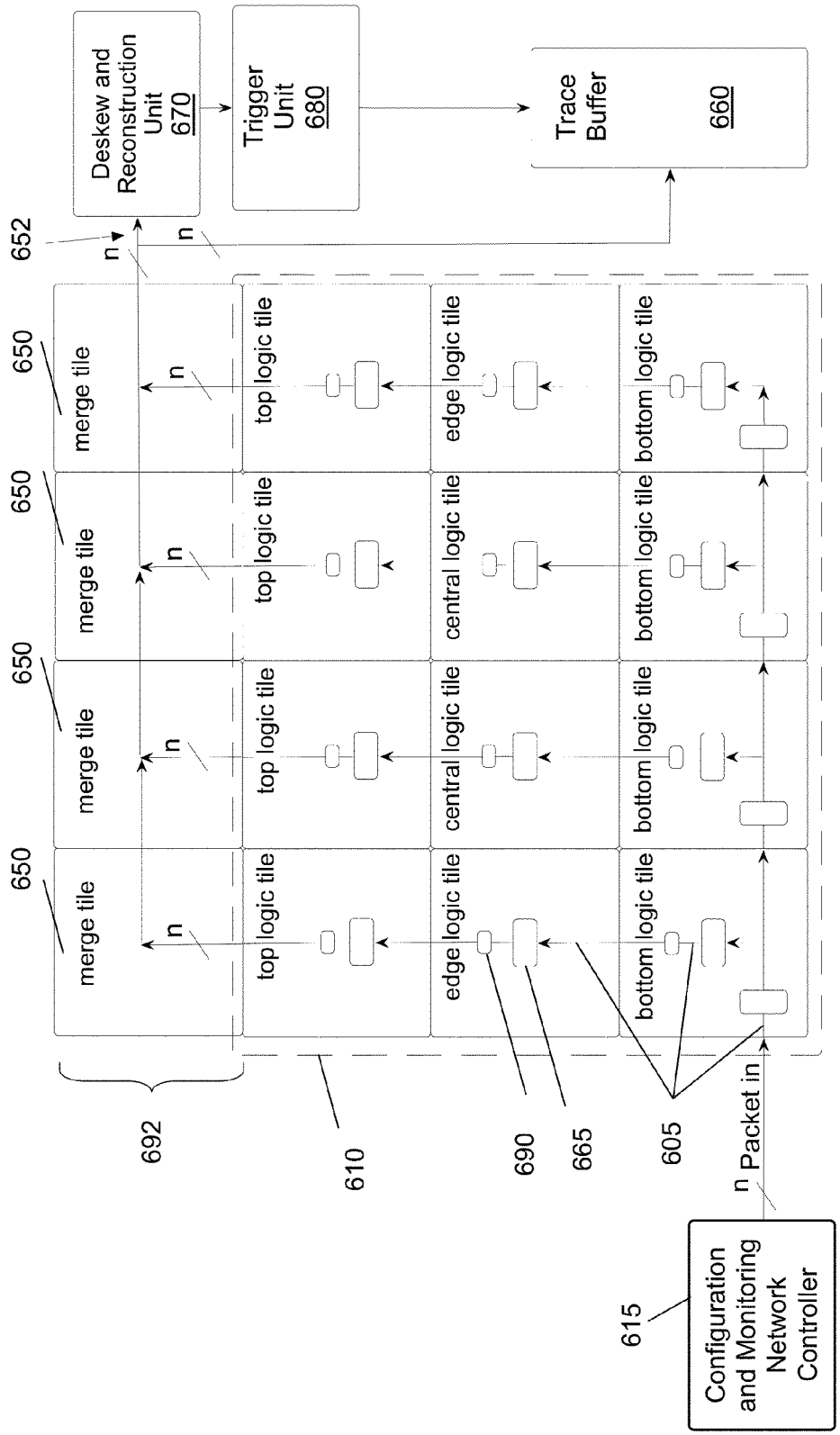
FIG. 6 provides an overview of a configuration and monitoring network of some embodiments interfacing with a primary circuit structure.

FIG. 6 provides an overview of a configuration and monitoring network of some embodiments interfacing with a primary circuit structure. As shown in this figure, this configuration and monitoring network includes a bus 605 and a controller 615. FIG. 6 also shows a tile array 610 of the primary circuit structure that includes multiple tiles. Each tile includes one or more sets of decoders 690 and a pipeline register 665. This figure also shows a set of merge tiles 650 of a transport network 692, bitlines 652, a trace buffer 660, deskew and reconstruction circuitry 670, and trigger circuitry 680.

The bus 605 passes through each tile of the tile array 610 of the primary circuit structure, so that the controller 615 can route packets to the tiles of the tile array 610. In some embodiments, the controller 615 is a microprocessor or some other circuit (e.g., a set of configurable circuits of the IC configured as a controller that is capable of performing the operations described below). In some embodiments, the controller 615 includes an interface (e.g., JTAG, or some other interface) to an external set of resources (e.g., memory, a workstation that runs software, etc.). In some embodiments, the controller 615 receives data from outside of the IC, formulates the data packets based on the received data, and routes the data packets to the tiles of the tile array 610 over the bus 605. In some embodiments, the controller 615 receives data from within the IC, formulates the data packets based on the received data, and routes the data packets to the tiles of the tile array 610 over the bus 605.

The data packet is routed through multiple tiles, and passes out of the top tiles into the transport network 692. In some embodiments, the transport network 692 is an example of the transport network 215 described above by reference to FIG. 2. Additionally, each of the configurable tiles includes one or more pipeline registers 665 that buffer the signals passing through the bus 605 of the configuration and monitoring network. Specifically, these pipeline registers 665 act to improve the timing of the data transport, so that high operating frequencies can be achieved. The tiles at the bottom of the tile array 610 of FIG. 6 each have two pipeline registers 665, one of which is for passing signals "up" a column, while another is for passing signals "across" a column. Because of these pipeline registers 665, the configuration and monitoring network is fully "pipelined." In other words, more than one set of data can be present within the configuration and monitoring network at any given time by virtue of these pipeline registers 665.

Each tile also includes a set of decoders 690. The set of decoders 690 includes a tile selector that evaluates each packet received through the data bus of the configuration and monitoring network and determines, based on the contents of the packet (i.e., the opcode and operand) whether that packet was addressed for that tile. The set of decoders 690 also includes first and second decoders that determine, based on the contents of the packet, which resources within the tile are addressed, and the operation specified by the packet to perform at the addressed resources (e.g., read, write, etc.).

The merge tiles 650 of the transport network 692 route the data to and from the primary circuit structure along bitlines 652 to the trace buffer 660 and the deskew and reconstruction circuits 670. In FIG. 6, and in some other figures of this specification, data lines are represented with a slash through them and the letter "n" (or a number) next to the slash. These symbols indicate that the line represents multiple data lines, but is represented as one line rather than render the figure difficult to understand by having a separate line for each bit of width of the line. It will be clear to those of ordinary skill in the art that: 1) other values of n can be used in other embodiments, and 2) multiple instances of "slash n" in a particular figure do not necessarily represent the same width as each other even within that particular figure. Furthermore, when the text or context indicates that a line without a "slash n" is a multiple line bus, the absence of the "slash n" should not be taken to mean that a line is a single bit data line.

In some embodiments, the primary circuit structure has a known latency through each of the tiles of the tile array 610. However, the topology is constructed such that two signals that pass through different numbers of tiles will take the same amount of time to travel through the transport network 692. Furthermore, the amount of time it takes for a signal to pass through a set of tiles can be predicted from the path through the tiles.

Whilst the time for a round-trip is constant, the transport time from a given tile to the controller 615 will vary depending on the physical position of the tile on the fabric. This raises the issue of how to compare data that comes from different parts of the configurable IC (e.g., different tiles in the tile array 610). The deskew circuitry 670 compensates for the variance in delays caused by bits arriving from different physical locations. In some embodiments, the deskew circuitry 670 also compensates for other delays. Other delays include those caused by retiming of the configured circuit. The deskewing operation of the deskew circuitry 670 allows the trigger circuits 680 to operate on data that is adjusted to appear properly simultaneous. In some embodiments, circuitry of the configuration and monitoring network thus performs a mask and merge operation, as further described below, such that the data passing through the configuration and monitoring network is not disjointed.

In some embodiments, the bandwidth (i.e., the amount of data during a given time) that the bus 605 can carry to the transport network 692 is limited by the width of the bus 605. In some circumstances, it is desirable to collect more data bits from a given column than the width of the bus in that column would allow. In some embodiments, this problem is solved by using the routing fabric of the tiles to send the additional data bits to tiles in one or more other columns. In other words, if the demand from a particular column is higher than the capacity in that column, then the routing fabric can redirect the signal to another column with excess capacity (i.e., a set of configurable circuits that are not assigned to the user design). Examples of routing fabric, such as wiring and interconnects that connect the configurable logic circuits are disclosed in U.S. Pat. No. 7,295,037, issued Nov. 13, 2007. Moreover, a more detailed discussion for the various components illustrated in FIG. 6 and for other components of the primary data structure and the configuration and monitoring network described herein is provided for in U.S. Pat. No. 8,069,425, issued on Nov. 29, 2011, and U.S. Pat. No. 7,375,550, issued May 20, 2008. U.S. Pat. No. 7,295,037, U.S. Pat. No. 8,069,425, and U.S. Pat. No. 7,375,550 are incorporated herein by reference.

In this specification, the figures show the data flowing "up" the configuration and monitoring network, then along the transport network 692 from left to right, then into a trace buffer 660 to the right of the transport network 692 and into trigger circuits 680 below the transport network 692. However, it will be clear to one of ordinary skill in the art that other orientations of components other than the particular orientations illustrated are possible within the scope of the invention. For example, the primary circuit structure might send data "down" to a transport network 692 below the tile array, or data might flow from "right" to "left" to reach trigger circuits and/or trace buffers on the left instead of the right, etc.

As mentioned above, the controller 615 includes an interface to the primary circuit structure of the IC. In some embodiments, such an interface is provided through a fabric port. In some embodiments, a fabric port provides an interface between the controller 615 of the configuration and monitoring network and the primary circuit structure (which performs the "user design"). Thus, the fabric port provides a mechanism for the user design to access and control resources of the configuration and monitoring network (e.g., configuration bits within the configuration and monitoring network). Through the fabric port, the primary circuit structure is able to interact with the configuration and monitoring network in an internal manner that is similar to external mechanisms (e.g., external software communicating with the configuration and monitoring network through a JTAG or some other interface).

A. Deskewing and Reconstruction Units

Physical signals in the fabric must be aligned before they are conveyed to the trigger unit. The signals arrive out of alignment because signals that originate from different physical locations on the chip pass through different numbers of pipelining registers along the way. Assuming that user signals on the user circuit are sourced and sampled at the same fabric clock cycle, the deskew unit corrects any skew caused by signals travelling distances and/or software retiming and routing choices such that the user signals are realigned again at the inputs of the trigger unit.

Figure 7:
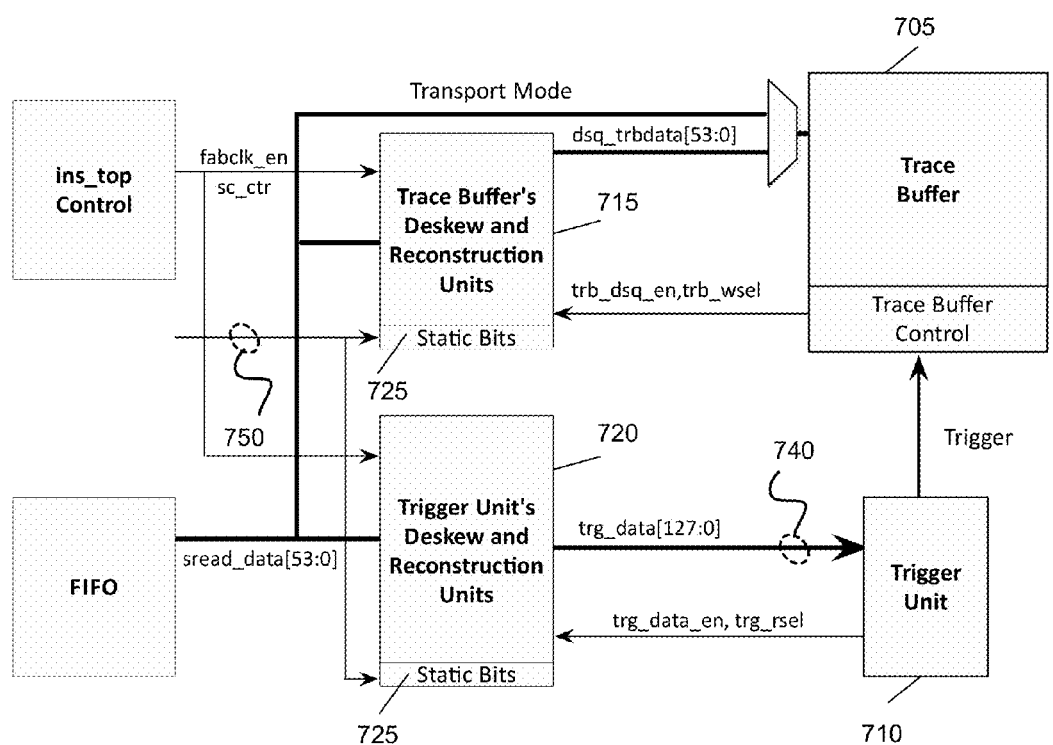
FIG. 7 conceptually illustrates a group of the units of the configuration and monitoring network of some embodiments of the invention.

FIG. 7 conceptually illustrates a group of the configuration and monitoring network units of some embodiments of the invention. As shown, the configuration and monitoring network units include trace buffer 705, trigger unit 710, deskew and reconstruction units 715 for trace buffer 705 and deskew and reconstruction units 720 for trigger unit 710.

Each deskew unit includes many deskew lines, each providing a 1-bit wide, programmable delay that can be used to align signals that participate in a user-defined trigger. In some embodiments, there are at least as many deskew lines as there are trigger inputs. In the example of FIG. 7, there are 128 1-bit lines 740. Additional deskew lines are provided in some embodiments to be used as trace buffer inputs. The deskew units are controlled by the values of the configuration bits 750. The deskew units in some embodiments are controlled from static bits 725. The configuration-related logic runs on the configuration clock (cfg_clk) domain.

Figure 8:
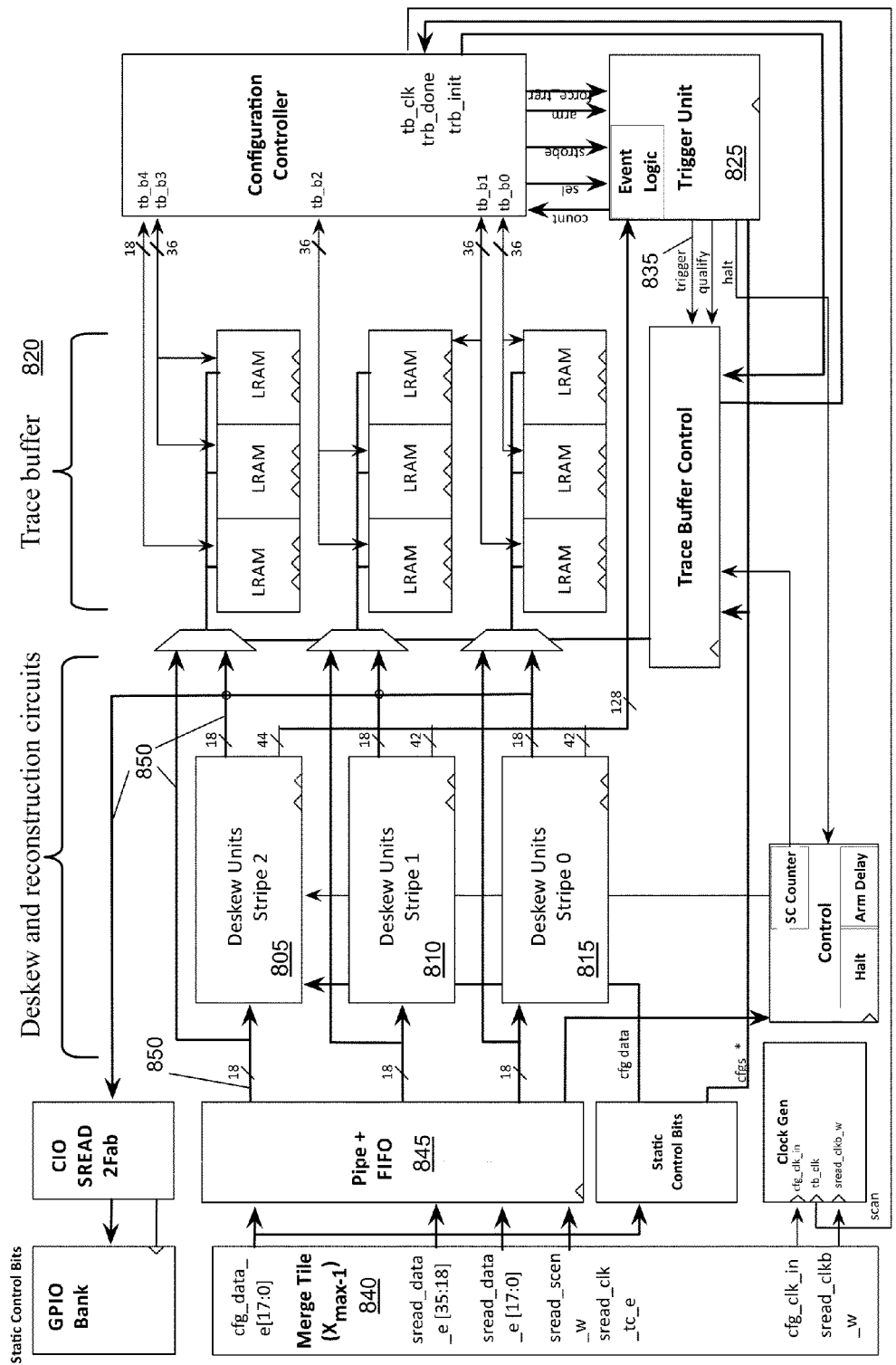
FIG. 8 conceptually illustrates a group of the units of the configuration and monitoring network some embodiments of the invention in more detail.

FIG. 8 conceptually illustrates a group of the configuration and monitoring network units of some embodiments of the invention in more detail. The deskew units in the example of FIG. 8 include three stripes of deskew units 805-815. Each stripe has deskew units for both the trace buffer 820 and the trigger unit 825. The trigger unit 825 fires a trigger signal 835 when the trigger unit identifies a data value, a set of values, or a sequence of values coming in that satisfy one or more user specified conditions set of the incoming data. In the illustrated example, the firing of the trigger signal causes the trace buffer 820 to store and record data that is being streamed out from the merge tiles 840 through the pipe and FIFO unit 845. In other embodiments, the firing of the trigger cause other actions such as storing data in storage other than the trace buffer (e.g., in RAM), sending data out of the IC, sending the data into the primary circuits of the IC, causing one or more reconfigurable circuits to reconfigure, halting the IC, etc.

The deskew units data path 850 operates on the full-rate sub-cycle clock (sread_clk). This clock is throttled with enable signals to create support for various clocking modes and to extend the delay capacity of the deskew units. Data in a deskew line is pushed through multiple pipelining stages at throughputs of one bit per fabric clock cycle, but is still synchronous to the sub-cycle clock. The fabric clock is a virtual clock; its frequency is the subcycle clock frequency divided by the looper (e.g., divided by 4 in a 4-loopered scheme). The distinction between the fabric clock and user clock is needed in the presence of rescaling. The user clock is what the user design defines in the RTL. Once the design is mapped to spacetime, it may be rescaled and otherwise transformed to a fabric clock.

B. Different Configurations for Reconstruction Units

Some embodiments utilize the user signals that were expressed in the user RTL in order to build conditions that fire the trigger signal. However, user signals as originally expressed in the RTL source code may not be available on-chip for the following reasons: (1) synthesis optimization—user signals may have been eliminated during synthesis, or they may be contained within a LUT and (2) rescaling—multiple fabric-cycle rate signals may need to be recombined to create a single user-cycle rate user signal.

Some embodiments employ two different strategies to create signals that can be used for triggering: (1) user signals that were eliminated during synthesis are reconstructed by logically combining other existent fabric signals with one or more LUTs. The number of component signals needed to combine to create the RTL signal is denoted n and (2) multiple versions of a user signal that are created by rescaling are recombined into a single fabric signal with a rescaling multiplexer (mux).

Figure 9:
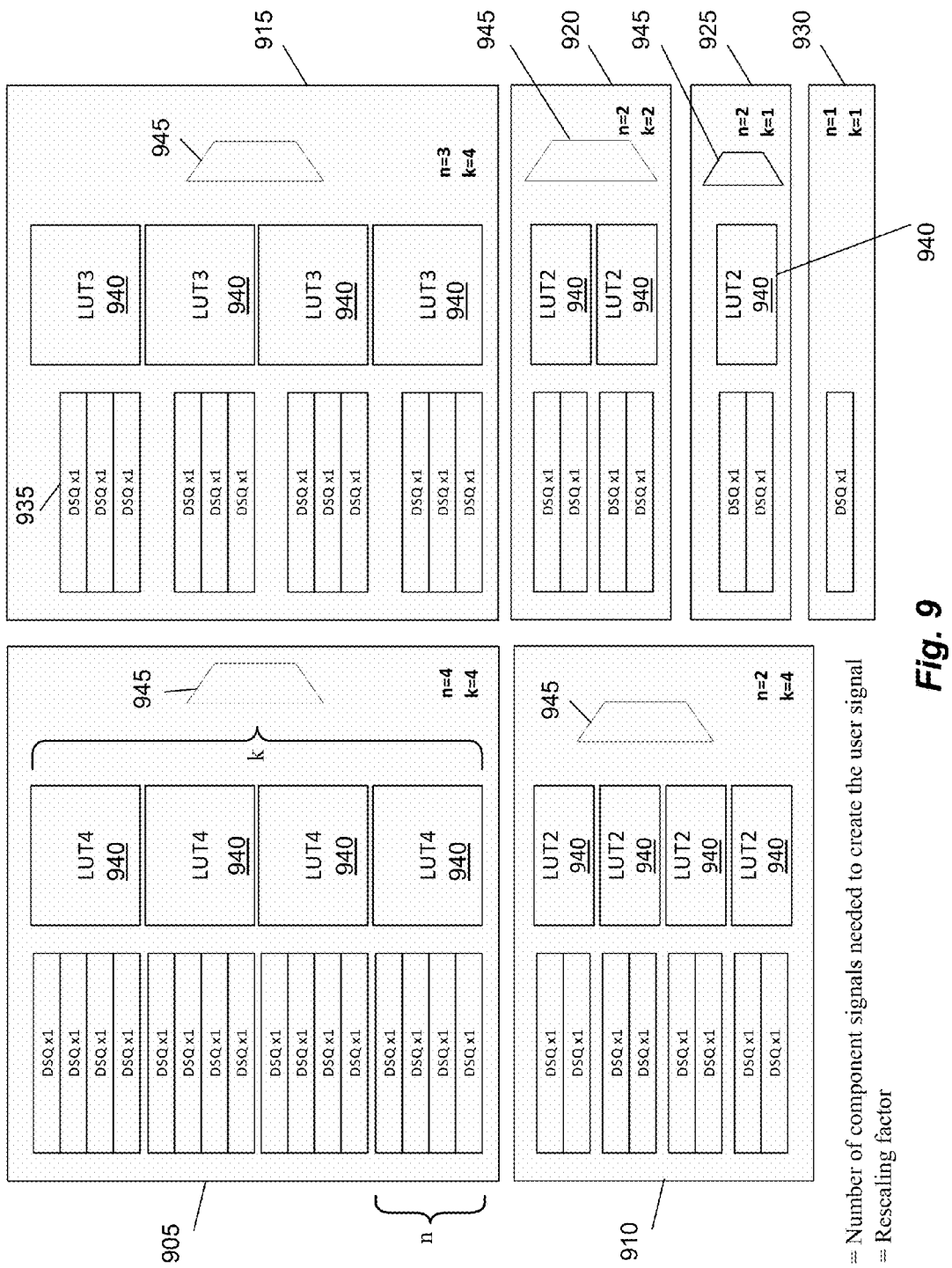
FIG. 9 conceptually illustrates examples of different configurations for the basic reconstruction units.

FIG. 9 conceptually illustrates examples of different configurations 905-930 for the basic reconstruction units. The rescaling factor in use by the clock domain under debug is denoted k. The number of component signals needed to create the user signal is denoted n. The rescaling mux 945 selects one of k rescaled signals, one per sub-cycle. One or more LUTs 940, and a rescaling mux 945 are installed between the deskew unit and the trigger unit. The LUT can be used to regenerate signals lost through optimization and the rescaling mux 945 can create the composite user signal by selecting the appropriate k rescaled signal during each fabric cycle. The configurations 905-930 can also handle simultaneous regeneration via the LUT and composite signal generation via the rescaling mux. For example, the reconstruction unit 910 with n=2, k=4 can reconstruct signals from two related signals via a 2-LUT, and can recombine signals for net-lists transformed by rescaling up to 4×. The deskew lines 935 align signals as they arrive from the merge network.

Figure 10:
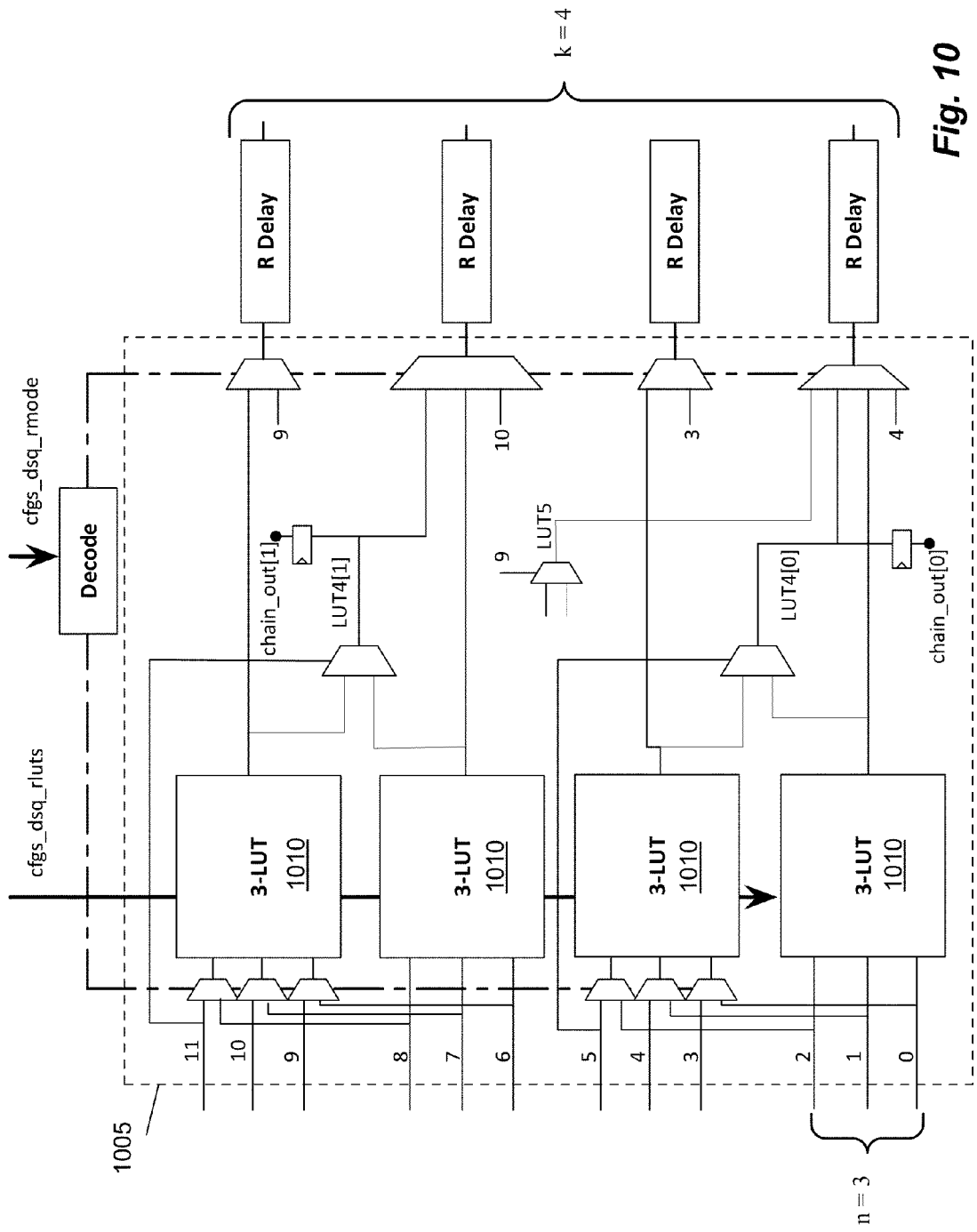
FIG. 10 conceptually illustrates the reconstruction circuitry in some embodiments of the invention where the number of component signals needed to create the user signal is up to 3 and the rescaling factor is 4.

FIG. 10 conceptually illustrates the reconstruction circuitry in some embodiments of the invention where the number of component signals needed to create the user signal is up to 3 and the rescaling factor is 4. The entire block of circuitry 1005 serves a single trigger or trace buffer input. Three of the four LUTs 1010 and their related deskew units are not used if no rescaling is applied. Two of the four LUTs and related deskew units are not used if 2× rescaling is applied.

Each deskew unit contains up to four 3-input LUTs (3-LUTs). For n from 1 to 3 the LUTs are used independently. For n equal to a larger than the number of the inputs to the LUTs (i.e., 4 or more) the LUTs are chained together to create wider functions. In some embodiments, the deskew unit implemented can only handle a certain value of n for a given value of k. In order to support larger values of n, the LUTs of other deskew units are borrowed. In the case that the other (donor) deskew unit is not using the LUT (e.g., k=1, n=2), there is no loss in capacity.

Chaining of multiple deskew lines allows combining of the deskew line blocks to handle worst-case skew for lower values of looperness and/or extreme signal locations. Chaining multiple deskew lines together can reduce the number of deskew unit outputs available for triggering, but makes it possible to achieve longer delays.

Figure 11:
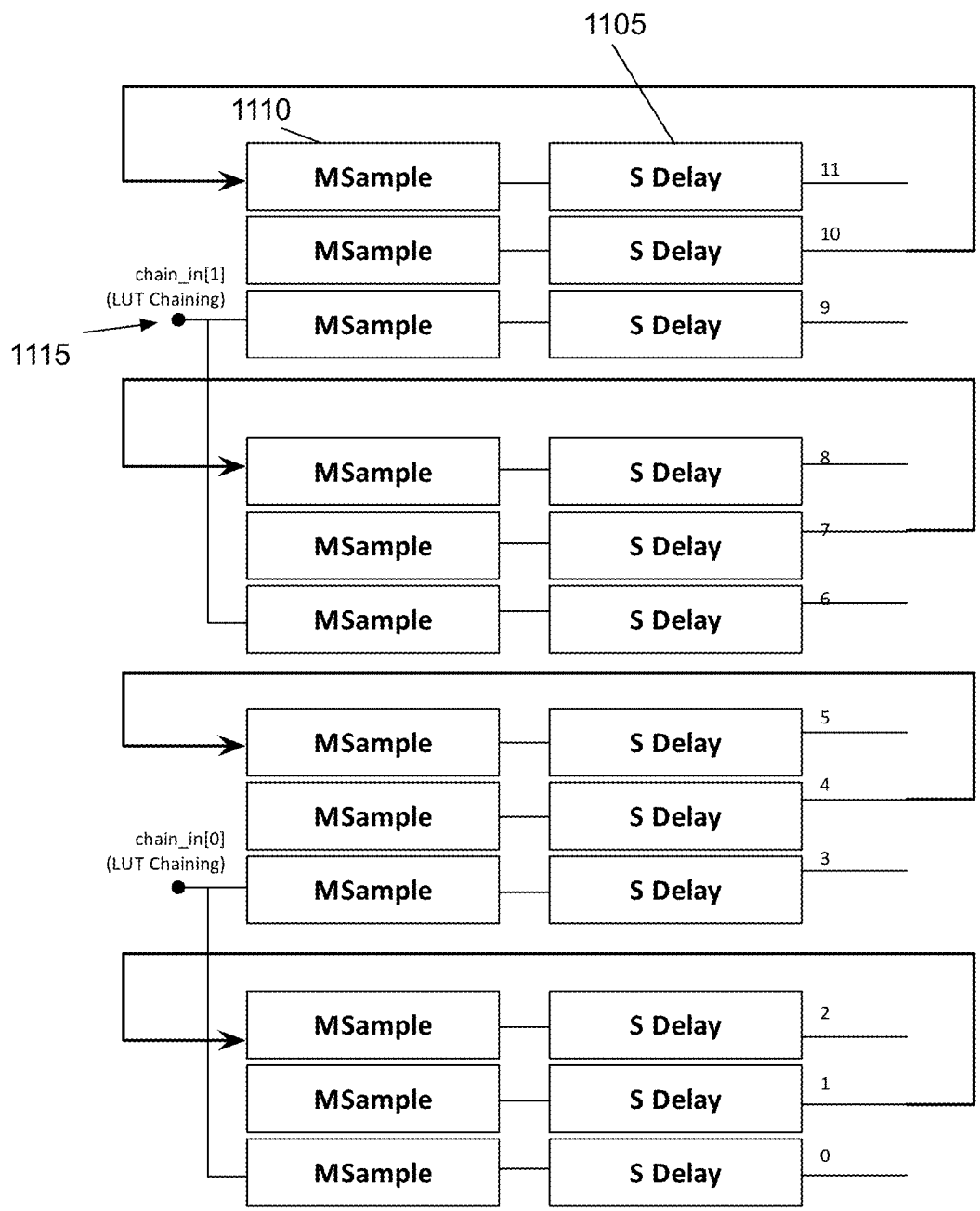
FIG. 11 conceptually illustrates chaining of multiple deskew lines in some embodiments of the invention.

FIG. 11 conceptually illustrates chaining of multiple deskew lines in some embodiments of the invention. Signal alignment (S delay) deskew lines 1105 are chained internal to a deskew unit. The chaining happens through the merge sample (MSample) units 1110. In order to reduce wire congestion in the design, not all S Delay blocks have the extra chaining input, as shown in FIG. 11. At most N−1 inputs to a function would need extra delayed, and not every S input is used for most functions. LUT chaining 1115 enters the merge sample unit, similar to S-delay chaining. The source signals are the chained out outputs from another Deskew Unit.

III. VIEWS

Some embodiments provide a method of creating views for monitoring and controlling the operations of an IC. A view is a tool for specifying events and response to the events. Each view is a statement that identifies what to do (e.g., what data items to collect or what controls to activate) when a condition becomes true. For instance, a user can create a view to start collecting data when a set of user design signals satisfies a particular condition.

Views enable inspection of production designs in the field or in the lab while the IC is performing operations of the user design. The use of views in some embodiments allows all application-visible states to be unobtrusively monitored and inspected. No recompilation or replacement of the code running on the IC and no pre-declaration of viewable signals are required.

Some embodiments utilize an interactive process for describing the views. The result of the process is a text file that describes a view specification. Some embodiments use a proprietary format while other embodiments use a subset of SystemVerilog to define view specifications.

A property is a statement that describes a set of relationships between signals in a design. For instance, a counter must not exceed 127, "Ack must go high between 1 and 3 cycles after receiving a Req", etc. An assertion is a construct that describes actions to be taken when a property is or is not met. As such, the assertion can be expressed as:

if (property) then action1 else action2

The following is an example of an assertion named "Ctr", which generates a warning if the value of "counter" exceeds 127:

Ctr: assert (counter <=127) else $warning ("Counter out of range")

The following is an example of an assertion named "ReqAck" that generates an error when an Ack signal is not detected:

ReqAck: assert property (@(posedge Clock) Reql→##[1:2] Ack) $display ("Everything's ok") else $error (Ack not detected")

A view generally expressed as:

View1: if (condition) $performAction can be expressed using a restricted subset of SystemVerilog as:

View1: assert (!condition) else $performAction

Some embodiments utilize the SystemVerilog "bind" construct to associate an assertion to a module or an instance in a user design by looking inside a pre-existing RTL instantiation hierarchy without the need to modify the original source code. The following is a example of an RTL source code in some embodiments of the invention:

```
//The DUT (original RTL)
module dut( input a, input b, input clk );
reg c;
always @ (posedge clk) begin
c <= a & b;
end
endmodule
//Assertion wrapped in a module (written in a different file)
module dut_sv_assert_module( input i,input j, input clk );
property prop0; @(posedge clk) i != j; endproperty : prop0
assert_prop0 : assert property(prop0) else $traceToBuffer(i, j);
endmodule
//Binding of assertion to DUT
module top;
...
bind dut dut_sv_assert_module dut_sv_assert_instance( .i(a),
.j(b), .clk(clk) );
endmodule : top
```

In the above example, the module "DUT" can be created as part of the user design module and the assertion and the binding can be created separately at a different time (before or after the design has closed timing or shipped) and without changing the original RTL.

In some embodiments, languages other than SystemVerilog are used to specify views. The following is an example of a proprietary format for specifying a view to trace a signal for 201 cycles, centered around the time of triggering:

trace buffer a0.b1.bar_reg##[−100:100]

The following is an example of a proprietary format for specifying a view to trigger when an instance of bar_reg==0:

trigger EQ(a0.b0.bar_reg,1'b0)

The following is an example of a proprietary format for specifying a view to trigger when a0.foo_reg (at time T+2) ==a1.foo_reg (at time T+3)+2, and call T the time when the trigger happens:

trigger EQ(a0.foo_reg##[2], AND(a1.foo_reg##[3], 2'b10))

The following is an example of a proprietary format for specifying a view to count (but not trace) the number of posedges on this signal during a 3001 clk period (triggers happened at T):

count POSEDGE a1.b1.mySIO.gadget.out##[−1000:2000]

In some embodiments, the trigger unit has three level of logic and can represent expressions such a:

OR (AND (EQ(a,5), NEQ(b,c)), XOR(POSEDGE(d), NEGEDGE(e)))

As described above, some embodiments perform rescaling which transforms the original set of circuits into the rescaled set of circuits by making multiple copies of the original set of circuits. When a clock domain is rescaled by a factor k, each computation is replicated k times. The fabric clock (FC) period is k times the original user clock (UC) period. The product of the two is such that the throughput of the clock domain is unchanged.

Assume that the user wants to observe and trigger a 1-bit register "a", which has been rescaled by k=4 but not optimized. Register "a" will have a sequence of values, expressed as a[i]. During each FC cycle, there will be four distinct values of "a" present at different x, y, and time coordinates in the fabric: a__0[j], a__1[j], a__2[j], a__3[j], where a_X[j]=a[i+X].

A user can ask a question such as: "inform me of the first value of i such that a[i]==1'b1", which is one of the basic operations needed for triggering. The four values of "a" over time are replaced with four distinct values that simultaneously live on the fabric as a__0, a__1, a__2, a__3. The FC period is four times as long, so the overall throughput of the fabric is identical to the throughput of the user design. To answer the above user inquiry, the trigger unit uses a 1b value, to inform the user that the condition the user asked for has become true during the this FC cycle.

Some embodiments use two ways to evaluate the expression a[i]==1'b1 on the trigger unit when it has been rescaled: (i) in series by sending the 4 values a__0 . . . 3 to a 1-bit slice of the trigger unit over a FC period (ii) in parallel by sending the 4 values to 4 1-bit slices over a fabric cycle period. In some embodiments, the trigger unit allows 'series' evaluation for k<=4 and for k>4 uses parallel evaluation.

Figure 12:
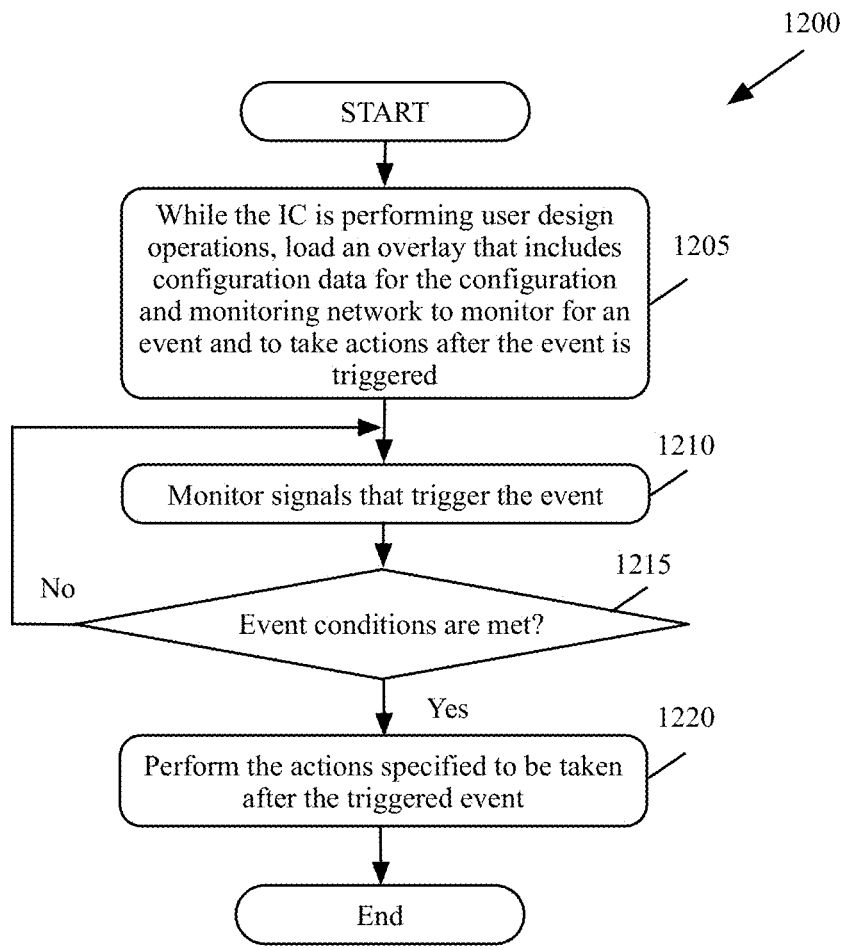
FIG. 12 conceptually illustrates a process for utilizing an overlay created from a view to perform an action when an event occurs in some embodiments of the invention.

In some embodiments, each view is translated to create an overlay that provides configuration data for the configuration and monitoring network to perform a set of tasks without changing the user design. FIG. 12 conceptually illustrates a process 1200 for utilizing an overlay created from a view to perform an action when an event occurs in some embodiments of the invention. As shown, the process loads (at 1205), while the IC is performing user design operations, an overlay that includes configuration data for the configuration and monitoring network to monitor for an event and to take actions after the event is triggered. The overlay corresponds to a particular view that a user has created to identify the event and the actions to take after the event occurrence.

The process then monitors (at 1210) the signals that trigger the event. The process then determines (at 1215) whether the event conditions are satisfied. If not, the process proceeds back to 1210 to continue monitoring the signals. Otherwise, the process performs (at 1220) the actions specified to be taken after the triggered event. The process then ends.

The views can be used in the lab or in the field. Examples of the different applications and uses of views include in-the-field system monitoring (e.g., determining the status of an IC implementing networking functions in a data center), in-system performance evaluation (e.g., determining why a system reboots every 30 minutes under real-life traffic), debugging of the board and system integration (e.g., determining why a design that worked in simulation does not work on an actual board), etc.

A. Lab System Debugger

Figure 13:
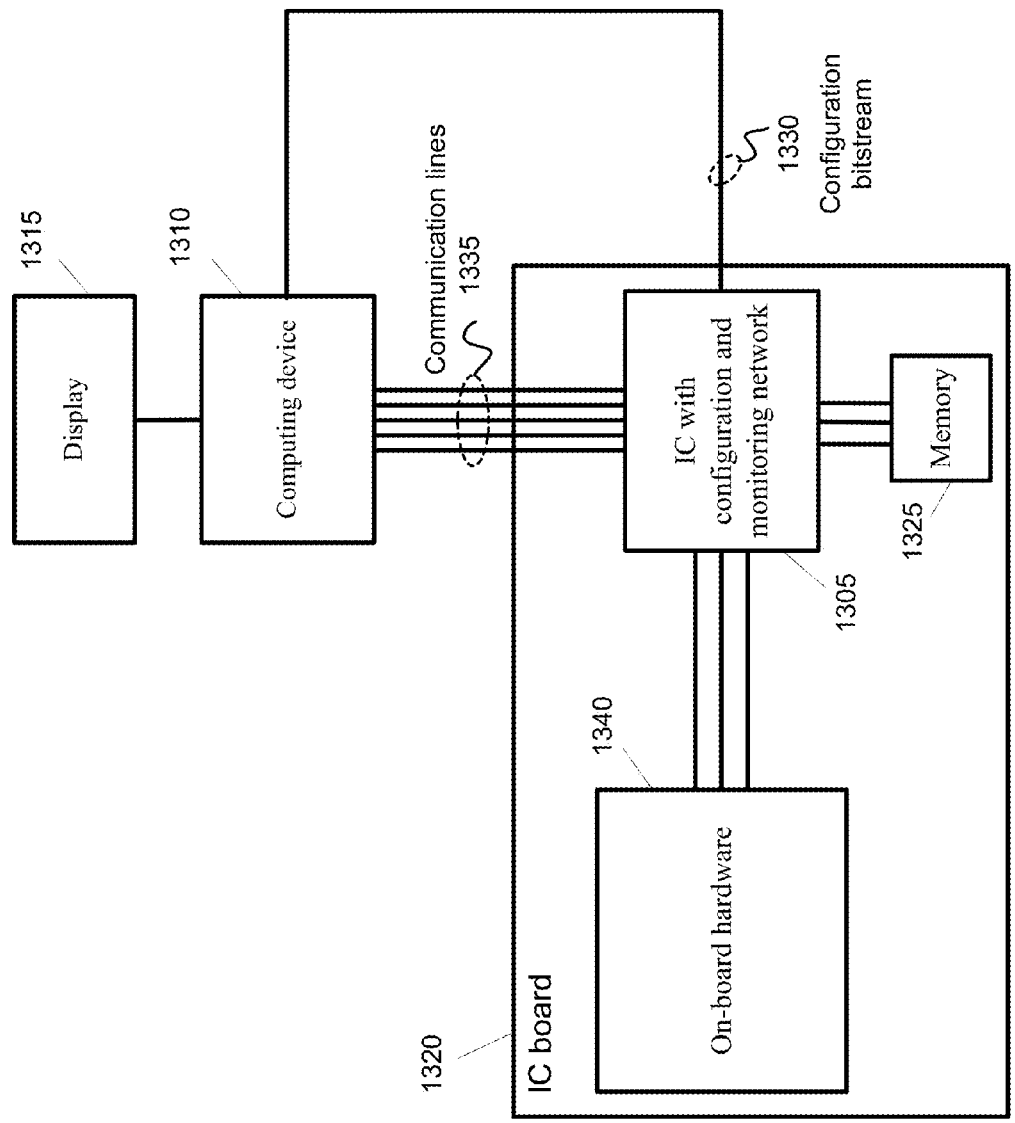
FIG. 13 conceptually illustrates an example of in-the-lab operation mode for an on-board configured IC in some embodiments of the invention.

FIG. 13 conceptually illustrates an example of in-the-lab operation mode for an on-board configured IC in some embodiments of the invention. The IC 1305 includes a set of reconfigurable circuits and a configuration and monitoring network. As shown, the IC 1305 is included on an IC board (or circuit board) 1320. The IC communicates with different on-board hardware modules such as application-specific integrated circuits (ASICs), etc., 1340. The ASIC is customized for a particular use, rather than intended for general-purpose use. The IC 1305 also includes internal memory (not shown) and/or accesses storage devices such as SRAM, RAM, etc., 1325 on the IC board 1320.

The IC 1305 is connected to a computing device 1310. The computing device is, for example, a desktop or a portable computing device that includes either a separate or an integrated display 1315. The computing device includes software tools to create views, translate views to overlays, and load created or pre-existing overlays into the IC 1320.

The computing device 1310 sends overlays that include configuration data for the configuration and monitoring network to the IC while the IC is performing user design operations. Each overlay corresponds to a view created by a user that specifies an event and the actions to take after the event occurs. The IC 1305 receives the overlays as a configuration bitstream 1330. Once an event is triggered, the IC performs the specified actions and sends the results back to the computing device through a set of communication lines 1335. The computing device 1310 analyzes the received data and/or displays the data on the display 1315.

In some embodiments, the communication between the computing device 1310 and the IC 1305 is through a dedicated communication module. In other embodiments (not shown), the communication is through other on-board hardware such as a controller or a microprocessor. In some embodiments, the tools in the computing device allow a user to select a serializer/deserializer (SerDes) in the IC to dedicate for communication between the computing device and the IC. The tools also provide control to instantiate the communication. This communication mechanism and the tools are utilized in some of the other configurations described below and are not repeated for simplicity.

Figure 14:
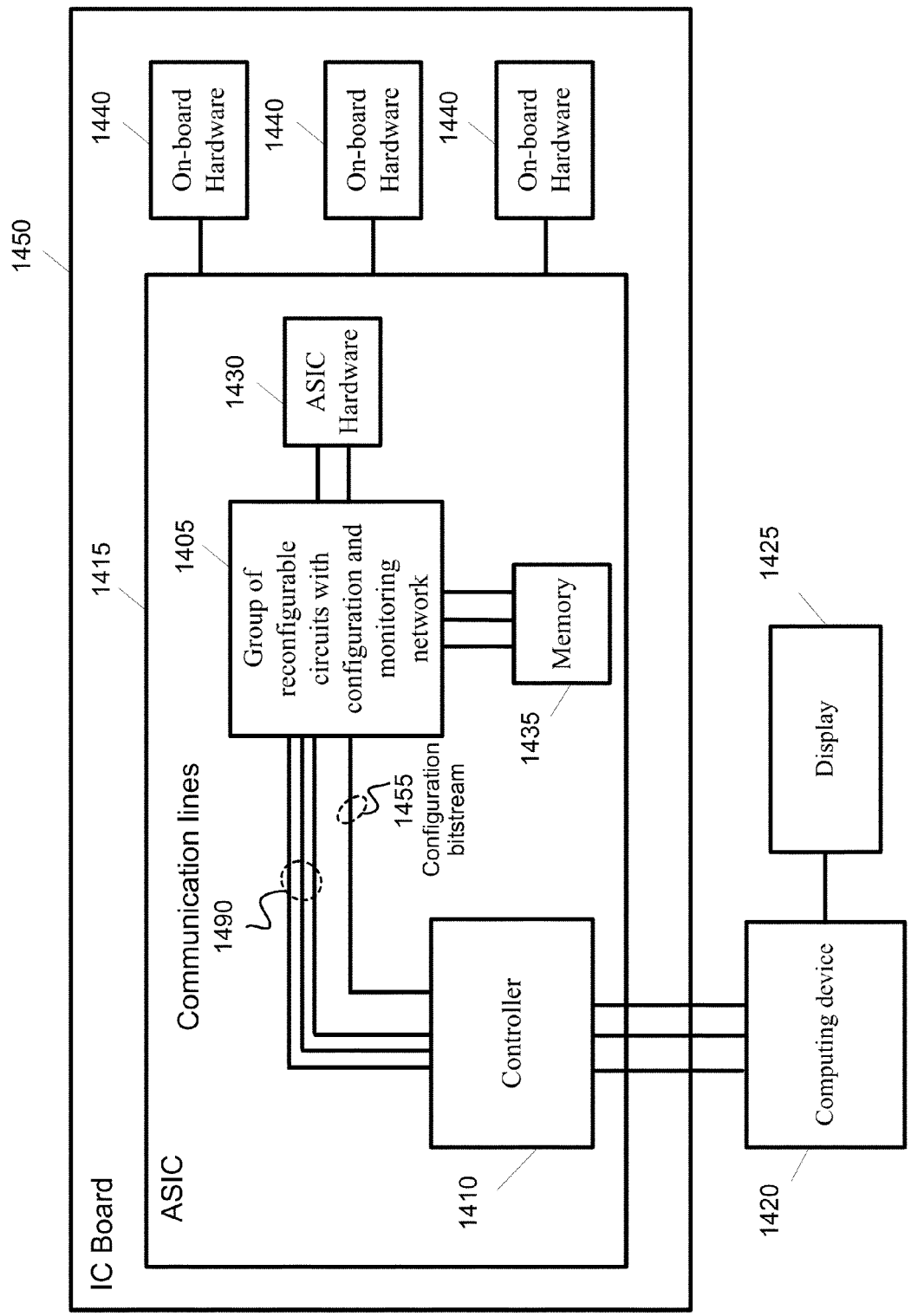
FIG. 14 conceptually illustrates an example of in-the-lab operation mode for an embedded configuration in some embodiments of the invention.

FIG. 14 conceptually illustrates an example of in-the-lab operation mode for an embedded configuration in some embodiments of the invention. In some embodiments, a group of reconfigurable circuits and a configuration and monitoring network are embedded in an IC (such as an ASIC) to do computations as well as inspecting the state and monitoring the other components of the ASIC. In some embodiments, these reconfigurable circuits are not pinned out and are accessible through other components of the ASIC. The ASIC is an IC that is customized for a particular use, rather than intended for general-purpose use. An ASIC is either pre-manufactured for a special application or is custom manufactured, for example by using components from a "building block" library of components, for a particular application.

As shown in FIG. 14, a group of reconfigurable circuits with configuration and monitoring network 1405 is embedded in an IC such as an ASIC 1415. The ASIC is customized for a particular use, rather then intended for general-purpose use.

In this example, the ASIC also includes a controller such as a microprocessor 1410, memory 1435, and other hardware 1430. The ASIC is installed on an IC board 1450, which optionally includes other on-board hardware 1440.

The group of reconfigurable circuits with configuration and monitoring network 1405 participates in operations of the ASIC such as performing mathematical and/or logical operations. In addition, the group of circuits 1405 is utilized to receive configuration overlays that include configuration data for the configuration and monitoring network while the group of circuits 1405 is performing user design operations. Different internal signals of the ASIC as well as signals received from the outside of the ASIC can be connected to the set of reconfigurable circuits for monitoring and debugging purposes.

The ASIC 1415 is connected to a computing device 1420. The computing device is, for example, a desktop or a portable computer that includes either a separate or an integrated display 1425. In this example, the computing device 1420 is connected to the controller 1410 in the ASIC 1415. The computing device 1420 sends overlays that include configuration data for the reconfigurable circuits to the ASIC while the ASIC is performing user design operations. Each overlay corresponds to a view created by a user that specifies an event and the actions to take after the event occurs.

In the example of FIG. 14, the controller 1410 is connected to the reconfigurable circuits 1405. The controller sends the overlays received from the computing device 1420 to the reconfigurable circuits 1405 as a configuration bitstream 1455. Once an event is triggered, the reconfigurable circuits 1405 perform the specified actions and send the results back to the controller 1410 through a set of communication lines 1490. The controller sends the data received from the reconfigurable circuits 1405 to the computing device 1420. In some embodiments, the controller (e.g., a microprocessor) further processes the data and sends the processed data to the computing device 1420. The computing device 1420 further analyzes the received data and/or displays the data on the display 1425.

Figure 15:
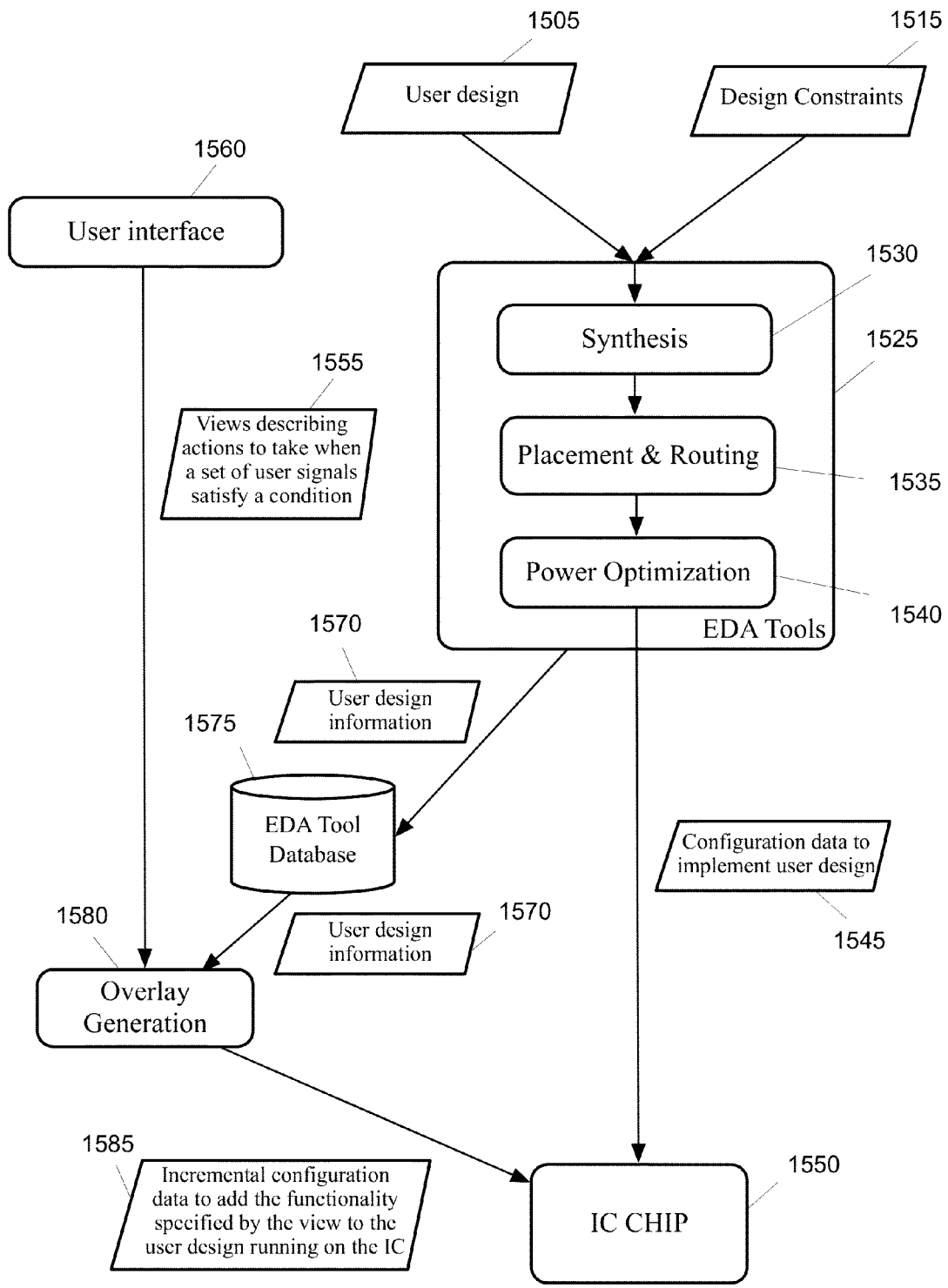
FIG. 15 conceptually illustrates a system for generating and using views in some embodiments of the invention.

FIG. 15 conceptually illustrates a system for generating and using views to debug and monitor operations of an IC in some embodiments of the invention. As shown, a set of electronic design automation (EDA) tools 1525 (e.g., synthesis 1530, placement and routing 1535, power optimization 1540 tools, etc.) is utilized to configure an IC chip 1550 that includes reconfigurable circuits (or the configure the reconfigurable circuits embedded in an ASIC). The user design 1505 (e.g., written as design abstractions in a language such as register transfer language (RTL)) and a set of design constraints 1515 (e.g., written in a language such as Synopsys design constraints SDC) are given as input to EDA tools 1525.

The EDA tools generate configuration data 1545 to implement the user design. The configuration data 1545 is loaded into the IC chip 1550 to configure the configurable circuits of the IC to perform the operations of the user design. As shown, the information 1570 regarding the user design is stored in EDA tool database 1575.

The system of FIG. 15 is also capable of generating and loading incremental configuration data while the IC is performing the operations of the user design and without recompiling or reloading the user design. The overlay generation 1580 receives user design information 1570 and views 1555 (that describe actions to take when a set of user design signals satisfy a condition) and generates incremental configuration data 1585. The views 1555 are generated through a user interface 1560 such as a graphical user interface or a text editor. The incremental configuration data 1585 adds the functionality specified by the view to the user design that is running on the IC without disturbing the user design, (that is, without replacing the configuration data loaded in the IC to perform the user design), and without stopping the operations of the IC when the IC is operating and performing the operations of the user design.

Figure 16A:
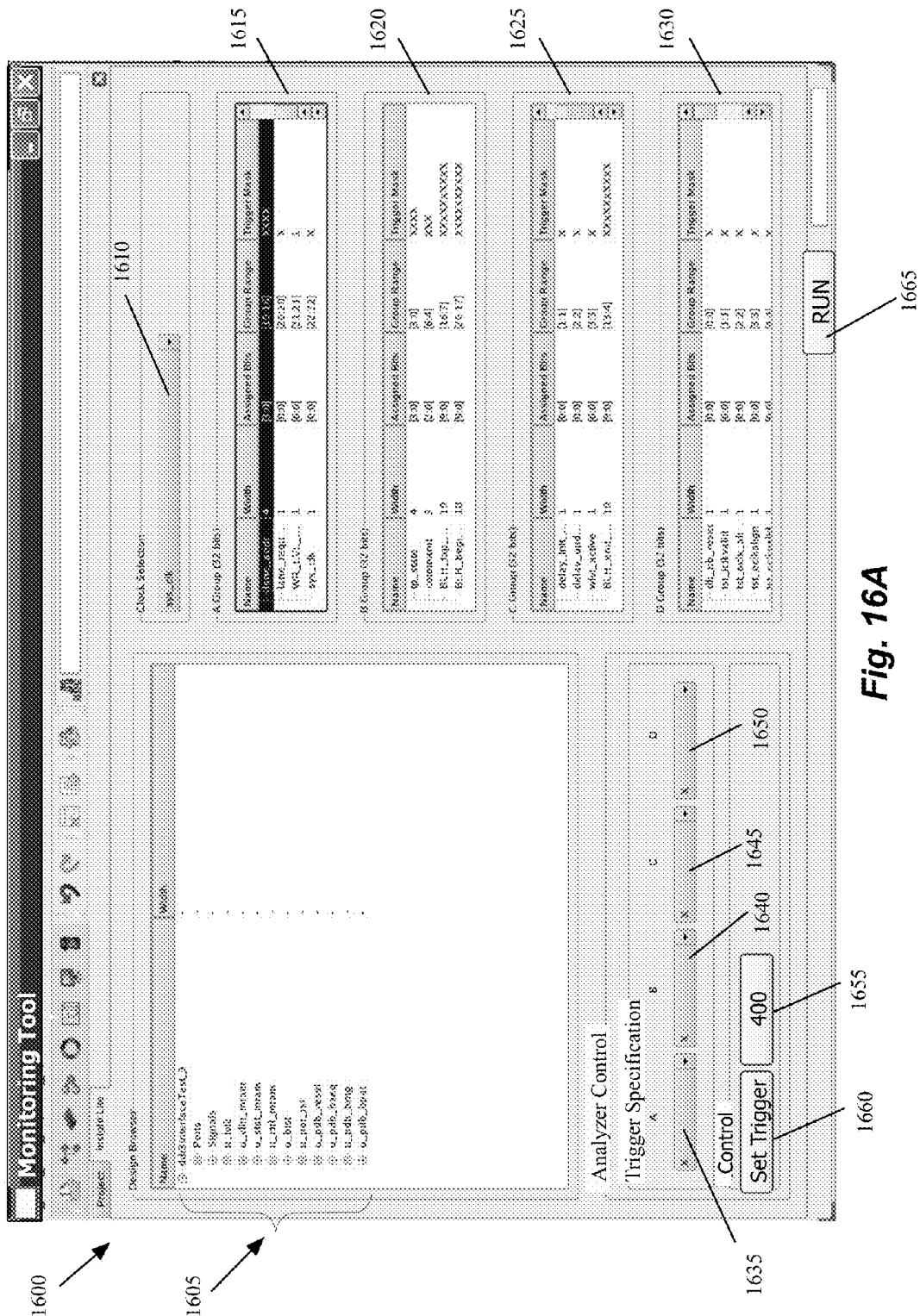
FIGS. 16A and 16B illustrate examples of user interfaces for generating views in some embodiments of the invention.

FIG. 16A illustrates an example of a user interface 1600 for generating views in some embodiments of the invention. In some embodiments, in addition or instead of the user interface 1600, a text editor is used to generate the views. As shown in FIG. 16A, the user interface includes a design browser that displays a list 1605 of user design signals. The user design signals are the signals specified in the user design. These signals may not correspond to actual signals on the IC fabric due to optimization and/or rescaling operations. As described above by reference to FIGS. 9-10, the user signals are reconstructed from the signals on the IC fabric. In some embodiments, each user signals is conceptually represented as a node in a hierarchical tree that shows how the signal is built from other signals (which are also shown as other nodes of the hierarchical tree) in the user design.

The user interface 1600 may provide a tool 1610 for clock selection. The user interface also provides tools 1635-1650 for specifying triggering events and a tool 1660 for setting the trigger delays 1655. The signals for each trigger specification 1635-1650 are selected from the hierarchical list of signals 1605 and included in the corresponding group of signals 1615-1630. For instance, when a user navigates through the list of signals 1605 and identifies one of the signals for a view (e.g., by activating a user selection device such as a mouse button), a pop up menu is displayed that allows the user to identify the trigger (1635-1650) and the function (e.g., one of the functions for the conditional sentence of the view) to apply to the selected signal. The selected signal is then displayed in one of the groups 1615-1630 that corresponds to the selected trigger. The user then repeats the same process by selecting the next signal for the same or a different triggering event. In some embodiments, a view is expressed as a conditional sentence. Views are used, e.g., for assertion and alert checking such as:

when (top.tcpflow21.state==RUNNING) traceToSerDes top.tcpflow21.state

This view indicates that the value of the signal top.tcpflow21.state has to be monitored and when the value is equal to the predefined value RUNNING, the values of the signal has to be traced to a SerDes transceiver.

Another example of a view used for assertion and alert checking is:

when (top.sourceip!=top.watchlist) traceToSerDes top.sourceip

This view indicates that the value of the signal top.sourceip has to be monitored and when the value is not equal to the value of top.watchlist signal, the top.source signal has to be traced to SerDes.

Another examples for the use of views is to track packets. For example:

when (top.sourceip==top.watchedip) traceToDRAM top.packetpayload

This view indicates that the value of top.sourceip (e.g., the packet identification) has to be monitored and when the value is equal to top.watchedip (e.g., a desired packet identification), top.packetpayload (e.g., the packet payload) has to be stored in DRAM.

when (top.traffictype=="video") traceToSerDes top.pack-
etpayload

This view indicates that top.traffictype (e.g., the type of a received packet) has to be monitored and the value indicates "video", top.packetpayload (e.g., the video stream) has to be traced to SerDes.

Once the user defines an event by selecting the signals to trigger the event and to trace the data, the user selects a control 1665 to generate an overlay and to load the overlay into the part (e.g., into the IC 1305 in FIG. 13 or the group of reconfigurable circuits 1405 in FIG. 14). Once the results are received from the part, a waveform viewer is launched to show the received data in real-time. Some embodiments run overlays on the part one at a time.

Figure 16B:
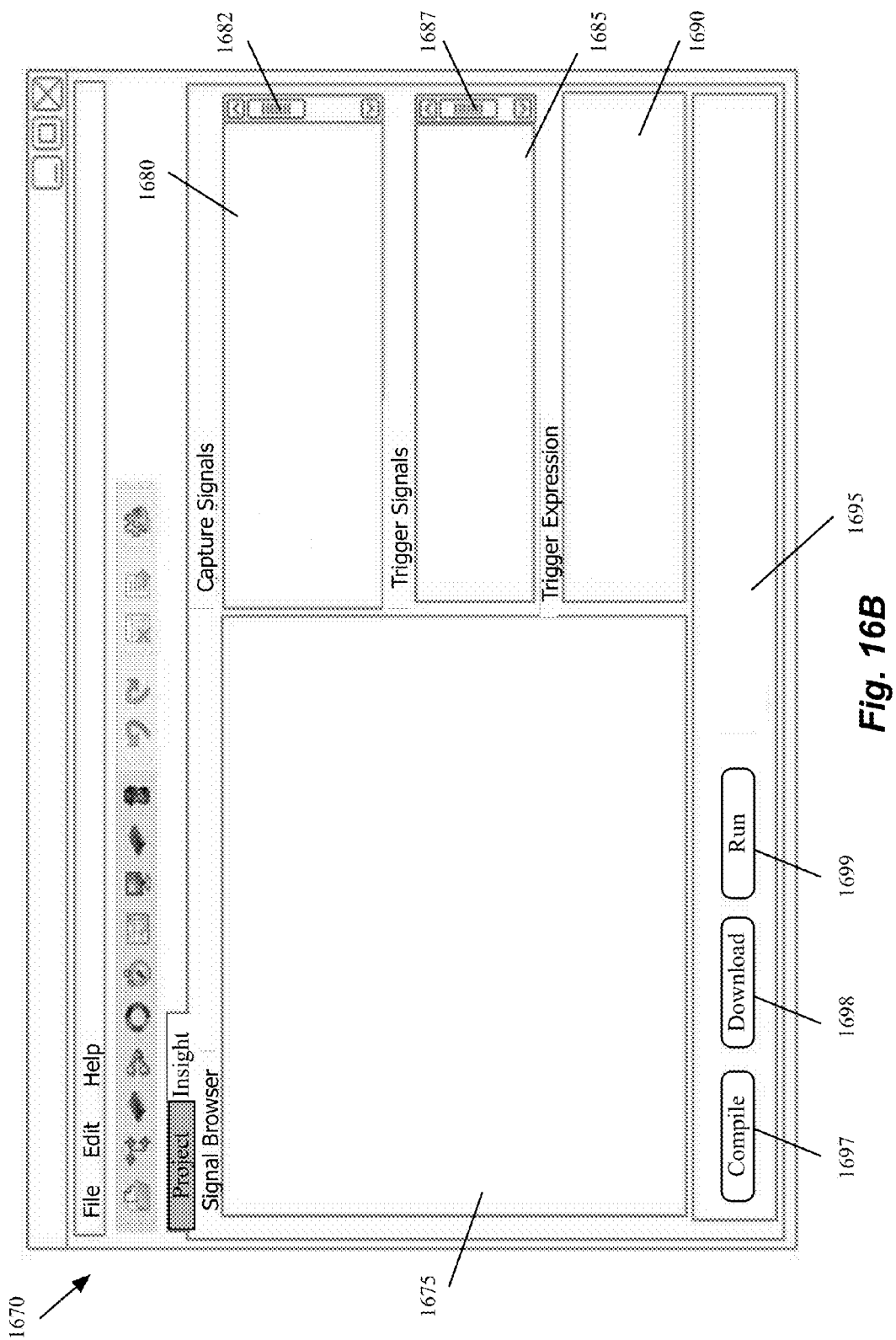

FIG. 16B illustrates another example of a user interface 1670 for generating views in some embodiments of the invention. As shown, the user interface includes a signal browser display area 1675 that displays a list of user design signals. The user design signals are the signals specified in the user design. These signals may not correspond to actual signals on the IC fabric due to optimization and/or rescaling operations. In some embodiments, each user signals is conceptually represented as a node in a hierarchical tree that shows how the signal is built from other signals (which are also shown as other nodes of the hierarchical tree) in the user design. As described above by reference to FIGS. 9-10, the user signals are reconstructed from the signals on the IC fabric.

The user Interface 1670 also includes a display area 1680 for displaying the list of selected signals for views. The user interface also includes a display area 1685 for displaying a list of selected trigger signals. The information in display areas 1680 and 1685 can be scrolled up and down by using the scrolling controls 1682 and 1687, respectively.

The user interface also provides a list 1695 of control buttons that are selectable or greyed out as necessary. In the example of FIG. 16B, the control buttons include a control 1697 to compile views to create incremental configuration data, a control 1698 to download the incremental configuration data into the IC (e.g., while the IC is running), and a control 1699 to start communicating with the IC.

Figure 17:
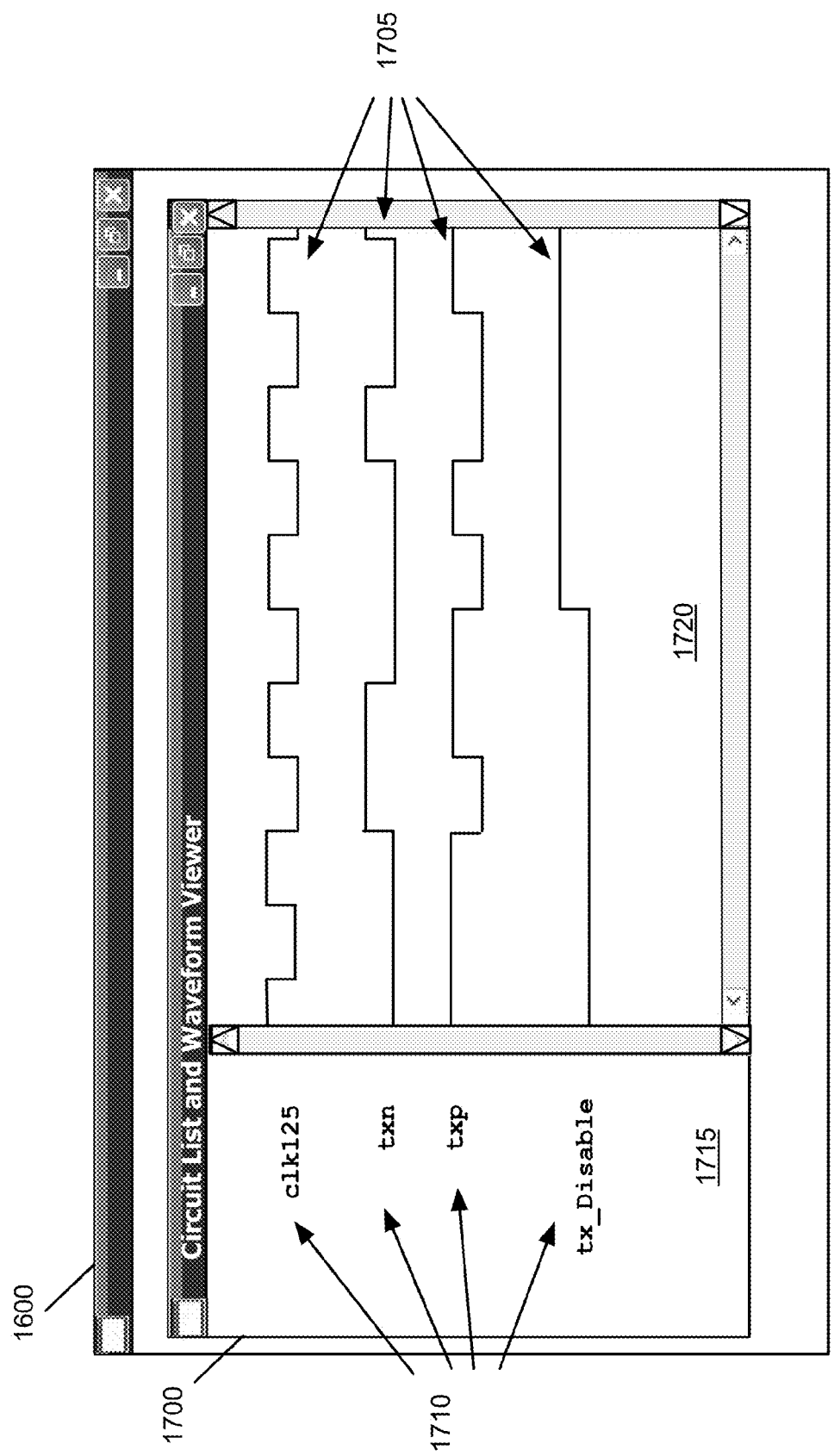
FIG. 17 conceptually illustrates a waveform viewer launched to display waveform representation of signals being traced after an event specified in a view is triggered in some embodiments of the invention.

FIG. 17 conceptually illustrates a waveform viewer 1700 launched to display waveform representation of signals being traced after an event specified in a view is triggered in some embodiments of the invention. The waveform viewer 1700 in some embodiments is displayed as a window in the user interface 1600 of FIG. 16A or the user interface 1670 of FIG. 16B. In other embodiments, the waveform viewer is launched as a separate window.

As shown, the waveform viewer includes a display area 1715 for displaying signal names 1710 that were identified in the view to be traced after an event occurs. The waveform viewer includes another display area 1720 to display the waveforms 1705 associated with the traced signals. In some embodiments, the data received from the part is converted to an ASCII-based value change dump (VCD) format and passed to the viewer. In other embodiments, the waveform viewer uses a different data format to display the signal waveforms.

The user interfaces of FIGS. 16A, 16B, and 17 allow graphical interactive selection of user design signals, incremental generation and download of bitstream, receiving of data after events are triggered, and display of the results. Data received from the IC after an event is triggered is translated into user design signals if necessary prior to displaying the results.

Figure 18:
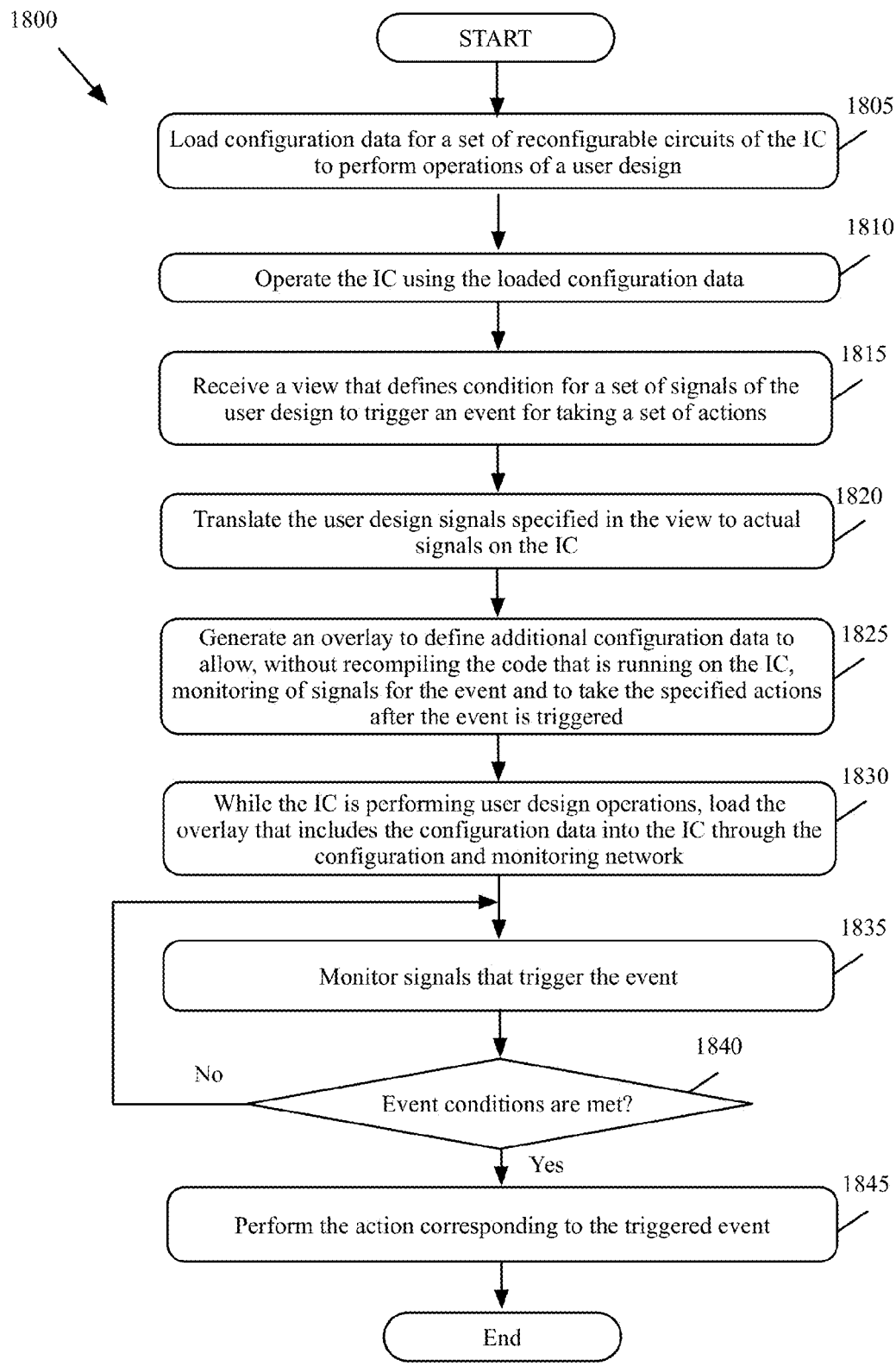
FIG. 18 conceptually illustrates a process for using views in a lab environment in some embodiments of the invention.

FIG. 18 conceptually illustrates a process 1800 for using views in a lab environment in some embodiments of the invention. As shown, the process loads (at 1805) configuration data for a set of reconfigurable circuits of the IC to perform operations of a user design. The set of reconfigurable circuits are, instance, a part of the IC 1305 shown in FIG. 13 or the reconfigurable circuits 1405 embedded in the ASIC 1415 shown in FIG. 14.

The process then operates (at 1810) the IC using the loaded configuration data. The process then receives (at 1815) a view that defines a set of condition for a set of user design signals to trigger an event for taking a set of actions. For instance, the process receives a view when a user uses the user interface 1600 or uses an editor to define a view.

The process then translates (at 1820) the user design signals specified in the view to actual signals on the IC. For instance, the process translates the user signals to actual signals using the reconstruction circuits defined by reference to FIGS. 9 and 10, above. The process then generates (at 1825) an incremental overlay to define additional configuration data to allow, without recompiling the code that is running on the IC, monitoring of signals for the event and to take the specified actions after the event is triggered.

Next, while the IC is performing user design operations and without stopping the operations of the IC or replacing the configuration data that is loaded in the IC, the process loads (at 1830) the incremental overlay that includes the configuration data into the IC through the configuration and monitoring network. The process then monitors (at 1835) the signals that trigger the event while the IC is still performing the operations of the user design based on the configuration data loaded in the IC in operation 1805.

The process then determines (at 1840) whether the event conditions are satisfied. If not, the process proceeds back to 1835 to continue monitoring the signals. Otherwise, the process performs (at 1845) the actions specified in the view while the IC is still performing the operations of the user design. The process then ends.

B. In-the-Field Operation Mode

Figure 19:
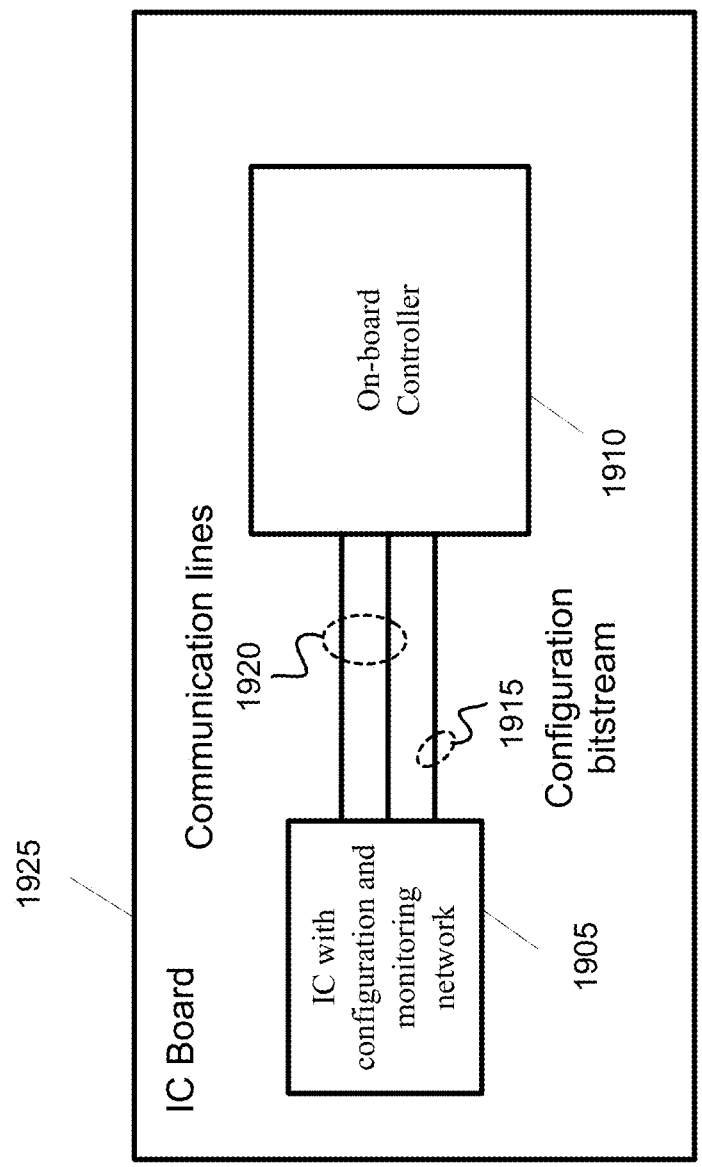
FIG. 19 conceptually illustrates a localized in-the-field configuration of an IC in some embodiments of the invention.

FIG. 19 conceptually illustrates a localized in-the-field configuration of an IC in some embodiments of the invention. As shown, an on-board controller such as a microprocessor 1910 and an IC 1905 with configuration and monitoring network are included on an IC board 1925. Other components of the IC board (if any) are not shown for simplicity.

The on-board controller 1910 stores (or retrieves from onboard memory) different overlays corresponding to different views. The on-board controller receives data from the IC 1905 through a set of communication lines 1920. Depending on the data received, the controller loads an incremental configuration bitstream 1915 corresponding to one of the stored overlays into the IC. The on-board controller in some embodiments is programmed to load different overlays based on the data received from the IC 1905. The on-board controller stores a set of overlays and autonomously determines which overlay (if any) to load into the IC without any interaction with outside the IC board.

Figure 20A:
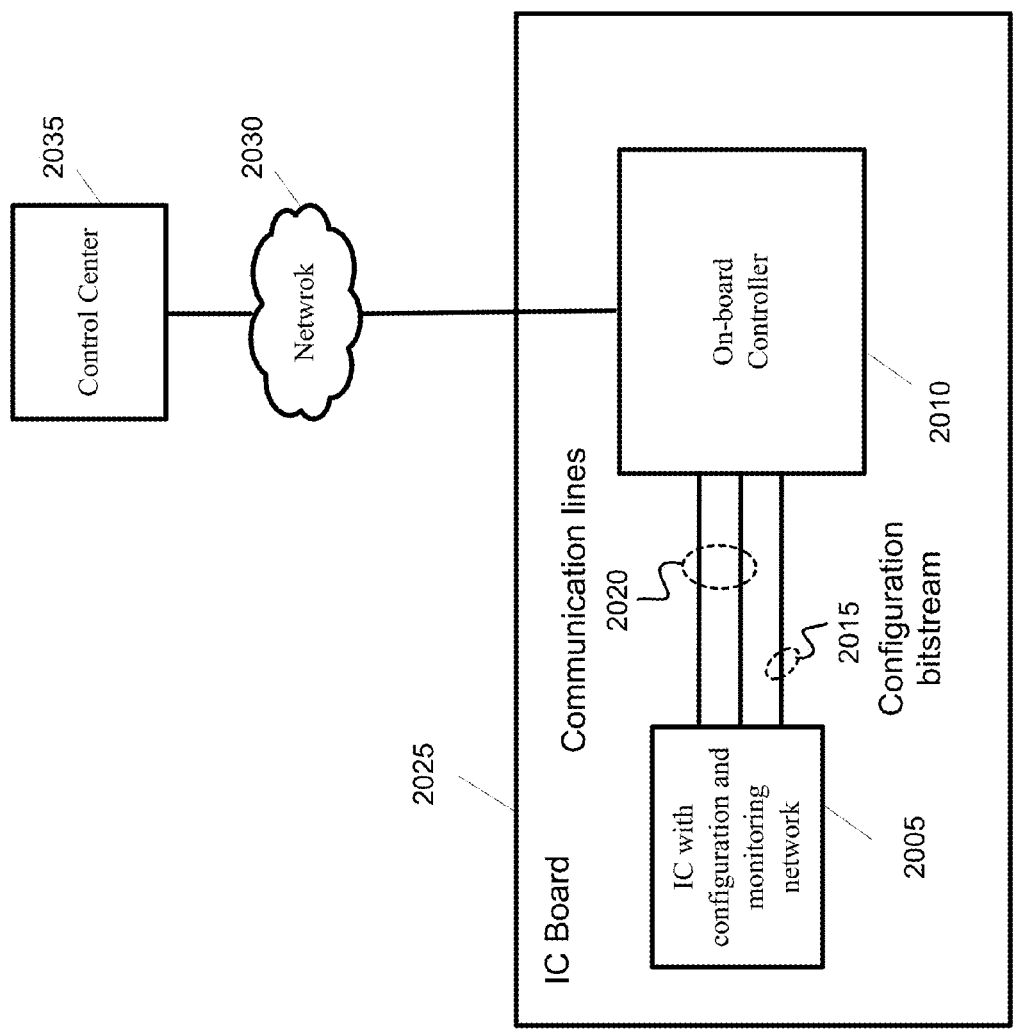
FIG. 20A conceptually illustrates an extended in-the-field configuration of an IC in some embodiments of the invention.

FIG. 20A conceptually illustrates an extended in-the-field configuration of an IC in some embodiments of the invention. As shown, the IC board 2025 in FIG. 20A has similar configuration as the IC board 1925 in FIG. 19, except the on-board controller 2010 in FIG. 20A also communicates with a control center 2035 through a network 2030 such as the Internet. The control center is, for instance, a computing device with a user interface. The on-board controller 2010 sends the data received from the IC to the control center 2035 and receives overlays with incremental configuration data to load into the IC 2005.

Figure 20B:
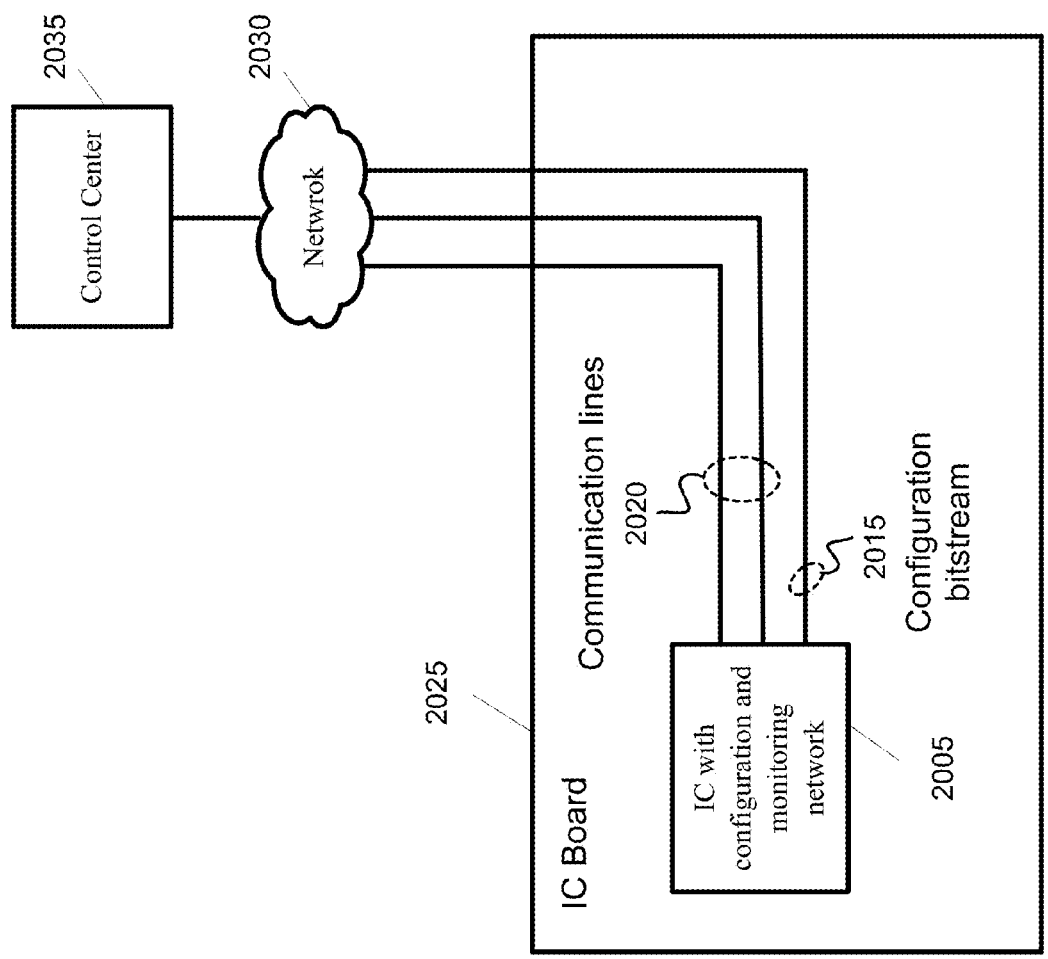
FIG. 20B conceptually illustrates an extended in-the-field configuration of an IC in some embodiments of the invention.

FIG. 20B conceptually illustrates an extended in-the-field configuration of an IC in some embodiments of the invention. As shown in FIG. 20B, the IC 2005 on the IC board 2025 communicates with the control center 2035 through the network 2030 such as the Internet without going through an on-board controller. The IC 2005 sends data to the control center 2035 through communication line 2020 and receives overlays as bitstreams 2015 to load.

Figure 21:
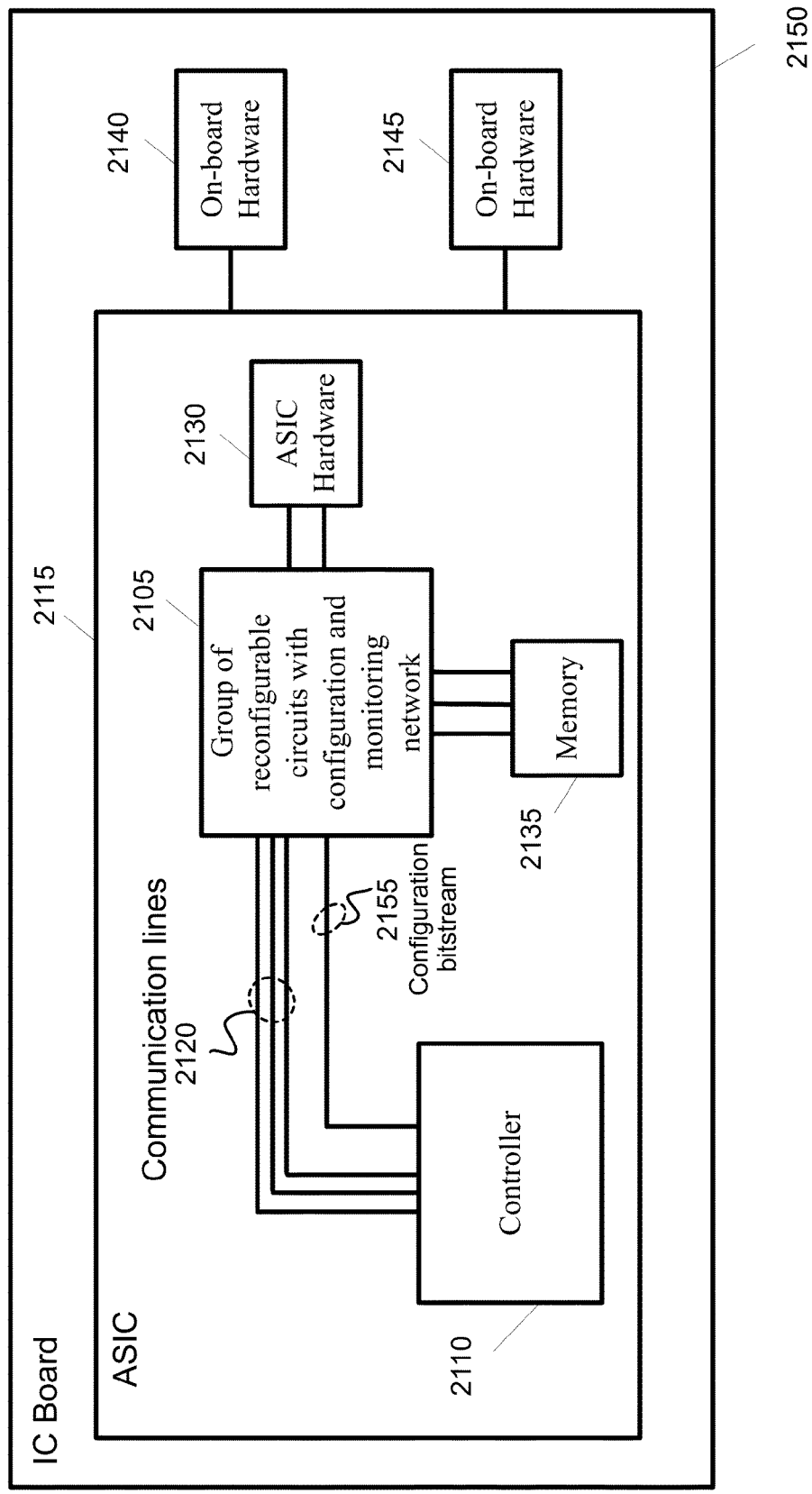
FIG. 21 conceptually illustrates a localized in-the-field configuration of an embedded configuration of some embodiments of the invention.

FIG. 21 conceptually illustrates a localized in-the-field configuration of an embedded configuration of some embodiments of the invention. As shown, a group of reconfigurable circuits with a configuration and monitoring network 2105 is embedded in an IC such as an ASIC 2115. In this example, the ASIC also includes a controller such as a microprocessor 2110, memory 2135, and other hardware 2130. The ASIC is installed on an IC board 2150, which optionally includes other on-board hardware 2140-2145.

The controller 2110 stores (or retrieves from memory 2135) different overlays corresponding to different views. The controller receives data from the group of reconfigurable circuits 2105 through a set of communication lines 2120. Depending on the data received, the controller loads an incremental configuration bitstream 2155 corresponding to one of the stored overlays. The controller 2110 in some embodiments is programmed to load different overlays based on the data received from the group of reconfigurable circuits 2105. The controller 2110 stores a set of overlays and autonomously determines which overlay (if any) to load into the IC without any interaction with outside the IC board. Different internal signals of the ASIC as well as signals received from the outside of the ASIC can be connected to the set of reconfigurable circuits for monitoring and debugging purposes.

In some embodiments, another on-board hardware 2145 acts as a controller to store the overlays to load into the group of reconfigurable circuits. In these embodiments, the on-board controller 2145 (e.g., a microprocessor) stores the overlays and sends them to the controller 2110 in the ASIC in order to load into the group of reconfigurable circuits 2105. The on-board controller 2145 receives data from the group of reconfigurable circuits 2105 through the controller 2110. Depending on the data received, the controller 2145 sends a configuration bitstream corresponding to one of the stored overlays to the ASIC to load into the group of reconfigurable circuits 2105.

Figure 22:
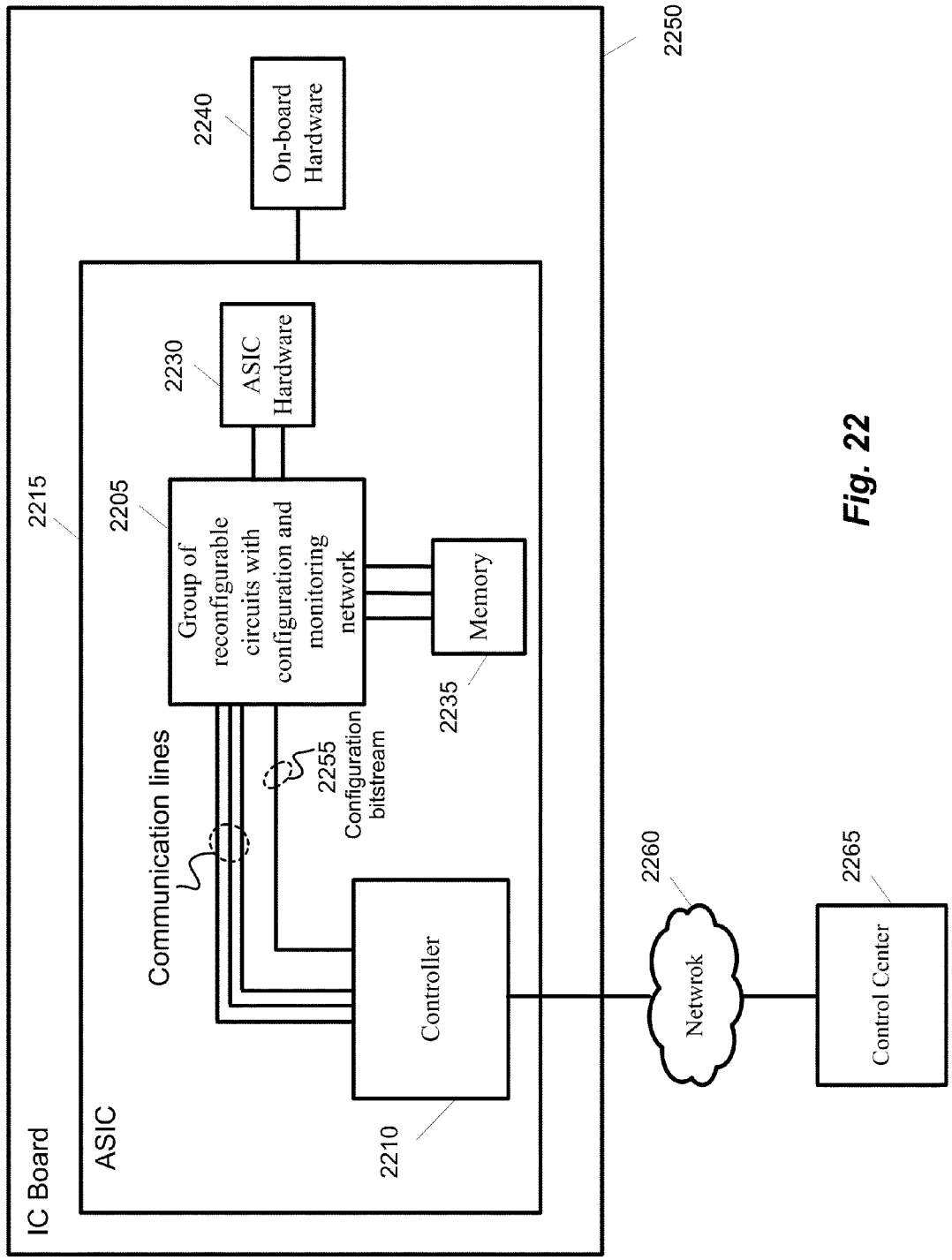
FIG. 22 conceptually illustrates an extended in-the-field configuration of an embedded configuration of some embodiments of the invention.

FIG. 22 conceptually illustrates an extended in-the-field configuration of an embedded configuration of some embodiments of the invention. As shown, the IC board 2250 in FIG. 22 has similar configuration as the IC board 2150 in FIG. 21, except the controller 2210 in FIG. 22 also communicates with a control center 2265 through a network 2260 such as the Internet. The control center is, for instance, a computing device with a user interface. The controller 2210 sends the data received from the IC to the control center 2265 and receives overlays to load into the group of reconfigurable circuits 2205.

Figure 35:
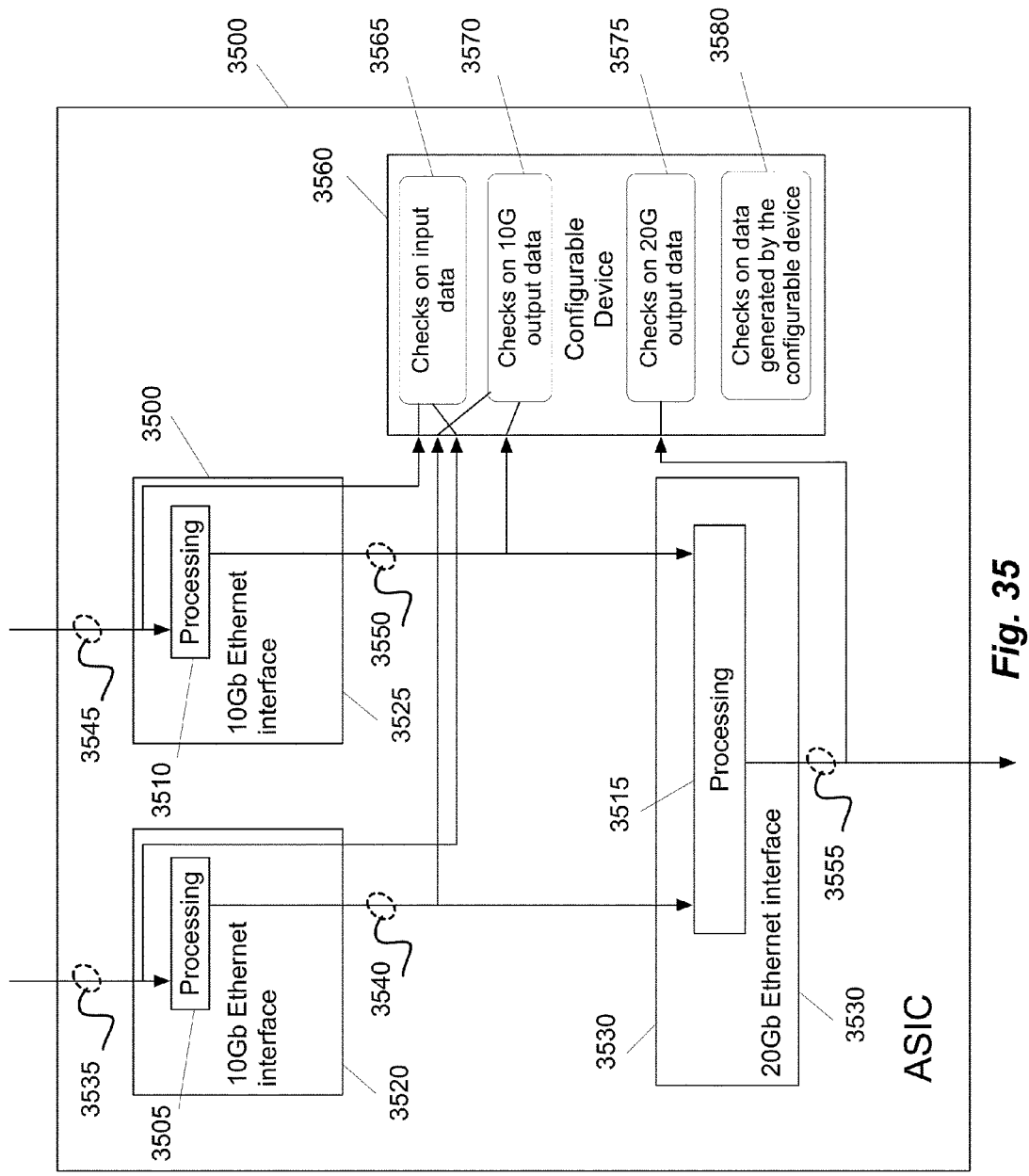
FIG. 35 conceptually illustrates an ASIC with a configurable device in some embodiments of the invention.

FIG. 35 conceptually illustrates an ASIC with a configurable device in some embodiments of the invention. In the example of FIG. 35, the ASIC 3500 includes several custom-made processing units 3505-3515 and Ethernet interfaces 3520-3530. Processing unit 3505 receives data from input line 3535, processes the data, and sends output data through output line 3540 to processing unit 3515 using the 10 GB Ethernet interface 3520. Similarly, processing unit 3510 receives data from input line 3545, processes the data, and sends output data through output line 3550 to processing unit 3515 using the 10 GB Ethernet interface 3525. Processing unit 3515 processes the received data and outputs data on the output line 3555 using the 20 Gb Ethernet interface 3530.

As shown, the ASIC also includes a configurable device 3560. For example, the configurable device includes a group of reconfigurable circuits and a configuration and monitoring network as described by reference to FIGS. 14, 21, and 22, above. The configurable device is embedded in the ASIC. In this example, the reconfigurable circuits of the configurable device 3560 are not pinned out and are accessible through other components of the ASIC.

The configurable device includes a group of circuits 3565 that monitors input data lines 3535 and 3545, a group of circuits 3570 that monitors output lines 3540 and 3550 of the 10 Gb Ethernet interfaces, a group of circuits that monitors output line 3555 of the 20 Gb Ethernet interface, and a group of circuits 3580 that checks data generated by configurable device 3580. As described by reference to FIGS. 14, 21, and 22, configurable device receives incremental configuration data corresponding to different views from and provides data to other components of the ASIC (not shown for simplicity). The ASIC can be designed in a way that any data line that needs to be monitored can be connected to the configurable device. The configurable device can then be programmed during the operation of the ASIC to receive incremental configuration data corresponding to different views without disturbing the operations of the ASIC, monitor the specified signals, and take action once a triggering event occurs. In addition to monitoring and debugging operations, the reconfigurable circuits of the embedded configurable device 3560 can receive configuration data sets and configurably perform operations of a user design based on the received configuration data sets.

Figure 23:
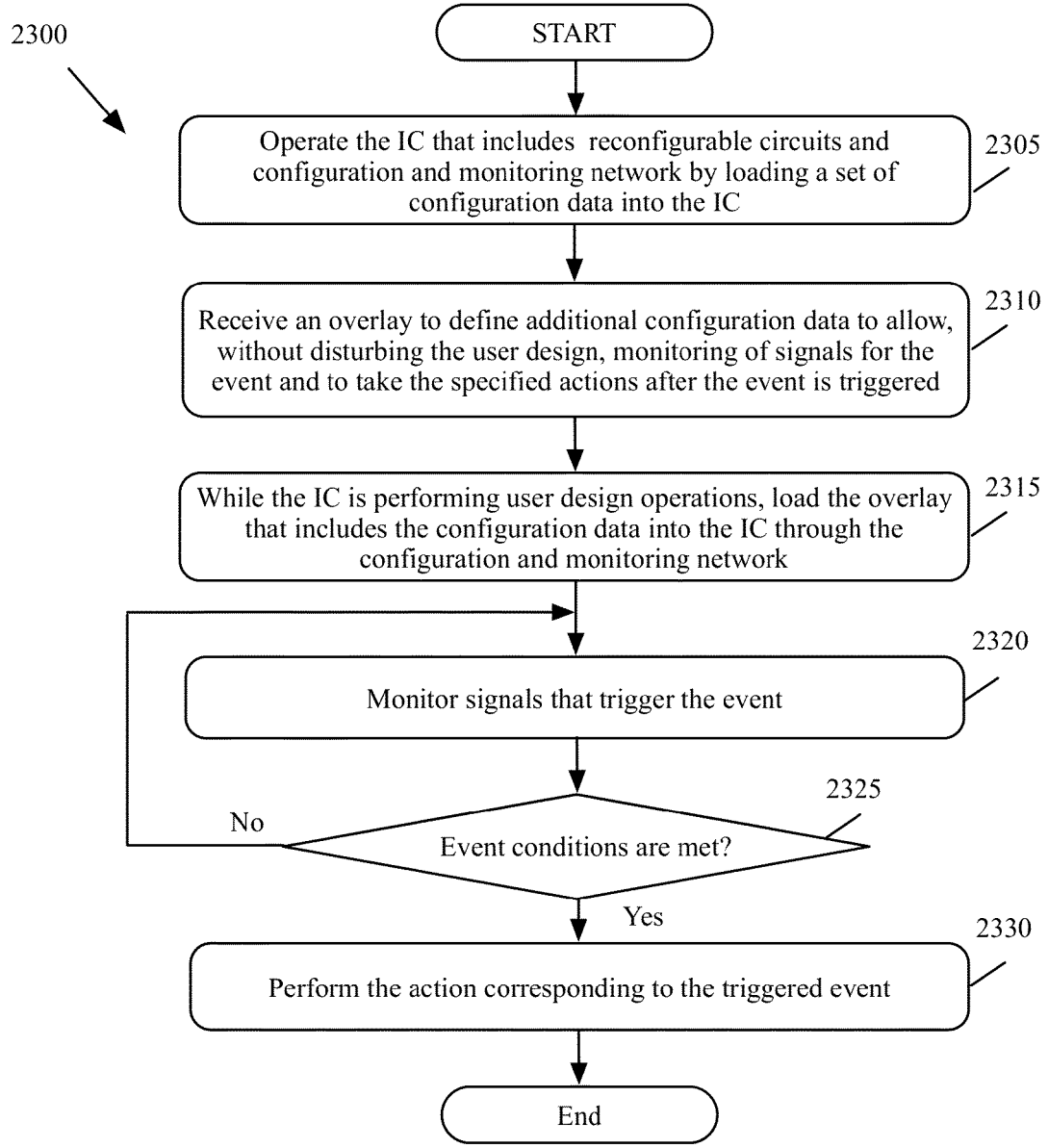
FIG. 23 conceptually illustrates a process for operating an IC in the field in some embodiments of the invention.

FIG. 23 conceptually illustrates a process 2300 for operating an IC in the field in some embodiments of the invention. As shown, the process operates (at 2305) the IC by loading a set of configuration data into the IC. The IC in some embodiments is an IC with a set of reconfigurable circuits and a configuration and monitoring network such as ICs 1905 and 2005 shown in FIGS. 19, 20A, and 20B. The IC in other embodiments is an IC such as ASICs 2115, 2215, and 3500 shown in FIGS. 21, 22, and 35, respectively. These ICs include a group of reconfigurable circuits 2105, 2205, and 3560 with configuration and monitoring network. In some embodiments, the configuration data is in permanent memory such as flash memory in the same IC board and is loaded into the IC upon power up.

Process 2300 then receives (at 2310) an overlay with an additional configuration data to allow, without disturbing the user design that is running on the IC, monitoring of signals for the event and to take the specified actions after the event is triggered. The overlay is generated based on a user-defined view. The process receives the overlays either from on-board controllers (such as on-board controllers 1910 or 2010 in FIGS. 19 and 20A, respectively), in-the-chip controllers (such as controller 2110 in ASIC 2115 in FIG. 21 or controller 2210 in ASIC 2215 in FIG. 22), or a remote control center (such as control center 2035 in FIG. 20B).

Next, while the IC is performing user design operations and without stopping the operations of the IC, the process loads (at 2315) the overlay that includes the configuration data into the IC through the configuration and monitoring network. The process then monitors (at 2320) the signals that trigger the event. The process then determines (at 2325) whether the event conditions are satisfied. If not, the process proceeds back to 2320 to continue monitoring the signals. Otherwise, the process performs (at 2330) the actions that correspond to the triggered event while the IC is still performing the operations of the user design. The process then ends.

C. Triggering Events and Taking Actions Using Views

Figure 24:
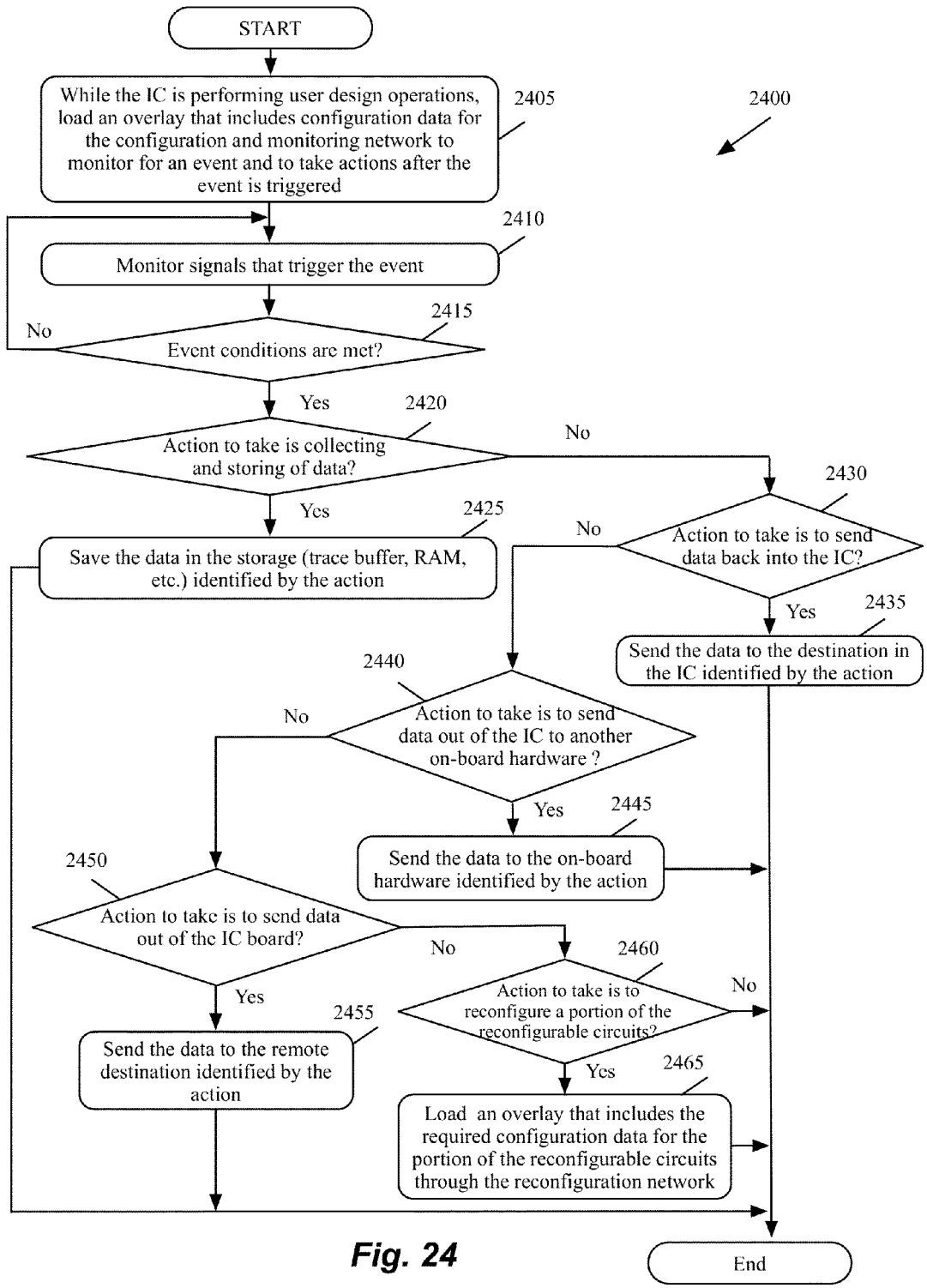
FIG. 24 conceptually illustrates a process for triggering events and taking actions defined by a view in some embodiments of the invention.

FIG. 24 conceptually illustrates a process 2400 for triggering events and taking actions defined by a view in some embodiments of the invention. The process loads (at 2405), while the IC is performing user design operations, an overlay that includes configuration data for the configuration and monitoring network to monitor for an event and to take actions after the event is triggered. The overlay has been generated from a user-defined view that specified the conditions to trigger the event and the actions to take after the event is triggered.

The process then monitors (at 2410) the signals that trigger the event. The process then determines (at 2415) whether the event conditions are met. If not, the process proceeds back to 2410 to continue monitoring the signals. Otherwise, when the trigger conditions are met, the process determines (at 2420) whether the action to take is collecting and storing of data. If yes, the process collects data and saves (at 2425) the data in storage such as trace buffer, DRAM, etc., as specified for the action. The process then ends.

Otherwise, the process determines (at 2430) whether the action to take is to send data back into the IC. If yes, the process (at 2435) sends the identified data to the destination in the IC as defined by the action. For instance the process sends a predetermined value or the sampled value of a signal to a particular register or a particular input of a component in the IC. The process then ends.

Otherwise, the process determines (at 2440) whether the action to take is to send data out of the IC to another on-board hardware. If yes, the process sends (at 2445) the data to the on-board hardware identified by the action. For instance the process uses a SerDes to send the identified data to an identified port in the IC. The process then ends.

Otherwise, the process determines (at 2450) whether the action is to send data out of the IC board. If yes, the process sends (at 2455) the data to the remote destination identified by the action. For instance the process uses SerDes to send the identified data to a receiver process outside the IC board. The process then ends.

Otherwise, the process determines (at 2460) whether the action is to reconfigure a portion of the configurable circuits in the IC or to halt the IC. If not, the process ends.

Otherwise, the process loads (at 2465) an overlay that includes the required configuration data for the portion of the configurable circuits through the reconfiguration network (or if the action is to halt the IC, the process triggers a signal to halt the IC). The process then ends.

IV. EXAMPLES OF THE USE OF VIEWS AND OVERLAYS

A. Root Fault Cause Analysis

Figure 25:
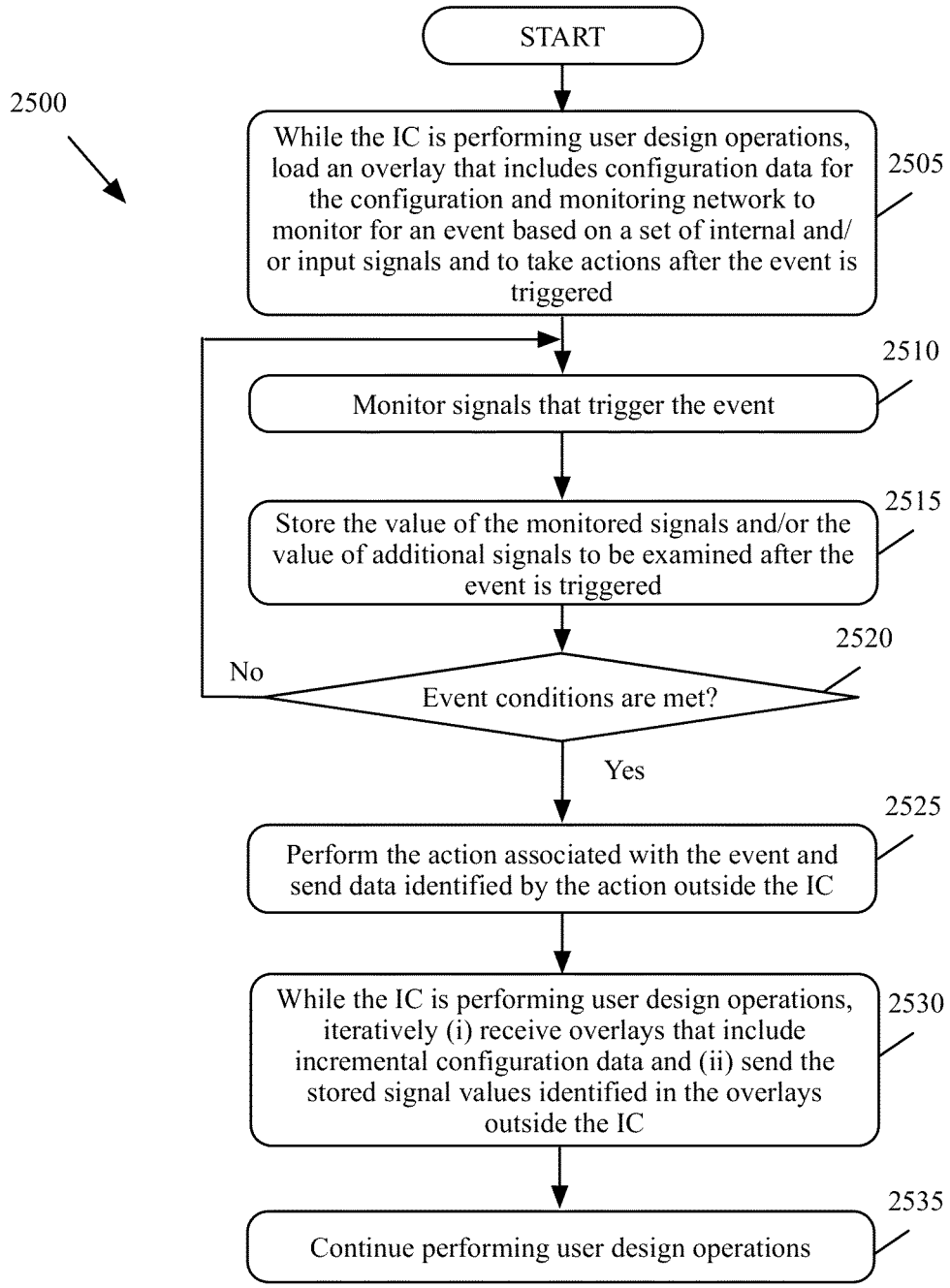
FIG. 25 conceptually illustrates a process for performing root cause analysis in some embodiments of the invention.

FIG. 25 conceptually illustrates a process 2500 for performing root cause analysis in some embodiments of the invention. Process 2500 is performed by an IC that includes reconfigurable circuits and a configuration and monitoring network in some embodiments. As shown, the process loads (at 2505), while the IC is performing user design operations, an overlay that includes configuration data for the configuration and monitoring network to monitor for an event based on a set of internal and/or input signals and to take actions after the event is triggered.

The process then monitors (at 2510) the signals that trigger the event. The process stores (at 2515) the values of the monitored signals and/or the value of additional signals to be examined after the event is triggered. The process then determines (at 2520) whether the event conditions are met. If not, the process proceeds to 2510 to continue monitor the signals and store the specified values.

Otherwise, the process performs (at 2525) the actions associated with the event such as sending the data identified by the action outside the IC. While the IC is performing user design operations and without stopping the operations of the IC, the process then iteratively (i) receives (at 2530) overlays that include incremental configuration data and (ii) sends (at 2530) the stored signal values identified in each overlay outside the IC. The process then continues performing (at 2535) user design operations.

Figure 26:
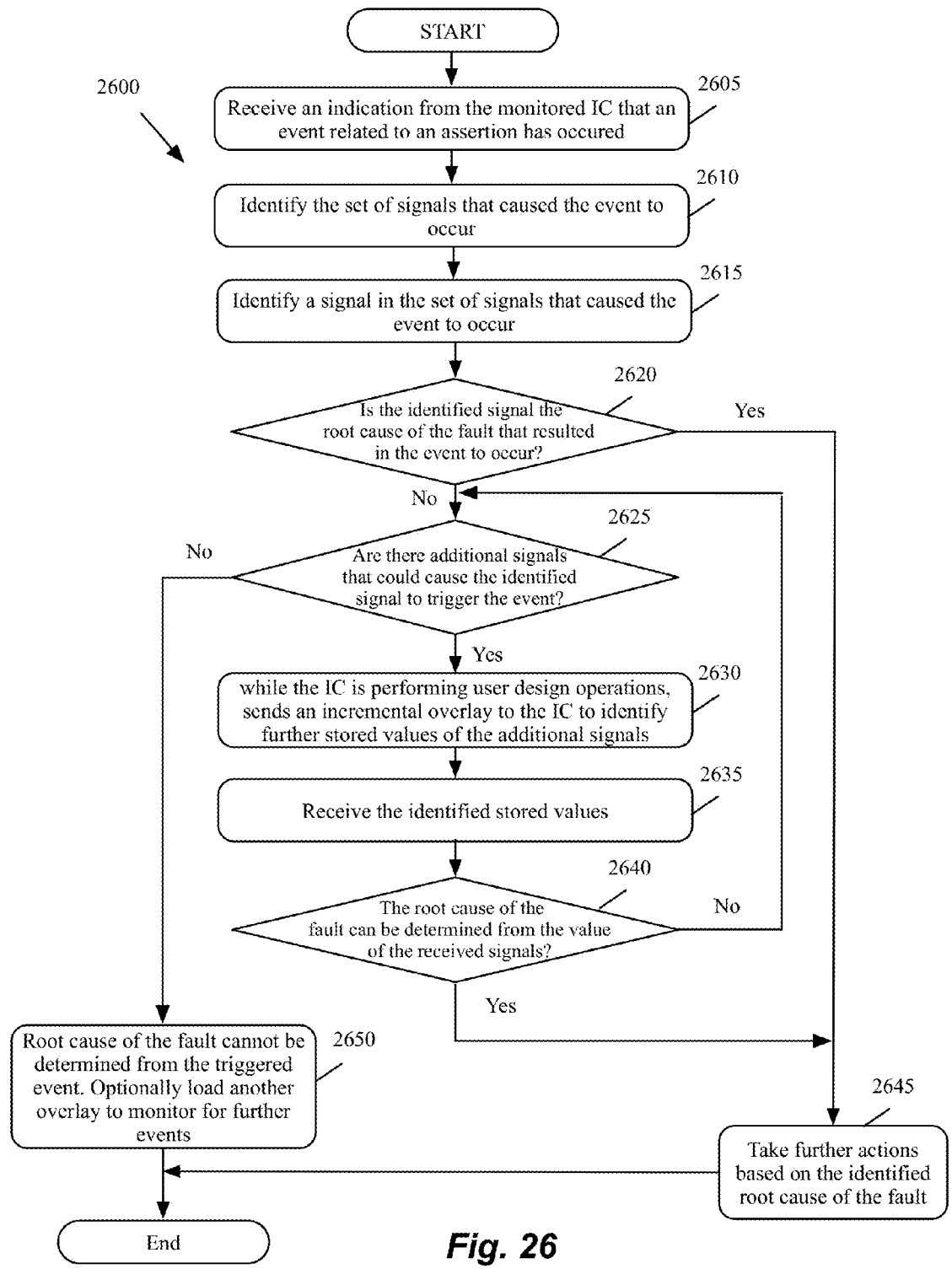
FIG. 26 conceptually illustrates a process for performing root cause analysis in some embodiments of the invention.

FIG. 26 conceptually illustrates a process 2600 for performing root cause analysis in some embodiments of the invention. Process 2600 is performed by a controller outside the IC in some embodiments. As shown, the process receives (at 2605) an indication from the monitored IC that an event related to an assertion has occurred. The process then identifies (at 2610) the set of signals that caused the event to occur. A simple example of root cause analysis is the following. When an incorrect value appears at the output "f" of the logic operation "f=a&b", the next step is to check if either "a" or "b" is at fault, and keep going back (if a and b are results of other logic operations) until what is considered to be the root of the problem is found.

The process then identifies (at 2615) a signal in the set of signals that caused the event to occur. The process then determines (at 2620) whether the identified signal is the root cause of the fault that resulted in the event to occur. If yes, the process has identified the root cause of the fault. The process takes (at 2645) further actions based on the identified root cause of the fault. The process then ends. Otherwise, the process determines (at 2625) whether there are additional signals that could cause the identified signal to trigger the event. If not, the process cannot identify the root cause of the current fault. The process optionally loads (at 2650) another overlay to monitor for further events. The process then ends.

Otherwise, while the IC is performing user design operations, the process sends (at 2630) an incremental overlay to the IC to identify further stored values of the additional signals. The process then receives (at 2635) the identified stored values. The process then determines (at 2640) whether the root cause of the fault can be determined from the value of the received signals. If yes, the process proceeds to 2645, which was described above. Otherwise, the process proceeds to 2625 to continue the attempt to identify the root cause of the fault.

B. In-the-Field Fault Injection

Fault injection is a technique regularly used to test how complex systems, such as ICs, react to unforeseen circumstances such as unexpected or out-of-range inputs, or physical failures of the components, for instance due to normal wear and tear.

Figure 27:
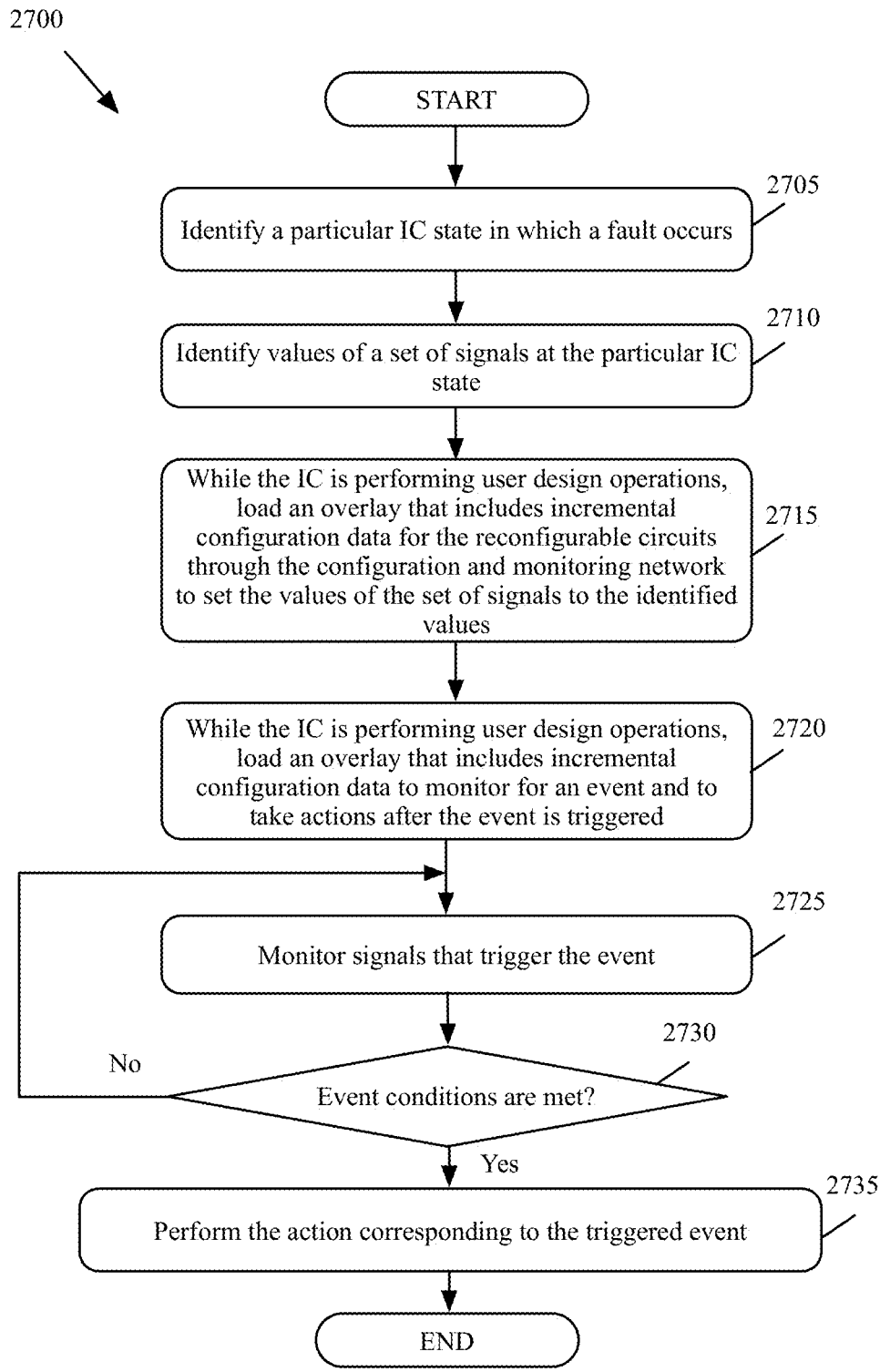
FIG. 27 conceptually illustrates a process for performing in-the-field fault injection in some embodiments of the invention.

FIG. 27 conceptually illustrates a process 2700 for performing in-the-field fault injection in some embodiments of the invention. As shown, the process identifies (at 2705) a particular user design state which is considered to be faulty. The process then identifies (at 2710) the values of a set of signals at the particular IC state.

The process then loads (at 2715), while the IC is performing user design operations, an overlay that includes incremental configuration data for the reconfigurable circuits through the configuration and monitoring network to set the values of the set of signals to the identified values. For instance, when the IC includes a counter that reaches a particular value only when a fault occurs in the IC, the overlay causes the particular value to be loaded in the counter without waiting for the fault to actually occur.

The process then loads (at 2720), while the IC is performing user design operations, an overlay that includes incremental configuration data to monitor for an event and to take actions after the event is triggered (e.g., to further analyze the fault condition). The process then monitors (at 2725) the signals that trigger the event. The process then determines (at 2730) whether the event conditions are satisfied. If not, the process proceeds back to 2725 to continue monitoring the signals. Otherwise, the process performs (at 2735) the actions that correspond to the triggered event while the IC is still performing the operations of the user design. The process then ends.

C. Inspection and Search of Networking Packets

Some embodiments utilize views to inspect and search networking packets. For instance, an IC that includes reconfigurable circuits and a configuration and monitoring network can monitor packets received at the IC, examine the content, and take actions when a particular packet (e.g. a packet with a particular header) has arrived.

Such an IC can be used to monitor network traffic to determine whether or not any particular packet has arrived at a destination. For instance, in a data center with thousands of devices such as bridges, switches, routers and gateways, such an IC can be included in each device to unobtrusively monitor the traffic in the data center without stopping the operations of the data center.

Figure 28:
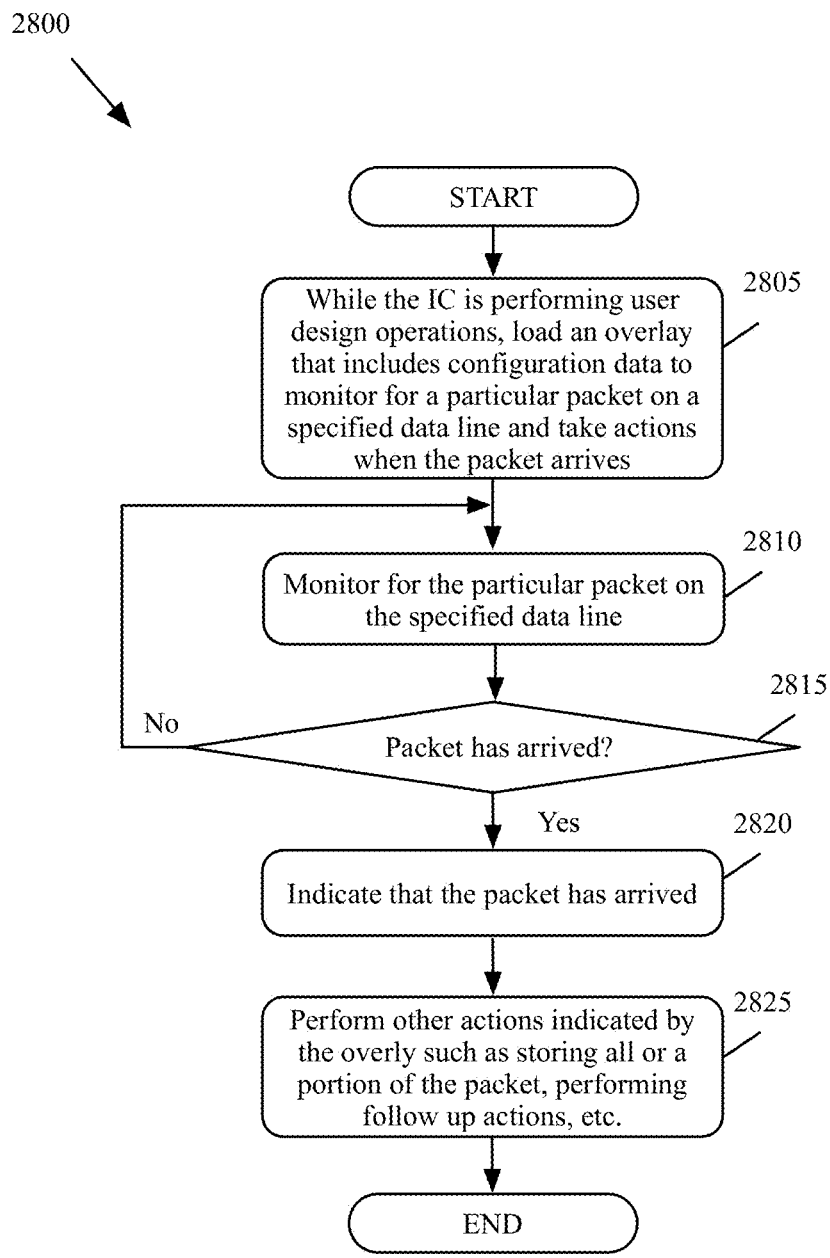
FIG. 28 conceptually illustrates a process for packet monitoring in some embodiments of the invention.

FIG. 28 conceptually illustrates a process 2800 for packet monitoring in some embodiments of the invention. The process loads (at 2805), while the IC is performing user design operations, an overlay that includes configuration data to monitor for a particular packet on a specified data line. The overlay is generated from a user-defined view. The process then monitors (at 2810) for the particular packet on the specified data line. This is achieved by programming the trigger unit such that, for instance, information that identifies a specified sender is found in the packet header.

The process then determines (at 2815) whether the packet has arrived. If not, the process proceeds back to 2810 to continue monitoring for the particular packet. Otherwise, the process indicates (at 2820) that the packet has arrived. For instance, the process raises a flag by setting a particular location in the memory, by storing data in trace buffer, or by sending a signal to an output line to indicate that the packet has arrived.

The process then performs (at 2825) other actions indicated by the overlay such as storing all or a portion of the packet, performing follow up actions, etc. the process then ends.

Figure 29:
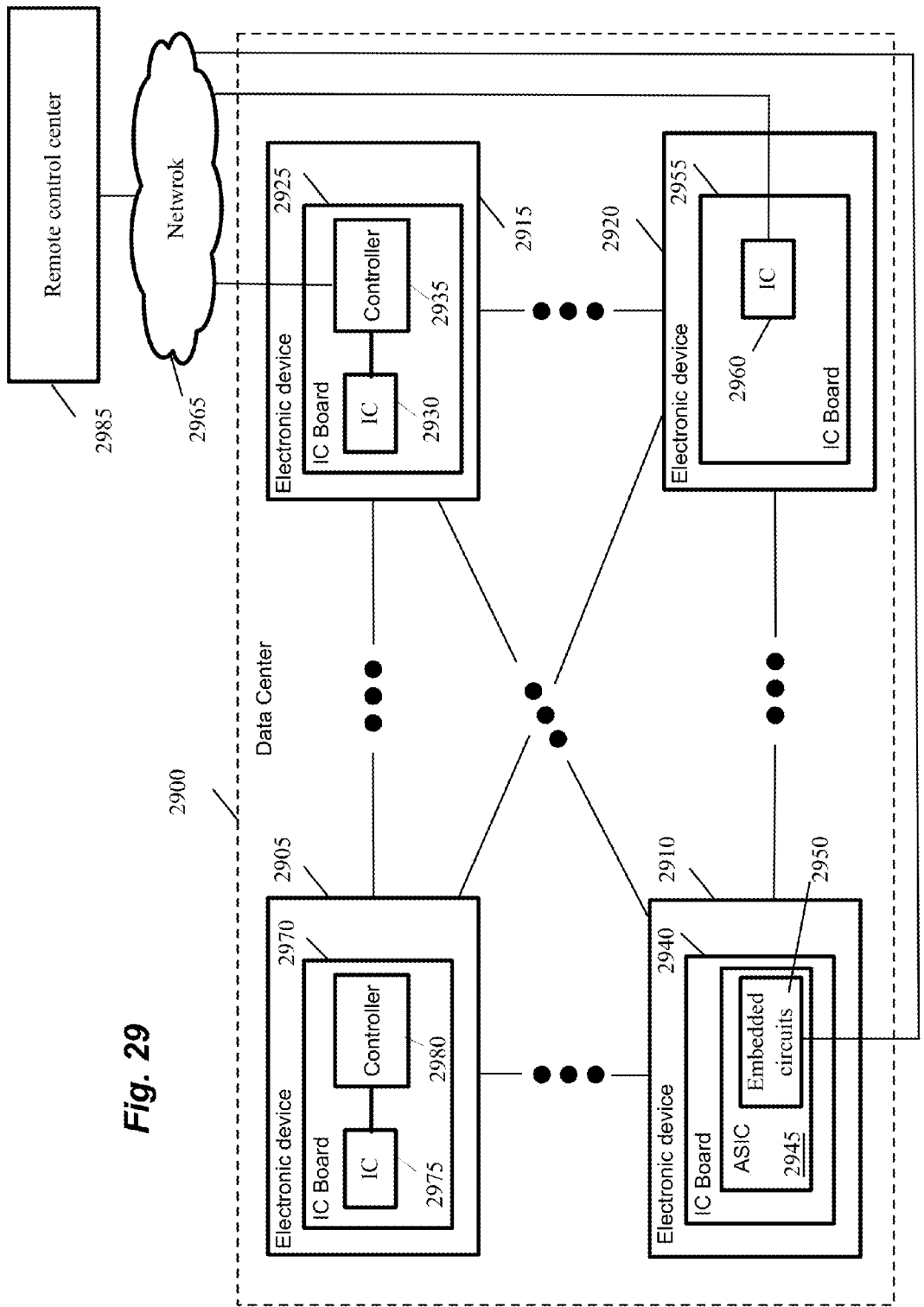
FIG. 29 conceptually illustrates a data center in some embodiments of the invention.

FIG. 29 conceptually illustrates a data center 2900 in some embodiments of the invention. The data center 2900 includes electronic devices 2905-2920 such as bridges, switches, routers, gateways, computer systems, storage systems, telecommunication systems, security devices, etc. Only a few electronic devices are shown in FIG. 29 for brevity. The data center can be used by a carrier's telecommunication network, by an ecommerce website, by a search engine website, by a web portal, etc.

Some of the electronic devices in a data center can include IC's with reconfigurable circuits and a configuration and monitoring network to facilitate monitoring of the network traffic. Other components of the electronic devices are not shown for simplicity.

FIG. 29 shows different examples for including such IC's in these electronic devices. For instance, electronic device 2915 includes an IC board 2925 with an IC 2930 and a controller 2935 as described by reference to FIG. 20A, above. The electronic device 2910 includes an IC board 2940 with an ASIC 2945 with an embedded group of reconfigurable circuits 2950 and their associated configuration and monitoring network as described by reference to FIG. 22, above. The electronic device 2920 includes an IC board 2955 with an IC 2960 that communicates with the remote control center 2985 through the network 2965 as described by reference to FIG. 20B, above.

Including these ICs in each of the electronic device 2910-2920 allows the network traffic coming into and going out of each device to be monitored and reported to a remote control center 2985 through a network 2965 such as the Internet. The remote control center provides facilities such as user interfaces to display data received from the ICs embedded in the electronic devices, select predefined overlays, create views to generate new overlays, and send the overlays to the ICs to monitor for further packets, to monitor for different events, and to take actions when a packet arrives or an event condition becomes true.

In addition, some of the electronic devices (such as electronic device 2905) can include an IC board 2970 with an IC 2975 and a controller 2980 with a localized configuration described by reference to FIG. 19 or 21, above. In these configurations, the controller 2980 receives data from the IC 2975 and loads overlays with incremental configuration data into the IC based on a pre-programmed scheme without outside (e.g., human) interactions.

Figure 30:
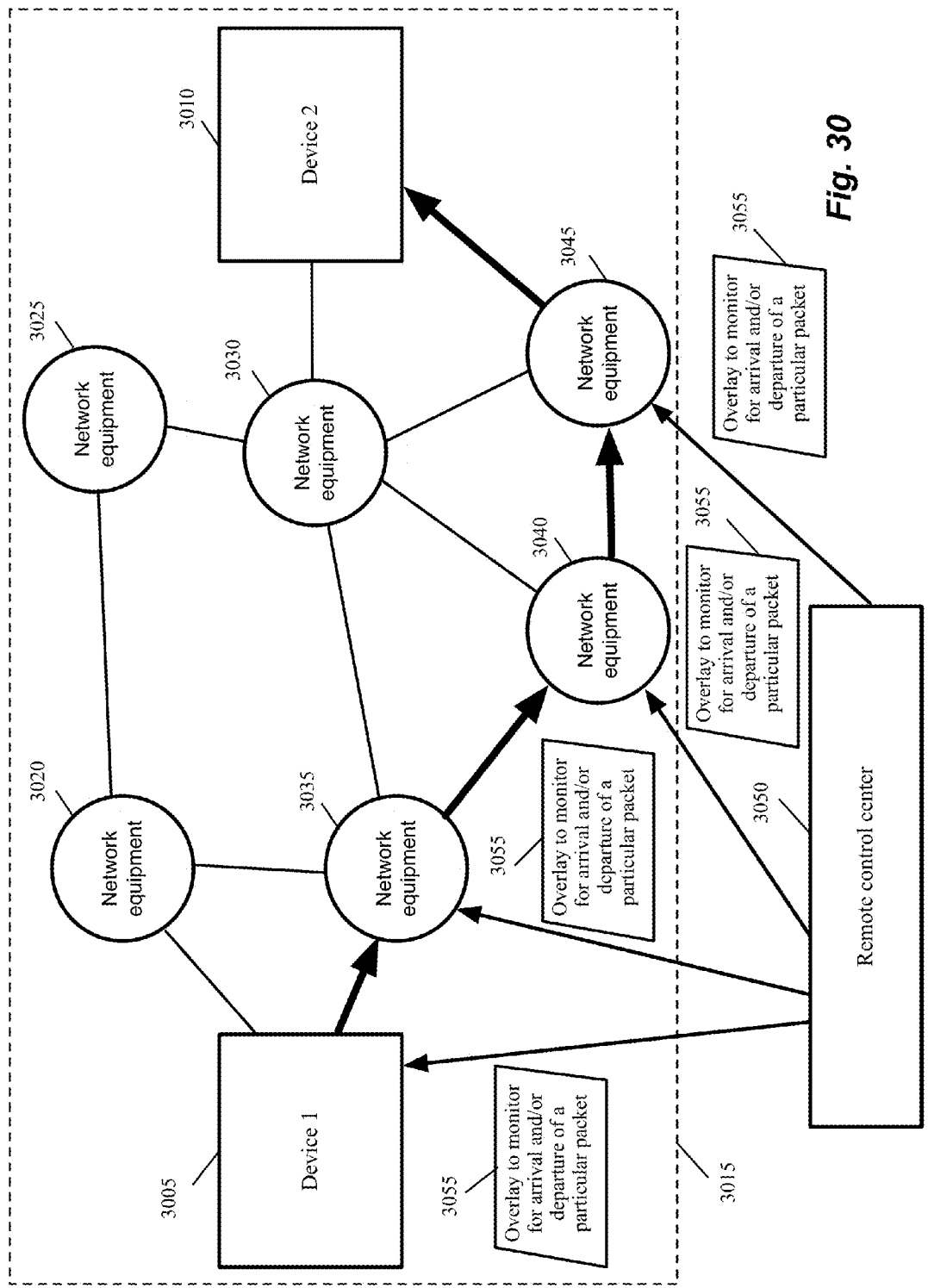
FIG. 30 conceptually illustrates tracking of packets between source and destination nodes in a network according to some embodiments of the invention.

FIG. 30 conceptually illustrates tracking of packets between source and destination nodes in a network according to some embodiments of the invention. As shown, two devices 3005 and 3010 are connected through a set of network equipment 3020-3045 such as bridges, switches, routers, etc. The devices and the network equipment can be part of a data center 3015 or a communication network and include an IC with a group of reconfigurable circuits and a configuration and monitoring network, e.g., as described by reference to FIGS. 20A, 20B, and 22.

The devices in a network can be connected through many different paths. For instance, devices 3005 and 3010 can be connected through (1) network equipment 3020, 3025, and 3030, (2) network equipment 3020, 3035, and 3030, (3) network equipment 3035, 3040, 3045, etc.

Having multiple paths between a source and a destination node in a network can create a loop. When a loop occurs, the network topology permits a packet to traverse the same network equipment more than once. The loop creates broadcast radiation as the network equipment repeatedly broadcast packets and flooding the network. The devices in a network often perform a spanning-tree protocol to prevent loops from being formed. Spanning-Tree Protocol exchanges messages between the network nodes to detect loops and remove them by shutting down redundant paths. This algorithm guarantees that there is one and only one active path between two network nodes, and that each network node does not connect back to itself. The devices perform the spanning tree protocol to determine a spanning tree where each node lies in a path in the network but no loops are formed.

In order to perform spanning tree protocol, the network nodes (such as devices and network equipment 3005-3045) exchange packets among each other and determine whether a packet arrives at a certain node once, multiple times, or does not arrive after a certain time. In the example of FIG. 30, a packet is sent from device 3005 to device 3010 by an intended path through network equipment 3035, 3040, and 3045. The remote control center 3050 sends an overlay 3055 to the devices and network equipment 3005-3045 through a network. For simplicity the network is not shown and only a few of the overlays are shown. The overlays are created based on a view that triggers an event when a particular packet (e.g., a packer with a particular header) arrives and sends data back to remote center to indicate that the packet has arrived.

Figure 31:
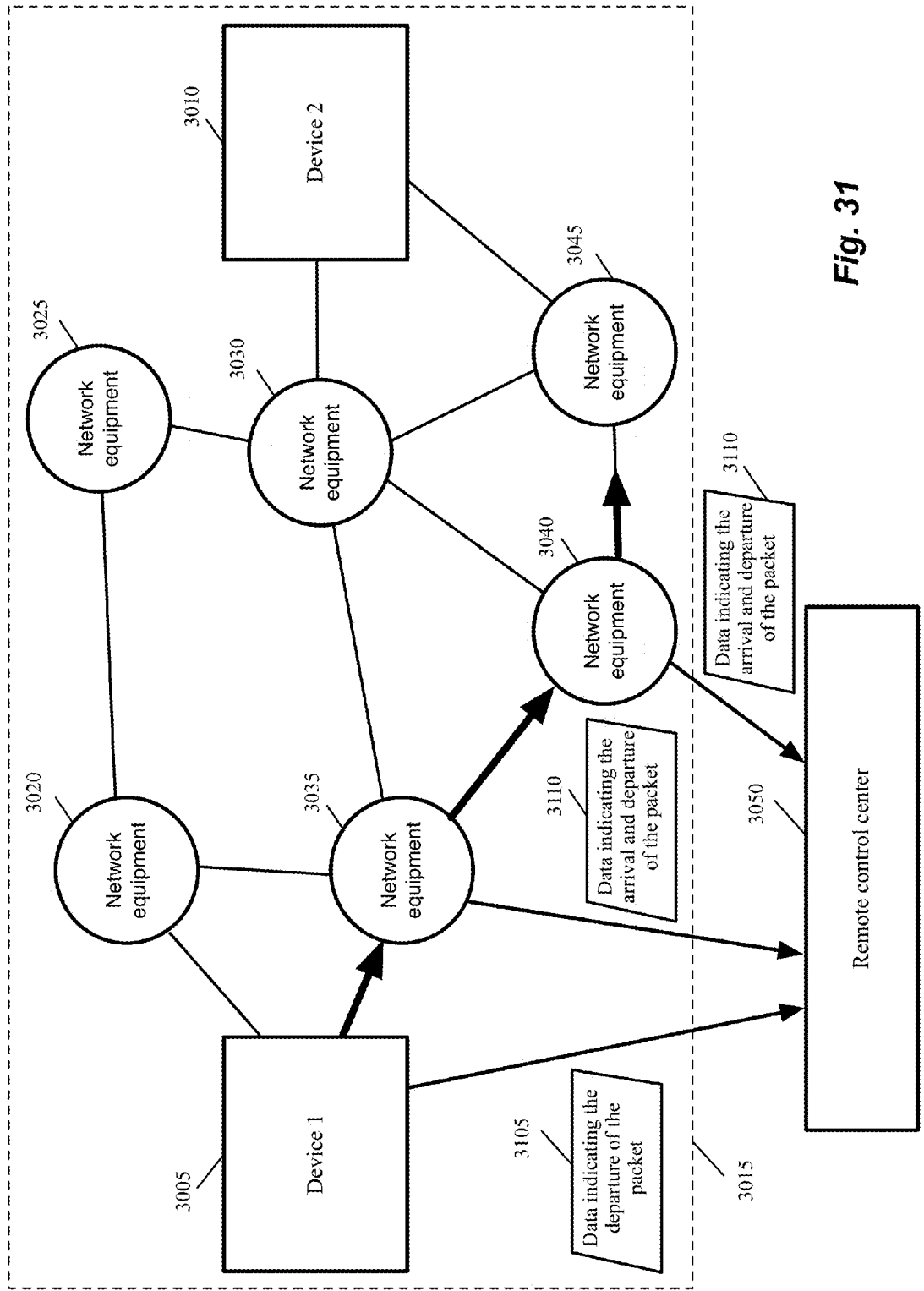
FIG. 31 conceptually illustrates the network of FIG. 30 where a packet has not arrived at an intended destination.

FIG. 31 conceptually illustrates the network of FIG. 30 where a packet has not arrived at an intended destination. As shown, source device 3005 has sent data 3105 to the remote control center to indicate that a particular packet has departed from the device. Also, network equipment 3035 and 3040 have sent data to the remote control center to indicate that the arrival and departure of the packet. Network equipment 3045 and device 3010 have not sent any data to indicate the arrival or departure of the packet. After a predetermined timeout, the remote control center concludes that the packet has been lost between network equipment 3040 and 3045.

Similarly, other network equipment such as 3020-3030 may send data indicating that they have also received the package. Network equipment 3035-3040 may send data to indicate that they have received multiple copies of the packets. The network devices and equipment collectively use the information about the arrival and departure of packets to determine the loops and lost links in order to remove redundant paths between the nodes, to ensure that there is at least one path to each node in the network and to ensure that no loops exist.

D. Delivery of Enhanced Diagnostics to End Users

Figure 32:
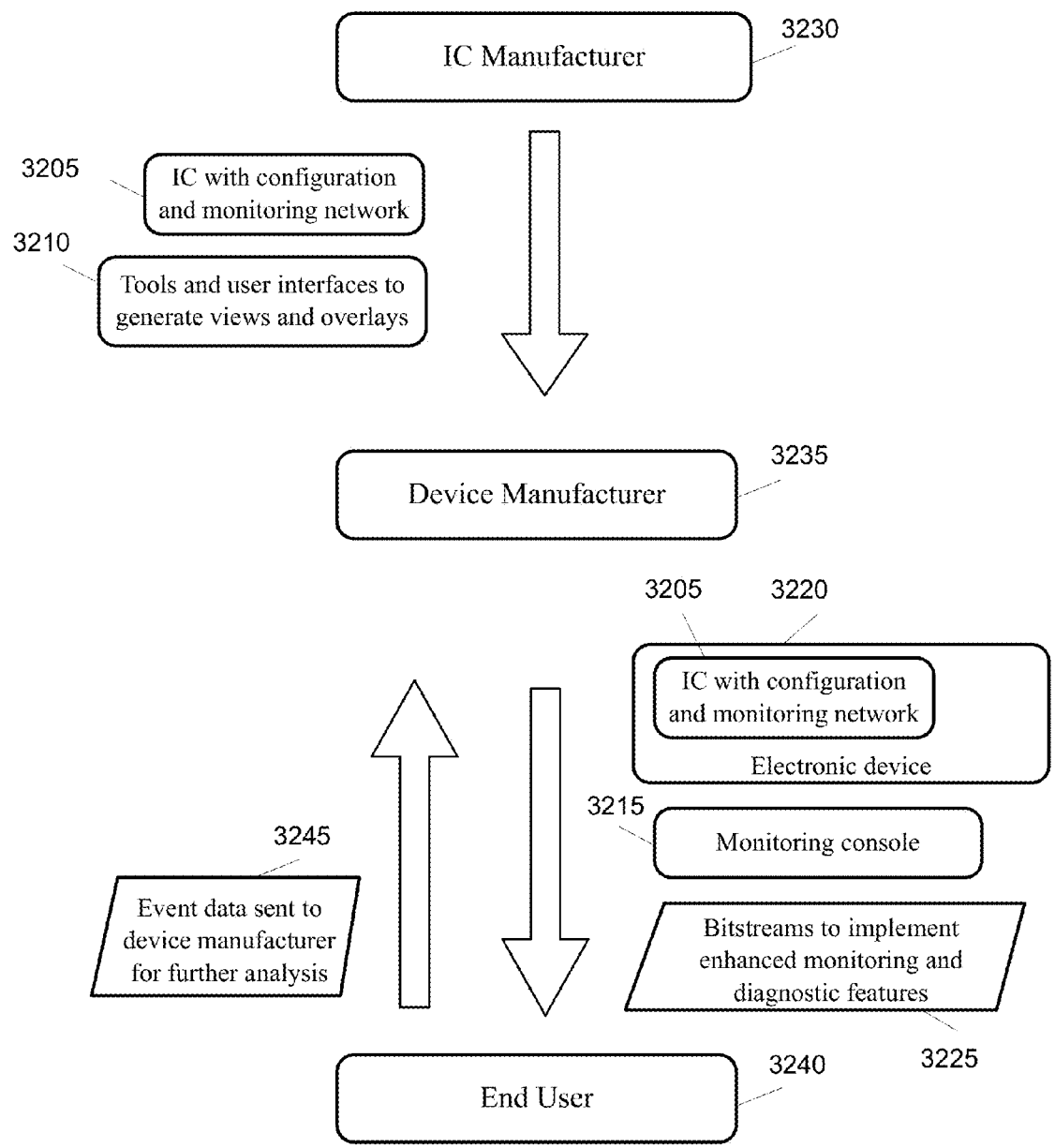
FIG. 32 conceptually illustrates the delivery of enhanced monitoring and diagnostic tools from device manufacturers to the end users in some embodiments of the invention.

Utilizing ICs with reconfigurable circuits and a configuration and monitoring network allows device manufactures to incorporates such ICs into their devices and provide a set of monitoring tool to the end users to monitor their systems. FIG. 32 conceptually illustrates the delivery of enhanced monitoring and diagnostic tools from device manufacturers to the end users in some embodiments of the invention. As shown, the IC manufacturer 3230 manufactures ICs 3205 with reconfigurable circuits and configuration and monitoring networks. The IC manufacturer also provides tools and user interfaces 3210 to generate views and overlays.

The device manufacturer 3235 receives the ICs and the tools from the IC manufacturer and incorporates the ICs 3205 in the manufactured devices 3220. The device manufacturer creates different views using the tools 3210 to trigger events based on different conditions and to take subsequent actions after an event is triggered. For instance, the IC is embedded in the device to perform mathematical and logical operations intended by the device and in addition to monitor certain signals in the device, trace data, and send the data out to a certain port to be displayed on a monitoring console 3215.

The device manufacturer sells the devices 3220 to end users 3240 and provides the end user with instructions to use the monitoring console 3215 to monitor the data received from the ICs embedded in the electronic devices 3220 and to load overlays that include bitstreams with incremental configuration data 3225 to implement enhanced monitoring and diagnostics features.

In addition, when a new problem is reported in the field by the end user, the device manufacturer can generate more views, create the corresponding bitstreams to implement the views and send the overlay packets containing the bitstreams to the end user to load into the device in the field. Loading of the overlays, monitoring for the events, subsequent actions and data reporting can be done without hating the device from performing its intended operations. For instance, the device manufacturer 3235 could be a networking equipment manufacturer and the end user 3240 could be an electronic commerce (ecommerce) company, a search engine company, a web portal company, or an individual who purchased the device for personal use.

As an example, consider that the electronic device is the networking equipment used in a data center. The operations of the networking equipment can be monitored without interrupting the operations of the data center. In this example, the IC manufacturer provides the ICs and tools to the device manufacturer to facilitate implementation of enhanced monitoring and diagnostics features to the end users, who are the customers of the customers of the IC manufacturer.

E. Executing the Same Assertions During Simulation and Runtime

Today, part of the process for designing microchips is to write code and to write test bench simulations. The designers write the code and make statement about properties in the code. For instance, a count for the day of the month can never exceed 31. In order to verify the design in the lab, the designer writes simulation code that checks the value of the count for the day of the month.

Writing a condition (or assertion) that the value for day of the month can never exceed 31 continuously checks the value during simulation and verification. Usually, when the system is deployed in the field, the simulation code that checks for the value is not included in the code that is deployed in the field (e.g., because of the amount of resources to be included in the IC to continuously check the veracity of the condition). Any attempt to check for the value in the field or to check for any other values in the field requires recompiling of the deployed user design, halting the operations of the system in the field, and reloading of the code into the chip. Similarly, to remove the extra code that checks for the values in the field requires another compilation, halting the operations of the system, and loading of new code into the chip.

Using the disclosed ICs that include reconfigurable circuits and a configuration and monitoring network allows loading overlays that provide configuration bitstreams to the chip without halting the operations of the chip or recompiling and replacing the code that is operating on the chip. The same assertions used during simulation can be loaded into the chip without replacing the code that is already running in the IC. In addition, new views can be created to monitor for additional events that were not considered during the simulation of the design.

For instance, an IC that includes reconfigurable circuits and a configuration and monitoring network can be used in a networking equipment. After the equipment is deployed in the field, the equipment can be targeted for a Denial of Service ("DoS") attack by exploiting a certain vulnerability. Malicious attackers routinely try and find new and ingenious ways to exploit vulnerabilities; as such, different attacks can occur over time, new vulnerabilities are exploited. A view can be created after the equipment to check for conditions that confirm the equipment is under DoS attack and, when those conditions are satisfied, to take proper actions to defend the attack. The view is then translated into a bitstream to create an overlay. The overlay is then loaded into the device in the field to monitor for the denial of service attacks without replacing the code on the chip or halting the operations of the chip.

Figure 33:
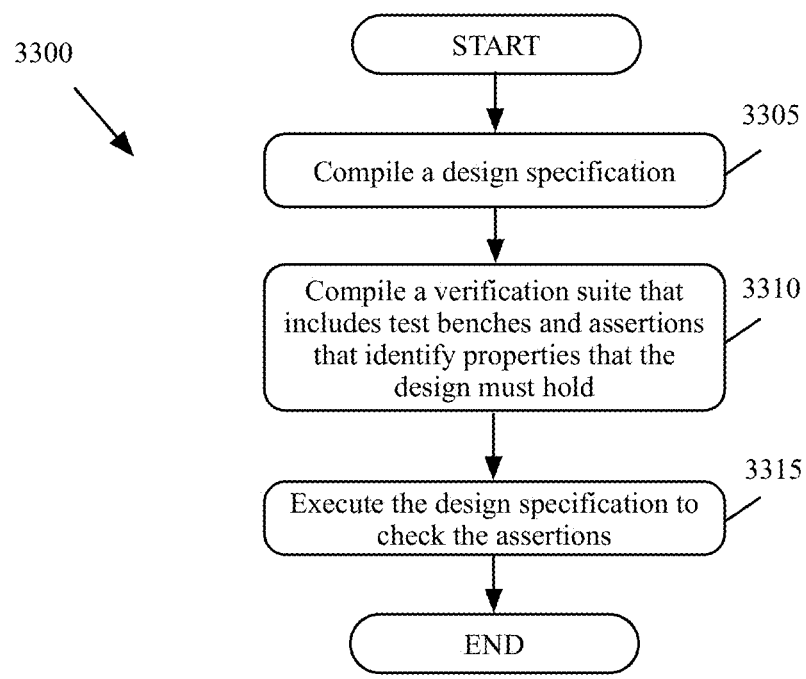
FIG. 33 conceptually illustrates a process to verify a design specification during simulation.
Figure 34:
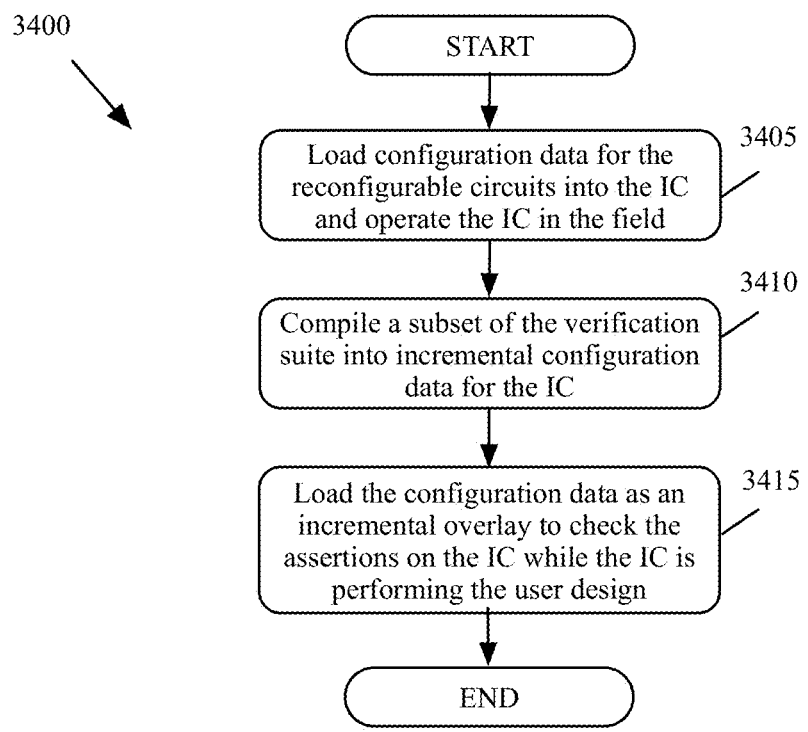
FIG. 34 conceptually illustrates a process for using the same assertions that were used during simulation in the field without recompiling or replacing the code loaded in an IC in some embodiments of the invention.

FIGS. 33 and 34 illustrate processes to use the same assertions during simulation and runtime in the some embodiments of the invention without permanently including those assertions in the code that is deployed in the field, recompiling, or replacing the deployed code. FIG. 33 conceptually illustrates a process 3300 to verify a design specification during simulation. As shown, the process compiles (at 3305) a design specification (e.g., written in RTL). The process also compiles (at 3310) a verification suite that includes test benches and assertions that identify properties that the design must hold.

The process then executes (at 3315) the design specification and uses the verification suite to check the assertions. The process then ends.

FIG. 34 conceptually illustrates a process 3400 for using the same assertions that were used during simulation in the field without recompiling or replacing the code loaded in an IC in some embodiments of the invention. As shown, the process loads configuration data for the reconfigurable circuits of the IC and operates the IC in the field to perform the operations of the user design. In some embodiments, the design specification is compiled to create configuration data for the reconfigurable circuits. The configuration data is then stored, e.g., in flash memory. The configuration data is then loaded from the SRAM into the IC at the power up to operate the IC in the field.

Process 3400 then compiles (at 3410) a subset of the verification suite into incremental configuration data for the IC. For instance, the process recompiles a portion of the verification suite that was saved by process 3300.

The process then loads (at 3415) the configuration data as an incremental overlay to check for the same assertions that were checked during simulation while the IC is performing the user design. Loading the incremental overlay does not require changing, recompiling, or replacing the user design code that is running on the IC nor it requires the operations of the IC to be halted for the configuration data to be loaded in the IC. The process then ends.

V. ELECTRONIC SYSTEM

Many of the above-described features and applications are implemented as software processes that are specified as a set of instructions recorded on a computer readable storage medium (also referred to as computer readable medium, machine readable medium, machine readable storage). When these instructions are executed by one or more computational or processing unit(s) (e.g., one or more processors, cores of processors, or other processing units), they cause the processing unit(s) to perform the actions indicated in the instructions. Examples of computer readable media include, but are not limited to, CD-ROMs, flash drives, random access memory (RAM) chips, hard drives, erasable programmable read only memories (EPROMs), electrically erasable programmable read-only memories (EEPROMs), etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 36:
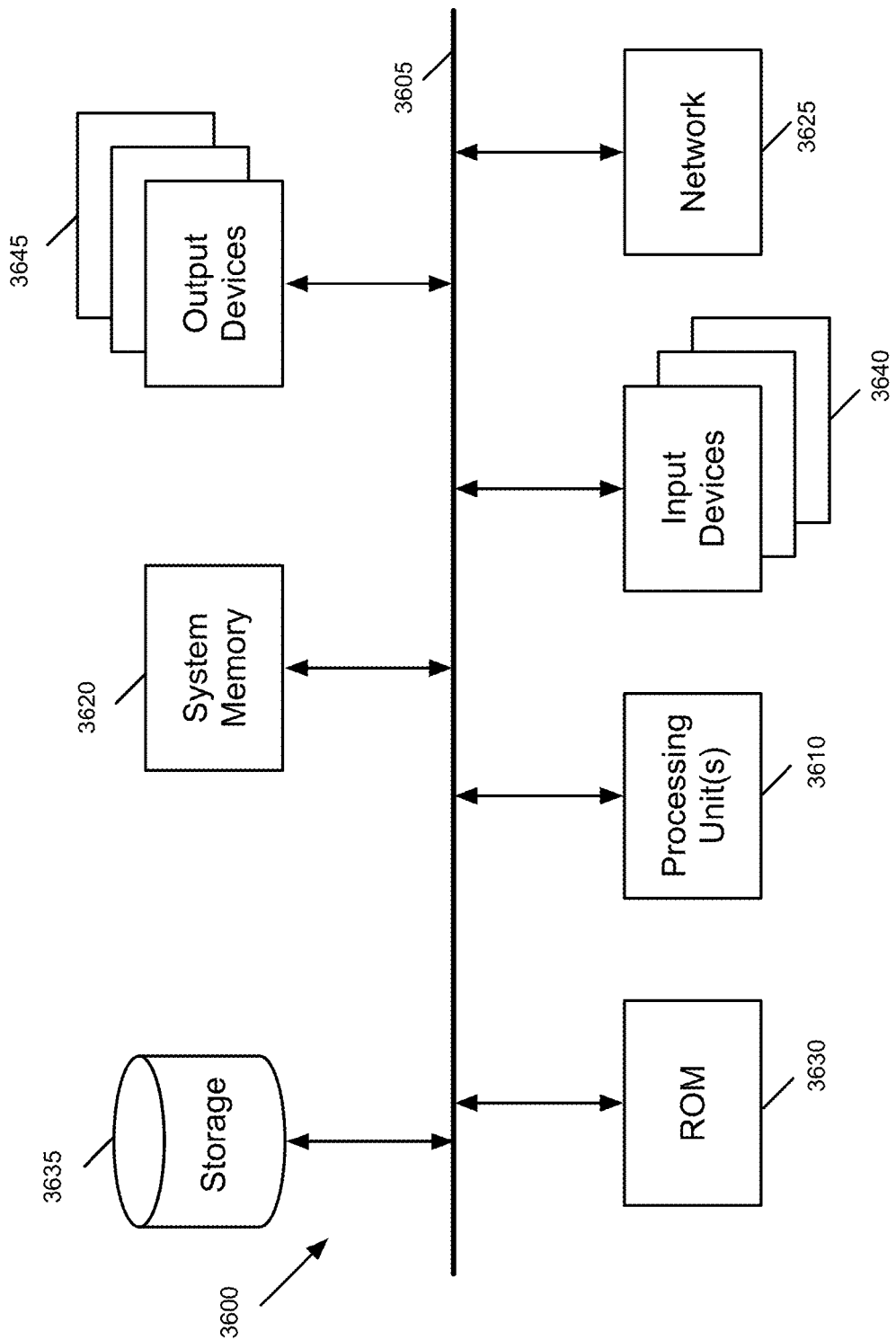
FIG. 36 conceptually illustrates an electronic system with which some embodiments of the invention are implemented.

FIG. 36 conceptually illustrates an electronic system 3600 with which some embodiments of the invention are implemented. The electronic system 3600 may be a computer (e.g., a desktop computer, personal computer, tablet computer, etc.), phone, PDA, or any other sort of electronic or computing device. Such an electronic system includes various types of computer readable media and interfaces for various other types of computer readable media. Electronic system 3600 includes a bus 3605, processing unit(s) 3610, a system memory 3620, a network 3625, a read-only memory 3630, a permanent storage device 3635, input devices 3640, and output devices 3645.

The bus 3605 collectively represents all system, peripheral, and chipset buses that communicatively connect the numerous internal devices of the electronic system 3600. For instance, the bus 3605 communicatively connects the processing unit(s) 3610 with the read-only memory 3630, the system memory 3620, and the permanent storage device 3635.

From these various memory units, the processing unit(s) 3610 retrieves instructions to execute and data to process in order to execute the processes of the invention. The processing unit(s) may be a single processor or a multi-core processor in different embodiments. The read-only-memory (ROM) 3630 stores static data and instructions that are needed by the processing unit(s) 3610 and other modules of the electronic system. The permanent storage device 3635, on the other hand, is a read-and-write memory device. This device is a non-volatile memory unit that stores instructions and data even when the electronic system 3600 is off. Some embodiments of the invention use a mass-storage device (such as a magnetic or optical disk and its corresponding disk drive) as the permanent storage device 3635.

Other embodiments use a removable storage device (such as a floppy disk, flash memory device, etc., and its corresponding disk drive) as the permanent storage device. Like the permanent storage device 3635, the system memory 3620 is a read-and-write memory device. However, unlike storage device 3635, the system memory 3620 is a volatile read-and-write memory, such a random access memory. The system memory 3620 stores some of the instructions and data that the processor needs at runtime. In some embodiments, the invention's processes are stored in the system memory 3620, the permanent storage device 3635, and/or the read-only memory 3630. For example, the various memory units include instructions for processing multimedia clips in accordance with some embodiments. From these various memory units, the processing unit(s) 3610 retrieves instructions to execute and data to process in order to execute the processes of some embodiments.

The bus 3605 also connects to the input devices 3640 and output devices 3645. The input devices 3640 enable the user to communicate information and select commands to the electronic system. The input devices 3640 include alphanumeric keyboards and pointing devices (also called "cursor control devices"), cameras (e.g., webcams), microphones or similar devices for receiving voice commands, etc. The output devices 3645 display images generated by the electronic system or otherwise output data. The output devices 3645 include printers and display devices, such as cathode ray tubes (CRT) or liquid crystal displays (LCD), as well as speakers or similar audio output devices. Some embodiments include devices such as a touchscreen that function as both input and output devices.

Finally, as shown in FIG. 36, bus 3605 also couples electronic system 3600 to a network 3625 through a network adapter (not shown). In this manner, the computer can be a part of a network of computers (such as a local area network ("LAN"), a wide area network ("WAN"), or an Intranet, or a network of networks, such as the Internet. Any or all components of electronic system 3600 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself. In addition, some embodiments execute software stored in programmable logic devices (PLDs), ROM, or RAM devices.

As used in this specification and any claims of this application, the terms "computer", "server", "processor", and "memory" all refer to electronic or other technological devices. These terms exclude people or groups of people. For the purposes of the specification, the terms display or displaying means displaying on an electronic device. As used in this specification and any claims of this application, the terms "computer readable medium," "computer readable media," and "machine readable medium" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. In addition, a number of the figures (including FIGS. 12, 18, 23-28, 33, and 34) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details, but rather is to be defined by the appended claims.

What is claimed is:

1. An application-specific integrated circuit (ASIC) comprising:
a plurality of non-configurable circuits customized for performing operations for a particular use;
a set of reconfigurable circuits for configurably performing operations of a user design based on configuration data; and
a configuration and monitoring network for receiving incremental sets of configuration data while the set of reconfigurable circuits is performing operations of the user design, each incremental set of data for configuring the configuration and monitoring network (i) to monitor a set of signals received at the set of reconfigurable circuits from one or more non-configurable circuits in the plurality of the non-configurable circuits of the ASIC and (ii) to take a set of actions when values of the monitored signals satisfy a set of conditions.

2. The ASIC of claim 1, wherein the incremental sets of configuration data further comprise one ore more incremental set of configuration data for configuring the configuration and monitoring network (i) to monitor a set of signals received at the set of reconfigurable circuits from one or more reconfigurable circuits in the set of the reconfigurable circuits of the ASIC and (ii) to take a set of actions when values of the monitored signals satisfy a set of conditions.

3. The ASIC of claim 1, wherein the configuration and monitoring network comprises a trace buffer to store data, wherein the set of actions comprises (i) sampling values of one or more signals in the set of signals and (ii) storing the sampled values in the trace buffer.

4. The ASIC of claim 1, wherein the configuration and monitoring network comprises a set of output lines, wherein the set of actions comprises (i) sampling values of one or more signals in the set of signals and (ii) sending the values to a particular output line of the configuration and monitoring network.

5. The ASIC of claim 1, wherein the configuration and monitoring network comprises a set of output lines, wherein the set of actions comprises sending a predetermined signal to a particular output line of the configuration and monitoring network.

6. The ASIC of claim 1, wherein the effect of the predetermined signal is to halt the operations of the ASIC.

7. The ASIC of claim 1 further comprising a controller for sending the incremental sets of configuration data to the configuration and monitoring network.

8. The ASIC of claim 1, wherein the controller is further for receiving signals for the configuration and monitoring network.

9. The ASIC of claim 1, wherein the configuration and monitoring network comprises a plurality of reconfigurable circuits, wherein configuring the configuration and monitoring network comprises utilizing incremental sets of configuration data to reconfigure said reconfigurable circuits of the configuration and monitoring network for monitoring for different sets of signals and taking actions when values of the monitored signals satisfy a set of conditions.

10. A method of monitoring operations of an integrated circuit (IC), the IC comprising a set of configurable circuits for configurably performing a set of operations based on configuration data, the method comprising:
loading a first set of configuration data into the IC for configuring a plurality of configurable circuits in the set of configurable circuits for performing operations of a user design;
receiving a definition of (i) a first event based on values of a first set of signals in the user design and (ii) a first set of actions to take when the first event occurs;

generating an incremental second set of configuration data based on the definition of the first event and the first set of actions;

while the IC is performing the operations of the user design, loading the incremental second set of configuration data into the IC to monitor for the first event and to take the first set of actions when the first event occurs;

receiving a definition of (i) a second event based on values of a second set of signals in the user design and (ii) a second set of actions to take when the second event occurs;

generating an incremental third set of configuration data based on the definition of the second event and the second set of actions; and while the IC is performing the operations of the user design, loading the incremental third set of configuration data into the IC to monitor for the second event and to take the second set of actions when the second event occurs.

11. The method of claim 10, wherein the IC further comprises a configuration and monitoring network for (i) receiving configuration data sets, (ii) monitoring for events, and (iii) taking actions after a monitored event occurs.

12. The method of claim 11, wherein configuration and monitoring network comprises a set of reconfigurable circuits, wherein the second and third incremental configuration data sets comprise configuration data for reconfiguring the reconfigurable circuits of the configuration and monitoring network.

13. The method of claim 11, wherein loading the incremental second and third sets of configuration data into the IC does not replace the first set of configuration data.

14. The method of claim 11, wherein the first set of configuration data is generated from the user design; wherein generating the incremental second and third sets of configuration data does not require modifying the user design.

15. The method of claim 11, wherein the first set of configuration data is generated by compiling the user design specified in register-transfer language (RTL), wherein generating the incremental second and third sets of configuration data does not require recompiling the user design.

16. A non-transitory machine readable medium for monitoring operations of an integrated circuit (IC), the IC comprising a set of configurable circuits for configurably performing a set of operations based on configuration data, the program executable by at least one processor, the program comprising sets of instructions for:

loading a first set of configuration data into the IC for configuring a plurality of configurable circuits in the set of configurable circuits for performing operations of a user design;

receiving a definition of (i) a first event based on values of a first set of signals in the user design and (ii) a first set of actions to take when the first event occurs;

generating an incremental second set of configuration data based on the definition of the first event and the first set of actions;

loading, while the IC is performing the operations of the user design, the incremental second set of configuration data into the IC to monitor for the first event and to take the first set of actions when the first event occurs;

receiving a definition of (i) a second event based on values of a second set of signals in the user design and (ii) a second set of actions to take when the second event occurs;

generating an incremental third set of configuration data based on the definition of the second event and the second set of actions; and loading, while the IC is performing the operations of the user design, the incremental third set of configuration data into the IC to monitor for the second event and to take the second set of actions when the second event occurs.

17. The non-transitory machine readable medium of claim 16, wherein the IC further comprises a configuration and monitoring network for (i) receiving configuration data sets, (ii) monitoring for events, and (iii) taking actions after a monitored event occurs.

18. The non-transitory machine readable medium of claim 17, wherein configuration and monitoring network comprises a set of reconfigurable circuits, wherein the second and third incremental configuration data sets comprise configuration data for reconfiguring the reconfigurable circuits of the configuration and monitoring network.

19. The non-transitory machine readable medium of claim 16, wherein loading the incremental second and third sets of configuration data into the IC does not replace the first set of configuration data.

20. The non-transitory machine readable medium of claim 16, wherein the first set of configuration data is generated from the user design; wherein generating the incremental second and third sets of configuration data does not require modifying the user design.

21. The non-transitory machine readable medium of claim 16, wherein the first set of configuration data is generated by compiling the user design specified in register-transfer language (RTL), wherein generating the incremental second and third sets of configuration data does not require recompiling the user design.

* * * * *